United States Patent
Maenishi

(10) Patent No.: US 8,447,566 B2
(45) Date of Patent: May 21, 2013

(54) MOUNTING CONDITION DETERMINING METHOD

(75) Inventor: Yasuhiro Maenishi, Halstenbek (DE)

(73) Assignee: Panasonic Corporation, Osaka (JP)

( * ) Notice: Subject to any disclaimer, the term of this patent is extended or adjusted under 35 U.S.C. 154(b) by 527 days.

(21) Appl. No.: 12/867,786

(22) PCT Filed: Feb. 20, 2009

(86) PCT No.: PCT/JP2009/000731
§ 371 (c)(1),
(2), (4) Date: Aug. 16, 2010

(87) PCT Pub. No.: WO2009/104410
PCT Pub. Date: Aug. 27, 2009

(65) Prior Publication Data
US 2010/0325860 A1    Dec. 30, 2010

(30) Foreign Application Priority Data

Feb. 21, 2008   (JP) ................................. 2008 040473
Mar. 3, 2008   (JP) ................................. 2008 052018

(51) Int. Cl.
*G06F 11/30*    (2006.01)
*G21C 17/00*    (2006.01)
*G06F 19/00*    (2011.01)
*H05K 3/30*    (2006.01)

(52) U.S. Cl.
USPC ............... 702/182; 702/183; 29/830; 29/831; 29/832; 700/160; 700/174; 700/175

(58) Field of Classification Search .......... 700/159–160, 700/169, 173–175; 29/830–832; 702/182–183
See application file for complete search history.

(56) References Cited

U.S. PATENT DOCUMENTS

| | | | | |
|---|---|---|---|---|
| 6,073,342 A | * | 6/2000 | Asai et al. | 29/740 |
| 6,161,277 A | * | 12/2000 | Asai et al. | 29/740 |
| 6,286,202 B1 | * | 9/2001 | Asai et al. | 29/740 |
| 6,378,198 B1 | * | 4/2002 | Asai et al. | 29/825 |

(Continued)

FOREIGN PATENT DOCUMENTS

| | | |
|---|---|---|
| JP | 4-196296 | 7/1992 |
| JP | 7-60579 | 3/1995 |

(Continued)

OTHER PUBLICATIONS

International Search Report issued Aug. 24, 2009 in International (PCT) Application No. PCT/JP2009/000731.

(Continued)

*Primary Examiner* — Ramesh Patel
(74) *Attorney, Agent, or Firm* — Wenderoth, Lind & Ponack, L.L.P.

(57) ABSTRACT

A mounting condition determining method including: obtaining mounting information including information related to component mounting operations scheduled to be performed by a mounter (S1); judging, using the mounting information obtained in the obtaining: which production mode between a synchronous mode and an asynchronous mode is suitable for the scheduled component mounting operations; or which production mode between an alternating mode and an independent mode is suitable for the scheduled component mounting operations (S2, S3); and selecting the production mode indicated by a result of the judgment in the judging, as the production mode to be executed by the mounter (S5, S6).

15 Claims, 32 Drawing Sheets

U.S. PATENT DOCUMENTS

| | | | |
|---|---|---|---|
| 6,507,997 B2 * | 1/2003 | Kawai et al. | 29/833 |
| 6,538,425 B1 * | 3/2003 | Kawada | 324/750.22 |
| 6,643,921 B2 * | 11/2003 | Asai et al. | 29/833 |
| 6,739,036 B2 * | 5/2004 | Koike et al. | 29/743 |
| 6,971,161 B1 * | 12/2005 | Maenishi et al. | 29/832 |
| 6,986,196 B2 * | 1/2006 | Terui | 29/740 |
| 6,996,440 B2 * | 2/2006 | Maenishi et al. | 700/28 |
| 7,043,824 B2 * | 5/2006 | Suhara et al. | 29/740 |
| 7,185,422 B2 * | 3/2007 | Sakai et al. | 29/832 |
| 7,200,922 B2 * | 4/2007 | Kabeshita et al. | 29/740 |
| 7,219,787 B2 * | 5/2007 | Kabeshita et al. | 198/346.2 |
| 7,251,541 B2 * | 7/2007 | Shimizu | 700/121 |
| 7,296,727 B2 * | 11/2007 | Onobori et al. | 228/180.22 |
| 7,313,859 B2 * | 1/2008 | Maenishi et al. | 29/711 |
| 7,313,860 B2 * | 1/2008 | Takahashi et al. | 29/740 |
| 7,739,077 B2 * | 6/2010 | Maenishi | 702/182 |
| 8,276,264 B2 * | 10/2012 | Shimizu et al. | 29/739 |
| 2002/0029468 A1 * | 3/2002 | Koike et al. | 29/832 |
| 2003/0051344 A1 * | 3/2003 | Terui | 29/890.142 |
| 2004/0128827 A1 | 7/2004 | Shimizu et al. | |
| 2005/0060883 A1 * | 3/2005 | Sakai et al. | 29/833 |
| 2005/0065620 A1 | 3/2005 | Maenishi et al. | |
| 2005/0098610 A1 * | 5/2005 | Onobori et al. | 228/180.21 |
| 2006/0064192 A1 | 3/2006 | Shimizu | |
| 2010/0249971 A1 * | 9/2010 | Maenishi et al. | 700/102 |

FOREIGN PATENT DOCUMENTS

| | | |
|---|---|---|
| JP | 8-242098 | 9/1996 |
| JP | 2003-174299 | 6/2003 |
| JP | 2003-204191 | 7/2003 |
| JP | 2003-204192 | 7/2003 |
| JP | 2004-103828 | 4/2004 |
| JP | 2004-128245 | 4/2004 |
| JP | 2004-128400 | 4/2004 |
| JP | 2004-172509 | 6/2004 |
| JP | 2006-147624 | 6/2006 |

OTHER PUBLICATIONS

Patent Cooperation Treaty (PCT) Written Opinion of the International Search Authority issued Aug. 24, 2009 in International (PCT) Application No. PCT/JP2009/000731.

* cited by examiner

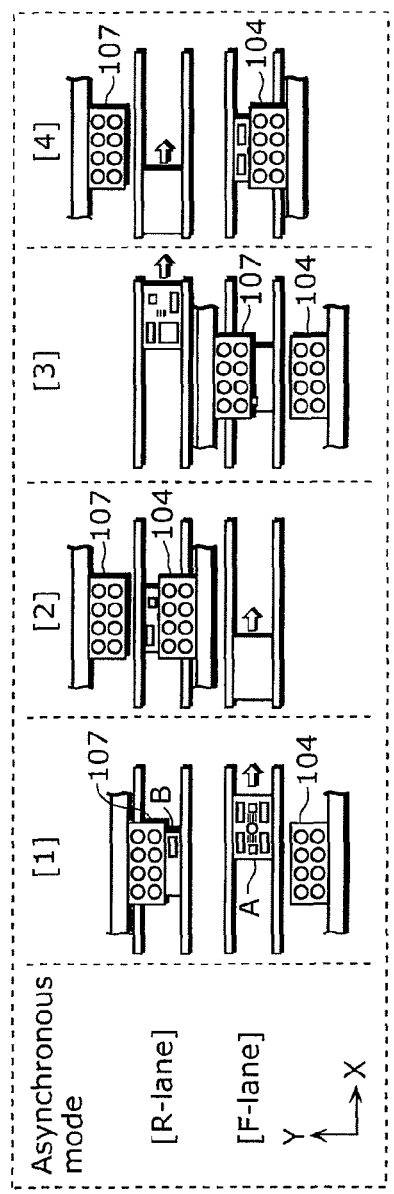

| No stoppage throughput (boards/hr) | | |
|---|---|---|
| | Synchronous mode | Asynchronous mode |
| A-board | 112.5 | 90 |
| B-board | 112.5 | 100 |
| Total | 225 | 190 |
| | (16 sec/board) | (≒19 sec/board) |

| Production tact time per board (sec) | | |
|---|---|---|
| | Synchronous mode | Asynchronous mode |
| A-board | 32 | 40 |
| B-board | | 36 |

Fig. 12A

| Used cassette | Component type | Included quantity | Usage quantity | Continued supply (At component run-out) | Stoppage frequency (boards/stop) | Stoppage time (sec/stop) | Unit-stoppage time (sec/board) |
|---|---|---|---|---|---|---|---|
| C02 | 1005 | 1800 | 200 | 1 | ...... | 0 | 0 |
| C03 | 3216 | 1000 | 100 | 1 | ...... | 0 | 0 |
| C04 | D32QFP | 200 | 20 | 0 | 10 boards/stop | 240 | 24 |
| C05 | Connector | 120 | 6 | 0 | 20 boards/stop | 120 | 6 |

A-board

Total 30 sec/board

Fig. 12B

| Used cassette | Component type | Included quantity | Usage quantity | Continued supply (At component run-out) | B-board Stoppage frequency (boards/stop) | Stoppage time (sec/stop) | Unit-stoppage time (sec/board) |
|---|---|---|---|---|---|---|---|
| C01 | 0603 | 2000 | 150 | 1 | ...... | 0 | 0 |
| C03 | 3216 | 1000 | 80 | 1 | ...... | 0 | 0 |
| C04 | D32QFP | 200 | 10 | 0 | 20 boards/stop | 240 | 12 |
| C05 | Connector | 120 | 5 | 0 | 24 boards/stop | 120 | 5 |

Total 17 sec/board

Fig. 16A

| A-board | | | | | |
|---|---|---|---|---|---|
| Component type | Usage quantity | Pickup rate | Number of pick up errors (pieces/board) | Stoppage time (sec/piece) | Unit-stoppage time (sec/board) |
| 1005 | 200 | 99 | 2 | 2 | 4 |
| 3216 | 100 | 95 | 5 | | 10 |
| D32QFP | 20 | 95 | 1 | | 2 |
| Connector | 6 | 100 | 0 | | 0 |

Total 16 sec/board

Fig. 16B

| Component type | Usage quantity | Pickup rate | Number of pick up errors (pieces/board) | Stoppage time (sec/piece) | Unit-stoppage time (sec/board) |
|---|---|---|---|---|---|
| 0603 | 150 | 98 | 3 | 2 | 6 |
| 3216 | 80 | 95 | 4 | | 8 |
| D32QFP | 10 | 95 | 0.5 | | 1 |
| Connector | 5 | 100 | 0 | | 0 |

B-board

Total 15 sec/board

Board data

C-board(L80×W55)

B-board(L240×W187)

A-board(L212×W195)

| Used component | Usage quantity /board |
|---|---|
| 0603CR | 200 |
| 1005CR | 100 |
| 6TR | 20 |
| 3CAP | 6 |
| ⋮ | ⋮ |

Fig. 20

| Component name | (Component appearance) | Component size(mm) | | | Two-dimensional recognition method | Nozzle | Tact time (seconds) | Acceleration |
|---|---|---|---|---|---|---|---|---|
| | | X | Y | L | | | | |
| 0603CR | | 0.6 | 0.3 | 0.25 | | SX | 0.086 | 1 |
| 1005CR | | 1.0 | 0.5 | 0.3-0.5 | | SA | 0.094 | |
| 1608CR | | 1.6 | 0.8 | 0.4-0.8 | | S | | |
| 2012CR | | 2.0 | 1.25 | 0.4-0.8 | | | | |
| 3216CR | | 3.2 | 1.6 | 0.4-0.8 | | | | |
| 4TR | | 2.8 | 2.8 | 1.1 | | | 0.11 | |
| 6TR | | 4.3 | 4.5 | 1.5 | | Cylindrical Chip | | |
| 1TIP | | 2.0 | φ1.0 | - | | | | |
| 2TIP | | 3.6 | φ1.4 | - | | S | | |
| 1CAP | | 3.8 | 1.9 | 1.6 | Reflection | | | |
| 2CAP | | 4.7 | 2.6 | 2.1 | | M | | |
| 3CAP | | 6.0 | 3.2 | 2.5 | | | | |
| 4CAP | | 7.3 | 4.3 | 2.8 | | | | |
| SCAP | | 4.3 | 4.3 | 6.0 | | | | 2 |
| LCAP | | 6.6 | 6.5 | 6.0 | | | 0.13 | |
| LLCAP | | 10.3 | 10.3 | 10.5 | | ML | | |
| 1VOL | | 4.5 | 3.8 | 1.6-2.4 | | M | | |
| 2VOL | | 3.7 | 3.0 | 1.6 | | | | |
| 3VOL | | 4.8 | 4.0 | 3.0 | | | | |

Fig. 21

Supply unit data

| Loading width data | |
|---|---|
| Supply unit | Maximum total loading width |
| F | 567mm |
| R | 567mm |

Component cassette data

| Cassette ID | Component name | Loading pitch | Stock quantity |
|---|---|---|---|
| C01 | 0603CR | 21mm | 3 |
| ... | ... | ... | ... |
| C12 | 3CAP | 21mm | 4 |
| ... | ... | ... | ... |
| C16 | LLCAP | 42mm | 1 |
| ... | ... | ... | ... |

| Nozzle data | |
|---|---|
| Mounting head [F] | SX:2 units  SA:2 units  S:4 units |
| Mounting head [R] | S:2 units  L:2 units |

130d

MOUNTING CONDITION DETERMINING METHOD

TECHNICAL FIELD

The present invention relates to a mounting condition determining method for determining a mounting condition for a mounter including plural carrier conveyors that are arranged in parallel, and particularly to processing concerning selection of a production mode which is a type of mounting condition.

BACKGROUND ART

Conventionally, mounters are available as apparatuses for mounting electronic components (hereafter referred to simply as "components") onto a board such as a printed circuit board.

Furthermore, in recent years, there is a mounter which includes plural carrier conveyors that are arranged in parallel, and which performs, in parallel, component mounting onto boards that are carried by the respective carrier conveyors. Specifically, there is a mounter which has plural lanes which are carrying paths for mounting components onto a board, and which performs component mounting operations in parallel.

By using a mounter having plural lanes, the number of boards produced per unit area of component-mounted boards can be increased more than when using a mounter having only one lane.

Furthermore, focusing on one mounting head of a mounter having plural lanes, for example, when component mounting for a board on a lane ends, it is possible, without waiting for the next board on such lane, to start mounting components onto a board on another lane.

In other words, it is possible to reduce the time consumed in carrying boards. Expressed differently, it is possible to reduce mounting head idle time.

Technology regarding such a mounter having plural lanes is disclosed. For example, there is disclosed a technique concerning a production line in which plural mounters, each having two lanes, are connected (see Patent Citation 1, for example).

According to this technique, a program is used to control whether each of the two lanes of the respective mounters is to be used as a mounting stage for performing component mounting or as a bypass for performing only carrying.

With this, a subsequent board can overtake a preceding board and thus it becomes possible to support various mounting formats without providing a bypass-dedicated board-carrying mechanism.

Furthermore, there is disclosed a technique for matching the insertion order and carry-out order of boards in a mounter having two lanes (see Patent Citation 2, for example).

According to this technique, allocating conveyors which allocate boards between the two lanes are placed before and after the mounter. Furthermore, the carry-out order when boards are carrying-out to the downstream-side by the allocating conveyor on the carry-out side is determined according to the carry-in order of the boards to the mounter, used by the allocating conveyor on the carry-in side.

With this, the carrying order of boards in the production lot can be maintained according to the first in, first out rule.

Patent Citation 1: Japanese Unexamined Patent Application Publication No. 2003-204191

Patent Citation 2: Japanese Unexamined Patent Application Publication No. 2003-204192

DISCLOSURE OF INVENTION

Technical Problem

The production mode in the production of component-mounted boards using a mounter including plural lanes having such features, can be broadly separated in two depending on the timing of the board carrying, and so on, in each of the plural lanes.

For example, it is possible to cause a mounter having plural lanes to operate so that the carrying-out of boards after component mounting is synchronized between the respective lanes. In such a production mode, referred to as a synchronous mode for example, it is possible to suppress the creation of intermediate stock, and so on.

FIG. 33A is a diagram for describing the synchronous mode in a mounter having two lanes.

The mounter shown in FIG. 33A includes two carrier conveyors that are arranged in parallel with each other, and two mounting heads that face each other with the carrier conveyors located in between. Furthermore, two lanes for component mounting are formed by the respective carrier conveyors, with the respective lanes being referred to as a first lane and a second lane.

When a board is carried up to the respective board placement areas of the first and the second lane, components are mounted on each board by the two mounting heads. In addition, when component mounting to the two boards is completed, the two boards are carried out simultaneously. In other words, the two boards are handled as if they were a single board.

For example, assuming the case where one board-unit is completed by combining plural types of component-mounted boards. In this case, by producing such plural types of component-mounted boards in parallel using the synchronous mode, it is possible to suppress the creation of intermediate stock in the board-unit production site.

Furthermore, unlike in the above-described synchronous mode, it is also possible to cause the mounter to operate so that, when component mounting for a board on a lane is completed, the board on which components have already been mounted is carried out and the next board is carried in, regardless of whether or not component mounting for the board on another lane is completed. Such a production mode is referred to as, for example, the asynchronous mode.

FIG. 33B is a diagram for describing the asynchronous mode in a mounter having two lanes.

The mounter shown in FIG. 33B includes two lanes and two mounting heads, as in the mounter shown in FIG. 33A.

However, in the asynchronous mode, as shown in FIG. 33B for example, while the two mounting heads are mounting components onto a board on the second lane, the carrying-out of a component-mounted board and the carrying-in of a bare board are performed in the first lane.

Furthermore, when the mounting of components onto the board on the second lane is completed, such board is immediately carried out and the mounting of components onto the board on the first lane by the two mounting heads is started.

Here, in the synchronous mode, component mounting starts from the point in time when each of the two boards arrives at the board placement area. As such, operation which causes each of the two mounting heads to mount components only onto the board on the lane near it. The production mode which causes the two mounting heads to operate in such manner is referred to as, for example, the independent mode.

Furthermore, in the asynchronous mode, since the carrying of boards on each lane is performed independently, it is basically rare for the boards to arrive at the respective board placement areas together.

As such, in the case of the asynchronous mode, it is typical, from the perspective of production efficiency, to cause the mounter to execute what is called an alternating mode in which the two mounting heads alternately mount components onto each of the boards in the order of arrival at the component mounting area.

When the two heads alternate in such manner, the moving distance in the Y-axis direction for each of the mounting heads increases compared to when each of the mounting heads only mounts components onto the board on the lane near it.

The moving distance of a mounting head is an important element that directly affects the per-board production tact time (production time). As such, production tact time is generally shorter for the synchronous mode in which each of the mounting heads only mounts components onto the board on the lane near it, than for the asynchronous mode.

Therefore, when performing component mounting onto numerous boards in parallel, selecting the synchronous mode increases throughput and thus considered to be advantageous.

However, there are instances where the component mounting operation in either of the lanes stops, due to one reason or another, during the mounting of components onto plural boards. The effect on production efficiency of the stopping of the component mounting operation of each lane is greater with the synchronous mode than with the asynchronous mode.

FIG. 34 is a diagram for describing the difference in the effect on production efficiency brought about by the stopping of the mounting operation in the synchronous mode and in the asynchronous mode.

In the synchronous mode, after component mounting for the boards on the respective lanes is completed, the component-mounted boards are carried out. As such, as shown in FIG. 34, when component mounting in the second lane stops in order to replace a component cassette for example, at the very least, the carrying-out of the board on the first lane is not performed. In other words, the component mounting operation in the first lane stops.

However, in the asynchronous mode, the component mounting operations are performed independently for each lane, and thus, as shown in FIG. 34, the component mounting operation is continued in the first lane even when the second lane stops. In other words, the asynchronous mode is a failure-resistant production mode.

In this manner, with the synchronous mode, reduction of intermediate stock is possible and, furthermore, the synchronous mode is advantageous in that it allows for greater increase in throughput that the asynchronous mode. However, when the stopping of the component mounting operation in either of the lanes due to one reason or another is taken into consideration, it can also be said that the asynchronous mode is more advantageous.

Consequently, when judging which of the synchronous mode and the asynchronous mode is advantageous from a production efficiency perspective, prior to the production of component-mounted boards, it is necessary to judge on a case-by-case basis.

It should be noted that the above-described synchronous mode and asynchronous mode are types of production modes for when attention is focused on the carrying mode for plural boards. On the other hand, the independent mode and alternating mode are types of production modes for when attention is focused on the operating mode for plural mounting heads.

Furthermore, as described above, as a general rule, when a mounter adopts the synchronous mode, the independent mode is adopted, and, as described above, as a general rule, when the asynchronous mode is adopted, the alternating mode is adopted.

Such correspondence relationships are the result of aiming for the improvement of production efficiency, specifically, the shortening of the per-board production tact time (production time).

However, these correspondence relationships are only general rules and, due to the type and dimensions of the board and components used in the component mounting operation, as well as the mechanical structure of the mounter, there are cases where such combinations are not suitable from the perspective of production efficiency as well as cases where such combinations are not possible.

Therefore, when determining the production mode for a mounter, aside from the problem of which of the synchronous mode and the asynchronous mode should be adopted, there is also the problem of which of the independent mode and the alternating mode should be adopted.

Hereinafter, the independent mode and the alternating mode shall be described in detail.

For example, a mounter including two mounting heads and two carrier conveyors is assumed. The production mode for when such mounter produces component-mounted boards can be broadly separated into two depending on the relationship between the two mounting heads and the boards targeted for component mounting by the two mounting heads.

Specifically, it is possible to cause the mounter to operate in such a way that each of the two mounting heads are caused to mount components only onto the boards carried by the carrier conveyor which is nearer the component supply unit that is the component supply source for such mounting head, out of the two carrier conveyors. Such a production mode, as described above, is referred to as the independent mode for example.

FIG. 35A is a diagram for describing the independent mode in a mounter having two lanes.

In the mounter shown in FIG. 35A, two lanes for component mounting are formed by the two carrier conveyors, with the respective lanes being referred to as a first lane and a second lane.

Furthermore, the mounting head on the first lane-side accepts the supply of components only from the component supply unit on the first lane-side. Furthermore, the mounting head on the second lane-side accepts the supply of components only from the component supply unit on the second lane-side. This is the same for the alternating mode which is the other production mode to be described later.

In the independent mode, the mounting head on the first lane-side only mounts components onto a block that is placed in the board placement area on the first lane. Furthermore, the mounting head on the second lane-side only mounts components onto a block that is placed in the board placement area on the second lane.

FIG. 35B is a diagram for describing the alternating mode in a mounter having two lanes.

In the alternating mode, the mounting head on the first lane-side and the mounting head on the second-lane side mount components onto a block on the first lane, in coordination with each other. Furthermore, the mounting heads also mount components onto a block on the second lane, in coordination with each other.

The independent mode and the alternating mode each have features that are advantageous to production efficiency, and it is not possible to categorically say which one should be adopted.

For example, in the case of the independent mode, each of the mounting heads needs only to mount components on the board that is near the component supply unit which is its component supply source. As such, there is the feature in which a comparatively shorter moving distance is required for each of the mounting heads, as previously described.

Furthermore, in the alternating mode, there is the feature in which, one of the mounting heads can mount components onto the board on the side of the other mounting head while such other mounting head is picking up components. In other words, there is the feature in which improvement of the operating efficiency for each of the mounting heads is made possible.

Consequently, when judging which of the independent mode and the alternating mode is suitable for the scheduled component mounting operation, prior to starting the production of component-mounted boards, it is necessary to judge on a case-by-case basis in the same manner as when selecting either the synchronous mode or the asynchronous mode described above.

Specifically, in the judgment for selecting either of the synchronous mode or the synchronous mode or the asynchronous mode as well as for selecting either of the independent mode or the alternating mode, as the production modes for the mounter, the determination should be performed after considering individual, specific circumstances.

Therefore, conventionally, such a judgment is usually dependent on, for example, the rule of thumb of an experienced operator. This brings about a situation in which when the operator changes, the judgment also becomes different.

Such a situation contradicts the requirement of wanting to produce a large number and various types of component-mounted boards in the shortest possible time, and can become a major factor for reducing production efficiency.

Here, the conventional technique disclosed in Patent Citation 1 is a technique which allows the order of boards carried on two lanes to be changed when the component mounting operations in two lanes are performed asynchronously.

On the other hand, the conventional technique disclosed in Patent Citation 2 is a technique which facilitates the tracking of boards by implementing a mounting format similar to the synchronous mode by using allocating conveyors, when mounting components onto two types of boards using a mounter, for example.

Therefore, each of the two conventional techniques described above is a technique which involves either the synchronous mode or the asynchronous mode, and enables the implementation of production management facilitation. However, neither one is a solution to the problems of which to select between the synchronous mode and the asynchronous mode, and which to select between the independent mode and the alternating mode.

The present invention takes into consideration the above-mentioned conventional problems and has as an object to provide a mounting condition determining method for quantitatively judging and selecting a production mode that is suitable for a component mounting operation, before a mounter that includes parallelly-arranged plural conveyors starts production of component-mounted boards.

Technical Solution

In order to achieve the aforementioned object, the mounting condition determining method in the present invention is a mounting condition determining method for determining a mounting condition for a mounter which includes two mounting heads, two component supply units, and plural carrier conveyors, and which performs, in parallel, component mounting operations on boards to be carried by each of the plural carrier conveyors, each of the two component supply units supplying components to a corresponding one of the two mounting heads, and the plural carrier conveyors being arranged in parallel between the two component supply units, the mounting condition determining method including: obtaining mounting information including information related to the component mounting operations scheduled to be performed by the mounter; judging, using the mounting information obtained in the obtaining: (a) which production mode between a synchronous mode and an asynchronous mode is suitable for the scheduled component mounting operations, the synchronous mode causing the plural carrier conveyors to carry out component-mounted boards synchronously with each other, the asynchronous mode causing the plural carrier conveyors to carry in boards and carry out component-mounted boards independently of each other; or (b) which production mode between an alternating mode and an independent mode is suitable for the scheduled component mounting operations, the alternating mode causing the two component heads to alternately mount components onto each of the boards to be carried by the plural carrier conveyors, the independent mode causing each of the two mounting heads to mount components only onto a board to be carried by a carrier conveyor closest to the component supply unit which is a component supply source of the mounting head, among the plural carrier conveyors; and selecting the production mode indicated by a result of the judgment in the judging, as the production mode to be executed by the mounter.

In this manner, according to the mounting condition determining method in the present invention, mounting information including information related to component mounting operations is obtained. In addition, based on the obtained mounting information, either of the synchronous mode or the synchronous mode, or either the independent mode or the alternating mode is selected as the production mode that is suitable for the component mounting operations.

Specifically, the mounting condition determining method in the present invention can select the suitable production mode for component mounting operations to be performed subsequently, through quantitative judgment, based on obtained objective facts.

Accordingly, before starting the production of component-mounted boards, it is possible to determine which of the synchronous mode and the synchronous mode, or which of the independent mode and the alternating mode, is suitable as the production mode for the component mounting operations, independently of the operator.

Furthermore, the mounting information obtained in the obtaining may include information related to continuity of each of the component mounting operations that are scheduled to be performed in parallel, and the judging may include calculating, using the mounting information obtained in the obtaining, information indicating production efficiency when the mounter operates in each of the synchronous mode and the asynchronous mode, and in the judging, it may be judged, based on the information indicating the production efficiency calculated in the calculating, that the production mode having higher production efficiency between the synchronous mode and the asynchronous mode is suitable for the scheduled component mounting operations.

According to the present mounting condition determining method, mounting information including information related to the continuity of component mounting operations is obtained. In addition, based on the obtained mounting information, the production mode having higher production efficiency, between the synchronous mode and the asynchronous mode, is selected.

With this, it is possible to select the production mode having advantageous production efficiency, through quantitative judgment, based on obtained objective facts.

Furthermore, in the calculating: predicted stoppage times may be calculated using the information related to continuity included in the mounting information, each of the predicted stoppage times being a predicted value of stoppage time for a corresponding one of the component mounting operations that are scheduled to be performed in parallel in each of the synchronous mode and the asynchronous mode; and the information indicating the production efficiency of each of the synchronous mode and the asynchronous mode may be calculated using the calculated predicted stoppage times.

In this manner, the respective production efficiencies of each production mode may be obtained using predicted stoppage times which can be calculated from the obtained information. For example, it is possible to obtain information indicating the production efficiency for the respective production modes by deducting the production efficiency value (for example, the number of boards that cannot be produced due to stoppage) corresponding to the predicted stoppage time, from the production efficiency value (for example, the number of boards produced per unit-time) in the case where there are no stoppages in each of the cases of the respective production modes.

Furthermore, one or more component storage units may be loaded into each of the two component supply units, each of the component storage units storing plural components of one type, the mounting information obtained in the obtaining may include usage quantities and stored-component quantities as the information related to continuity, each of the usage quantities being the number of components to be mounted on a board in each of the component mounting operations that are scheduled to be performed in parallel, for each type of component, and each of the stored-component quantities being the number of components stored in each of the plural component storage units, and in the calculating, the predicted stoppage times attributed to component run-outs may be calculated using the usage quantities and the stored-component quantities.

Specifically, the predicted stoppage times attributed to component run-out, for example, the predicted value for stoppage time accompanying the replacement of the component supply unit when a component run-out occurs, may be calculated using information such as the usage quantity of components, and the information indicating the production efficiency for each of the modes may be calculated from such predicted value.

By doing so, for example, when a component tape that does not allow component tape splicing is used, it is possible to select the production mode that is suitable for the mounter in such situation.

Furthermore, the mounting information obtained in the obtaining may include pickup rates or mounting rates of the respective components as the information related to continuity, the respective components being mounted onto the boards in each of the component mounting operations that are scheduled to be performed in parallel, and in the calculating, the predicted stoppage times attributed to pickup errors or mounting errors may be calculated using the pickup rates and the mounting rates.

Specifically, the predicted stoppage times attributed to pickup errors or mounting errors, for example, the predicted value for stoppage time accompanying the additional treatment such as discarding a component when a pickup miss or a mounting miss occurs, may be calculated, and the information indicating the production efficiency for each of the modes may be calculated from such predicted value.

In this manner, by using the information obtained from past actual performance such as the component pickup rate and mounting rate, it is possible to select the production mode that is suitable for the mounter in a situation in which pickup errors and mounting errors occur.

Furthermore, the mounting information obtained in the obtaining may include information indicating operational rates of the mounter as the information related to continuity, each of the operational rates corresponding to one of the component mounting operations performed, in parallel, by the mounter, and in the calculating, the information indicating the production efficiency of each of the synchronous mode and the asynchronous mode may be calculated using the operational rates included in the mounting information.

Accordingly, for example, when the certain problem which causes component mounting operations to stop is with the mounter itself, it is possible to select the production mode for obtaining better production efficiency with such a mounter.

Furthermore, the mounting information obtained in the obtaining may further include data related to the boards or the components to be used in the scheduled component mounting operations, and in the judging: when it is judged, from the information indicating production efficiency calculated in the calculating, that the synchronous mode is suitable for the scheduled component mounting operations, it may be further judged, using the mounting information including data related to the boards or the components, whether or not the mounter can operate in the independent mode; and (c) it may be judged that the synchronous mode is suitable for the scheduled component mounting operations, when it is judged that the mounter can operate in the independent mode; and (d) it may be judged that the asynchronous mode is suitable for the scheduled component mounting operations, when it is judged that the mounter cannot operate in the independent mode.

Accordingly, even when the synchronous mode is judged to be suitable, the asynchronous mode is selected when the execution of the independent mode is not possible.

Specifically, when the mounter cannot operate in the independent mode, that is, when the mounter can only operate in the alternating mode, the asynchronous mode, which is advantageous from the production efficiency perspective, is selected.

Furthermore, in the selecting: in the case where the synchronous mode is selected, the independent mode may be selected as the production mode to be executed by the mounter together with the synchronous mode; and in the case where the asynchronous mode is selected, the alternating mode may be selected as the production mode to be executed by the mounter together with the asynchronous mode.

Accordingly, two types of production modes are selected in a combination that is advantageous in terms of production efficiency.

Furthermore, the mounting information obtained in the obtaining may include data related to the boards or the components to be used in the scheduled component mounting operations, and in the judging, it may be judged, using the mounting information obtained in the obtaining, which production mode between the alternating mode and the independent mode is suitable for the scheduled component mounting operations.

According to the present mounting condition determining method, mounting information including information related to the components and boards to be used in scheduled component mounting operations is obtained. In addition, the production mode that is suitable for the scheduled component mounting operations is selected between the independent mode and the alternating mode, based on the obtained mounting information.

By doing so, it is likewise possible to select the production mode that is suitable for the scheduled component mounting operations, through quantitative judgment using objective facts regarding various elements used in the component mounting operations.

Furthermore, the plural carrier conveyors may be made up of two carrier conveyors, the mounting information obtained in the obtaining may include board information which is information related to the boards to be carried by each of the two carrier conveyors, and in the judging: it may be judged, using the board information, whether or not at least a portion of each of the boards to be carried by the two carrier conveyors or a mounting position-inclusive portion of each of the boards is to be placed, for component mounting, within a restricted area in the case of the independent mode, the restricted area prohibiting entry of one of the two mounting heads when the other is inside; and it may be judged that the alternating mode is suitable for the scheduled component mounting operations, when at least a portion or the mounting position-inclusive portion of each of the boards is to be placed within the restricted area.

Accordingly, for example, when a restricted area is present in the case of the independent mode due to the structure of the mounter, the production mode that is suitable for the dimensions or the mounting positions of the respective boards is selected, taking into account such restricted area.

Furthermore, the plural carrier conveyors may be made up of two carrier conveyors, one or more component storage units may be loaded into each of the two component supply units, each of the component storage units storing plural components of one type, the mounting information obtained in the obtaining may include board information indicating a type of a component to be mounted onto the board carried by each of the two carrier conveyors, and supply unit information indicating an attribute of the one or more component storage units corresponding to each of the two component supply units, and in the judging: it may be judged, using the board information and the supply unit information, whether or not both of the two component supply units can supply common components which are components of a same type to be mounted onto both the board carried by one of the carrying conveyors and the board carried by the other of the carrying conveyors; and it may be judged that the alternating mode is suitable for the scheduled component mounting operations, when only one of the two component supply units can supply the common components.

Accordingly, whether or not both component supply units can supply common components is judged quantitatively based on the obtained data. Furthermore, the suitable production mode for the component mounting operations is selected through such quantitative judgment.

Furthermore, the supply unit information may include, as the attribute, information indicating a type of the one or more component storage units that are loaded or can be loaded into each of the two component supply units, the component storage units corresponding to each of the two component supply units, and in the judging, it may be judged that only one of the two component supply units can supply the common components, when it is judged, based on the board information and the supply unit information, that a component storage unit storing the common components is loaded or can be loaded into only one of the two component supply units.

In this manner, by using a criteria of whether or not component storage units, such as a component cassettes in which common components are stored, are actually loaded into both of the component supply units, or whether or not loading is possible, the judgment for whether or not both of the component supply units can supply common components is performed accurately.

Furthermore, the supply unit information may further include, as the attribute, information indicating a quantity that can be used in the scheduled component mounting operations, for each of the one or more component storage units that can be loaded into each of the two component supply units, and in the judging, it may be judged that a component storage unit storing the common component can only be loaded into one of the two component supply units, when the supply unit information indicates that the usable quantity of the component storage unit storing the common components is 1.

Accordingly, the possibility for arranging common components into both of the component supply units at a certain point in time is judged based on the variable attribute of the number of usable component storage units. For example, the number of component cassettes storing common components that can be provided varies depending on individual sites or periods. As such, by judging the possibility for arranging common components into both of the component supply units using the number of usable component storage units, a more realistic production mode selection is performed.

Furthermore, the plural carrier conveyors may be made up of two carrier conveyors, one or more nozzles may be attached to each of the two mounting heads, each of the one or more nozzles picking up and mounting a component onto a board, the mounting information obtained in the obtaining may include component information and nozzle information, the component information indicating a type of a component to be mounted onto the board carried by each of the two carrier conveyors and a type of nozzle capable of mounting the component onto the board, the nozzle information indicating a type of the one or more nozzles corresponding to each of the two mounting heads, in the judging: it may be judged, using the component information and the nozzle information, whether or not both of the two component supply units can supply common components which are components of a same type to be mounted onto both the board carried by one of the carrying conveyors and the board carried by the other of the carrying conveyors; and it may be judged that the alternating mode is suitable for the scheduled component mounting operations, when only one of the two component supply units can supply the common components.

Accordingly, whether or not both mounting heads can mount common components is judged quantitatively based on the obtained data. Furthermore, the suitable production mode for the component mounting operations is selected through such quantitative judgment.

In addition, the present invention can be implemented as a mounting condition determining apparatus which executes the characteristic processing steps in the mounting condition determining method of the present invention. Furthermore, it is also possible to implement the present invention as a mounter which includes the mounting condition determining apparatus of the present invention, and which performs component mounting according to the determination thereof.

In addition, the present invention can be implemented as a program which causes a computer to execute the characteristic processing steps in the mounting condition determining method of the present invention, and also as a recording medium such as a CD-ROM on which the program is recorded, and as an integrated circuit. The program can also be distributed via a transmission medium such as a communication network.

Advantageous Effects

The present invention can provide a mounting condition determining method for quantitatively judging and selecting a production mode that is suitable for a component mounting operation, before a mounter that includes parallelly-arranged plural conveyors starts production of component-mounted boards.

According to the present invention, the production mode with higher production efficiency, for example, is selected from between the synchronous mode and the asynchronous mode, for one mounter including plural carrier conveyors, as well as a production line in which a plurality of such mounters is connected.

In addition, the production mode selection according to the mounting condition method of the present invention can be performed before starting the production of component-mounted boards. Accordingly, it is possible to perform preparations such as associating the types of components and the carrying conveyors according to the selected production mode, and allocate components to the component supply units, before such starting, then start production.

Therefore, there is no need to change, for example, from the synchronous mode to the asynchronous mode, or vice versa, during the production of component-mounted boards. In other words, there is no need to perform complicated control such as changing the timing for inserting boards into the mounter during the production of component-mounted boards.

Furthermore, the present invention can provide a mounting condition determining method for quantitatively judging which of the independent mode and the alternating mode is suitable, before a mounter that includes plural carrier conveyors, for example, a mounter including two mounting heads, two component supply units which supply components to the two mounting heads, and two carrier conveyors arranged in parallel between the two component supply units, starts production of component-mounted boards.

Specifically, the judging in the present invention uses information related to the boards and components which are elements to be used in the component mounting operations that are scheduled to be performed by the mounter. As such, the production mode that is suitable for the execution of the component mounting operations is determined.

Therefore, there is no need to change, for example, from the independent mode to the alternating mode, or vice versa, during the production of component-mounted boards. In other words, there is no need to perform complicated control following a change in production mode, such as changing the component pickup order of each mounting head.

The disclosure of Japanese Patent Application No. 2008-40473 filed on Feb. 21, 2008 including specification, drawings and claims, and the disclosure of Japanese Patent Application No. 2008-52018 filed on Mar. 3, 2008 including specification, drawings and claims, are incorporated herein by reference in their entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings:

FIG. 7B is a diagram for describing the outline of the asynchronous mode in the mounter in the first embodiment;

FIG. 12A is a diagram showing a specific example of the information regarding the A-board, used in the processing shown in FIG. 11;

FIG. 12B is a diagram showing a specific example of the information regarding the B-board, used in the processing shown in FIG. 11;

FIG. 16A is a diagram showing a specific example of the information regarding the A-board, used in the processing shown in FIG. 15;

FIG. 16B is a diagram showing a specific example of the information regarding the B-board, used in the processing shown in FIG. 15;

FIG. 19 is a diagram showing an example of the data structure of the board data in the second embodiment;

FIG. 20 is a diagram showing an example of the data structure of the component library in the second embodiment;

FIG. 21 is a diagram showing an example of the data structure of the supply unit data in the second embodiment;

FIG. 22 is a diagram showing an example of the data structure of the nozzle data in the second embodiment;

Figure 1:
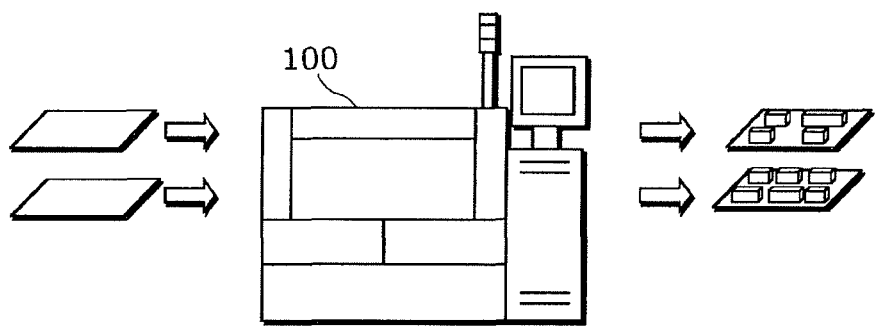
FIG. 1 is an outline view showing the outline of a mounter in a first embodiment.

EXPLANATION OF REFERENCE 100, 200, 300 Mounter
101 First conveyor
101a, 102a Fixed rail
101b, 102b Movable rail
102 Second conveyor
104, 107 Mounting head
105, 108 Beam
106, 109 Component supply unit
110 Component cassette
120, 220, 320 Mounting condition determining apparatus
121, 221, 321 Communication unit
122, 222, 322 Obtainment unit
123, 331 Calculation unit
124, 224 Selection unit
130 Mounting information storage unit
130a Board data
130b Component library
130c Supply unit data
130d Nozzle data
140 Machinery control unit
150 Machinery unit
223 Judgment unit
330 First judgment unit
332 First selection unit
340 Second judgment unit
341 Suitability judgment unit
342 Second selection unit

BEST MODE FOR CARRYING OUT THE INVENTION

Hereinafter, embodiments of the present invention shall be described with reference to the Drawings.

(First Embodiment)

First, the structure of a mounter 100 in a first embodiment of the present invention shall be described using FIG. 1 to FIG. 5.

FIG. 1 is an outline view showing the outline of a mounter 100 in the first embodiment.

As shown in FIG. 1, the mounter 100 in the first embodiment is a mounter which includes plural carrier conveyors arranged in parallel, and which performs, in parallel, component mounting operations on the boards carried on each of the plural carrier conveyors.

Specifically, by including two carrier conveyors, the mounter 100 has two lanes which are carrying paths for mounting components onto boards. The mounter 100 can perform, in parallel, component mounting for the boards on each of the two lanes.

Figure 2:
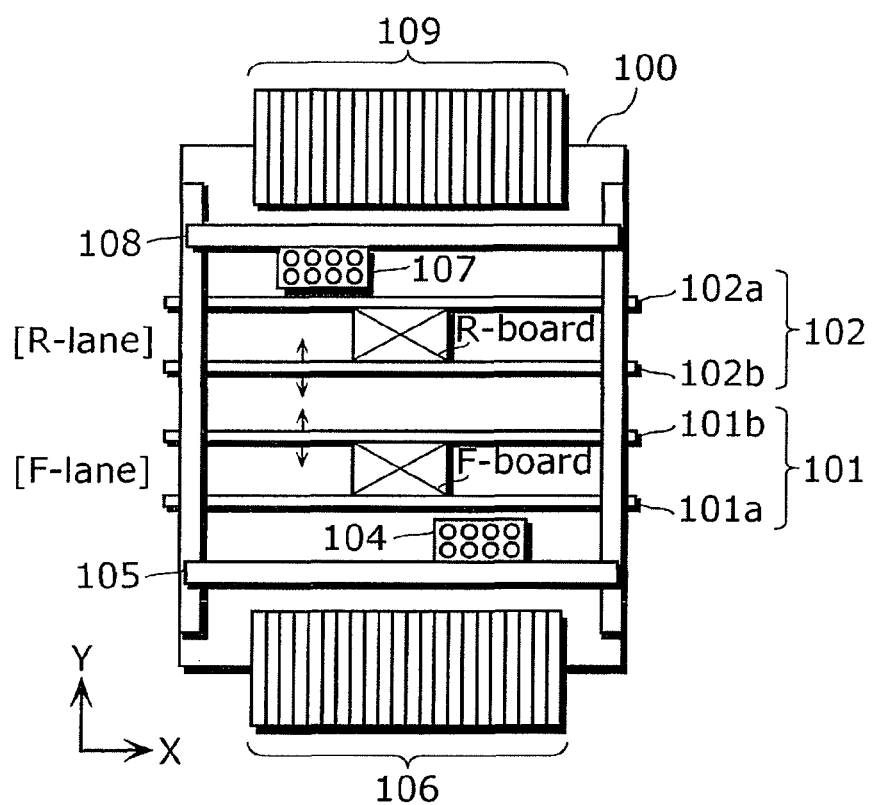
FIG. 2 is a top outline view showing the lane structure of the mounter in the first embodiment.

FIG. 2 is a top outline view showing the lane structure of the mounter 100 in the first embodiment.

As shown in FIG. 2, the mounter 100 includes, as a mechanism for mounting components onto respective boards carried thereto, a mounting head 104 and a mounting head 107 that face each other, and a component supply unit 106 and a component supply unit 109 which supply components to the mounting heads.

In addition, the mounter 100 includes a first conveyor 101 and a second conveyor 102 which are arranged in parallel between the component supply unit 106 and the component supply unit 109.

Furthermore, as shown in FIG. 2, in the mounter 100, a Front (F) lane which is the lane on the front-side (the bottom-side in FIG. 2) is formed by the first conveyor 101. Furthermore, a Rear (R) lane which is the lane on the rear-side (the top-side in FIG. 2) is formed by the second conveyor 102.

Each of the first conveyor 101 and the second conveyor 102 can change its own width according to the width of the board (the length of the board in the Y-axis direction) that is being carried.

Specifically, the first conveyor 101 is configured of a fixed rail 101a and a movable rail 101b, and can change its own width by moving the movable rail 101b in the Y-axis direction.

Furthermore, in the same manner, the second conveyor 102 is configured of a fixed rail 102a and a movable rail 102b, and can change its own width by moving the movable rail 102b in the Y-axis direction.

Since the first conveyor 101 and the second conveyor 102 can change width in such manner, the mounter 100 is able to perform component mounting on boards of various dimensions.

In each of the F-lane and R-lane, boards are carried from the left-side of FIG. 2 which is the upstream-side, towards the right-side of FIG. 2 which is the downstream-side.

One or more nozzles can be attached to both the front-side mounting head 104 and the rear-side mounting head 107. Furthermore, when plural nozzles are attached, plural components can be picked up collectively.

Furthermore, the mounting head 104 mounts components picked up from the component supply unit 106 onto a board.

The mounting head 107 mounts components picked up from the component supply unit 109 onto a board.

In the first embodiment, one or more component cassettes storing plural components of one type can be loaded into each of the component supply unit 106 and the component supply unit 109.

The mounting head 104 can move in the X-axis direction along a beam 105, and the mounting head 107 can move in the X-axis direction along a beam 108. In addition, each of the beam 105 and the beam 108 can move independently in the Y-axis direction.

With this structure, each of the mounting head 104 and the mounting head 107 moves within a predetermined range on the XY-plane, independently of the other.

Through the movement of the mounting head 104 and the mounting head 107 in such manner, components can be mounted on two boards that are respectively carried up to the board placement areas by the first conveyor 101 and the second conveyor 102.

Furthermore, the mounter 100 can adopt, as a production mode in the production of component-mounted boards, either a synchronous mode which causes the carrying-out of boards that have already been component-mounted to be synchronized between the respective carrier conveyors, or an asynchronous mode which causes the carrying-in of boards and the carrying-out of boards that have already been component-mounted to be performed independently between the respective carrier conveyors.

For example, assume two boards carried on the F-lane and the R-lane as an F-board and an R-board, respectively, as shown in FIG. 2. In this case, the board and mounting head combinations in the respective cases of the synchronous mode and the asynchronous mode are as follows.

In the case of the synchronous mode, as a general rule, the front-side mounting head 104 mounts components onto the F-board, and the rear-side mounting head 107 mounts components onto the R-board. In other words, the independent mode is executed.

This is because, the moving distances in the Y-axis direction for the mounting head 104 and the mounting head 107 are shorter in the independent mode than in the alternating mode, and thus production tact time is shortened as a result.

Furthermore, in the case of the asynchronous mode, as a general rule, the mounting head 104 and the mounting head 107 alternately mount components onto each the F-board and the R-board. In other words, the alternating mode is executed.

This is because, when the mounting head 104 and the mounting head 107 operate in the alternating mode, the interruption period in the mounting operation due to the component pickup operation of the mounting head 104 and the mounting head 107 is shorter, and thus production tact time is shortened as a result.

For example, assuming the case where the F-board and the R-board are carried in the synchronous mode and the mounting head 104 and the mounting head 107 operate in the independent mode. In this case, only the mounting head 104 performs mounting onto the F-board. As such, while the mounting head 104 picks up components, the mounting operation for the F-board is interrupted. At this time, when the R-board is not on the mounting stage, an unnecessary waiting time arises for the mounting head 107.

However, when the mounting head 104 and the mounting head 107 operate in the alternating mode, the mounting head 107 can mount components onto the F-board while the mounting head 104 is picking up components. As such, the interruption of the component mounting operation for the F-board can be minimized.

It should be noted that the mounting of components onto the boards is possible even when the combination of the F-board and R-board and the mounting head 104 and mounting head 107 is one other than that described above. However, from the perspective of production efficiency, the above-described combination is adopted as the combination that is suitable for the synchronous mode.

Figure 3:
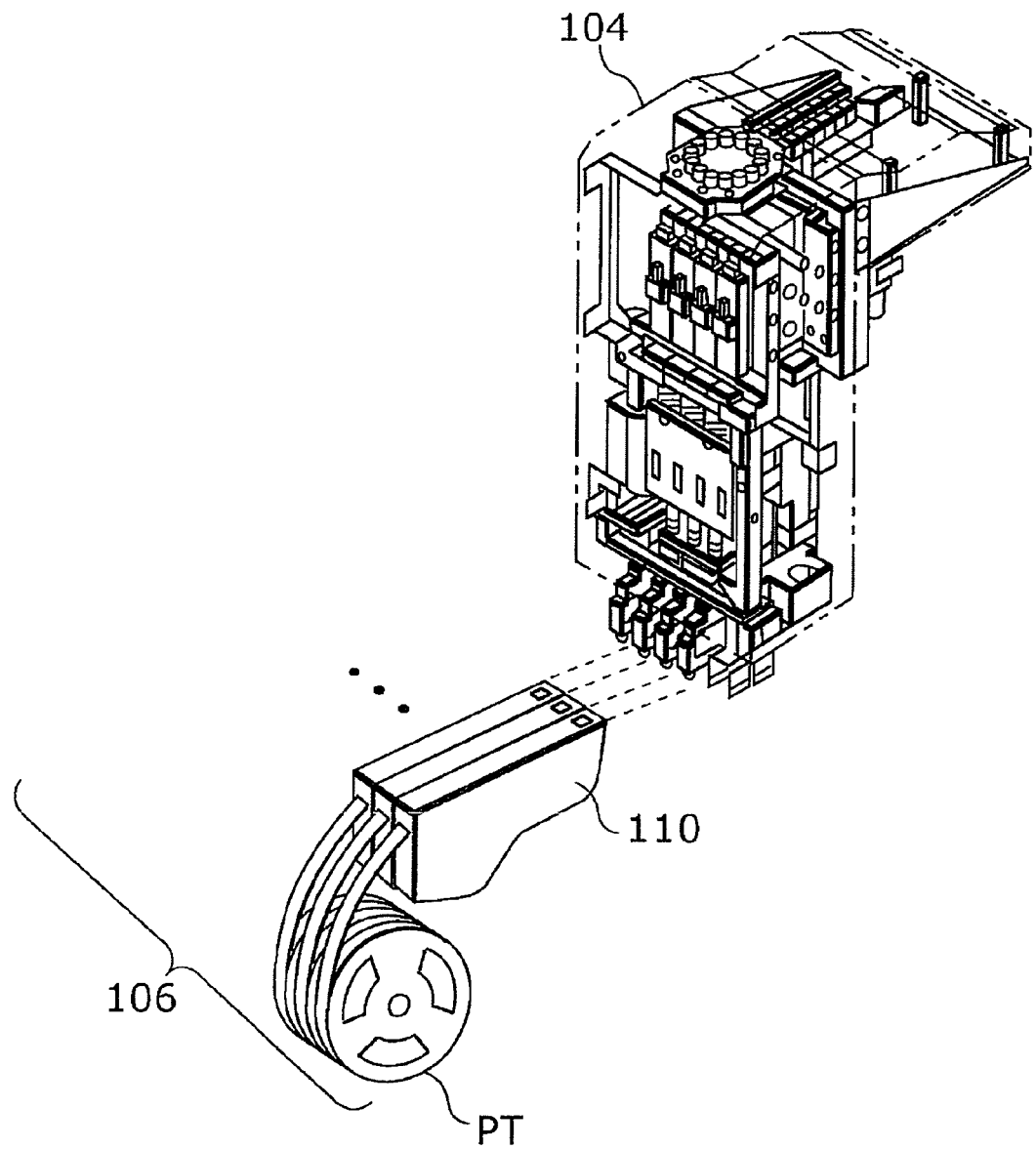
FIG. 3 is a schematic diagram showing the positional relationship between a mounting head and a component supply unit in the first embodiment.

FIG. 3 is a schematic diagram showing the positional relationship between the mounting head 104 and the component supply unit 106.

As previously described, one or more nozzles can be attached to the mounting head 104 and, in the first embodiment, a maximum of 8 nozzles can be attached.

Furthermore, the 8 nozzles form 2 parallel columns in which 4 nozzles are lined-up in each column. As such, it is possible to simultaneously (in one up and down action) pick up components from each of a maximum of 4 component cassettes 110.

Furthermore, in the first embodiment, one component reel PT is loaded onto each of the component cassettes 110. A component tape storing plural components of one type is wound around the component reel PT, and components are supplied to the mounter 100 from the component reel PT via the component cassette 110.

It should be noted that each of the plural component cassettes 110 is an example of the component storage unit in the mounting condition determining method of the present invention. Furthermore, instead of the component cassette 110, a parts feeder or a component tray, and the like can be used as a component storing unit.

Furthermore, the mounting head 107 has the same structure as the mounting head 104, and can pick up components from each of a plurality of component cassettes 110 set into the component supply unit 109, and mount the picked up components onto a board.

It should be noted that the mechanical structure for component mounting included in the mounter 100 described using FIG. 1 to FIG. 3 is the same for a mounter 200 in a second embodiment and a mounter 300 in a third embodiment described later.

Figure 4:
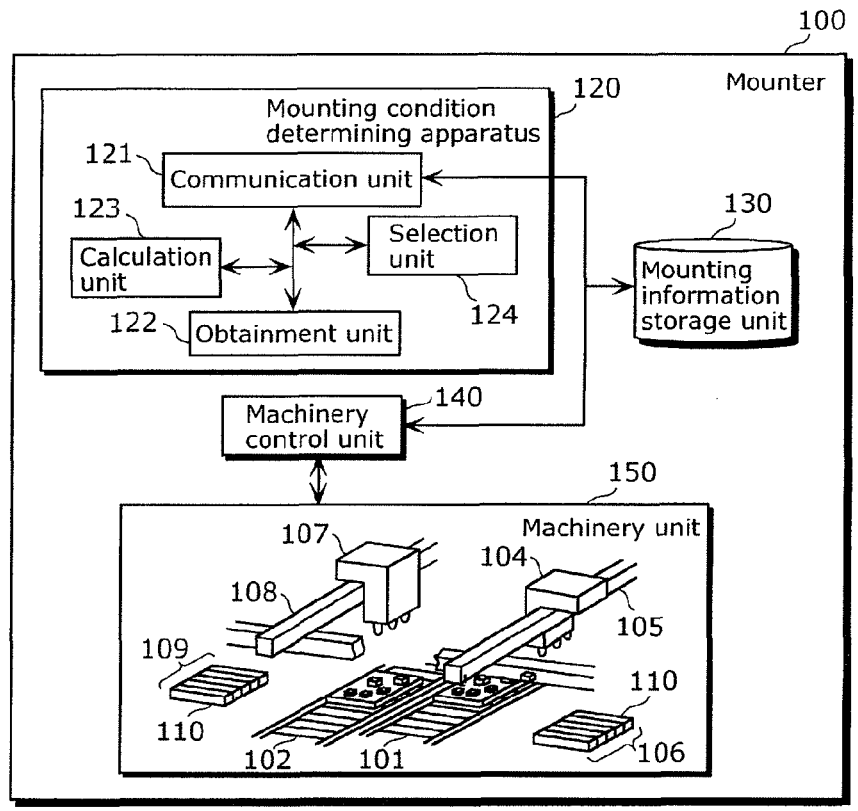
FIG. 4 is function block diagram showing the main functional structure of the mounter in the first embodiment.

FIG. 4 is function block diagram showing the main functional structure of the mounter 100 in the first embodiment.

As shown in FIG. 4, the mounter 100 includes a mounting condition determining apparatus 120, a mounting information storage unit 130, and a machinery control unit 140, in addition to a machinery unit 150 which includes the mounting head 104 and so on.

The mounting condition determining apparatus 120 is an apparatus which determines the mounting condition for the mounter 100. In the first embodiment, the mounting condition determining apparatus 120 determines the production mode which is a type of mounting condition.

Specifically, before the start of a series of component mounting operations, the mounting condition determining apparatus 120 selects the production mode suitable for such component mounting operations, from between the synchronous mode and the asynchronous mode.

As shown in FIG. 4, the mounting condition determining apparatus 120 includes a communication unit 121, an obtainment unit 122, a calculation unit 123, and a selection unit 124.

The communication unit 121 is a processing unit for performing the exchange of information between the mounting condition determining apparatus 120 and the other constituent units within the mounter 100 and other external devices.

The obtainment unit 122 is a processing unit which obtains various mounting information including information related to the continuity of the component mounting operations such as the carrying of boards, the picking-up of components, and the mounting of the components onto the boards.

In the first embodiment, the obtainment unit 122 obtains component mounting information which is stored in the mounting information storage unit 130 and which includes information related to the continuity of the component mounting operations.

Figure 5:
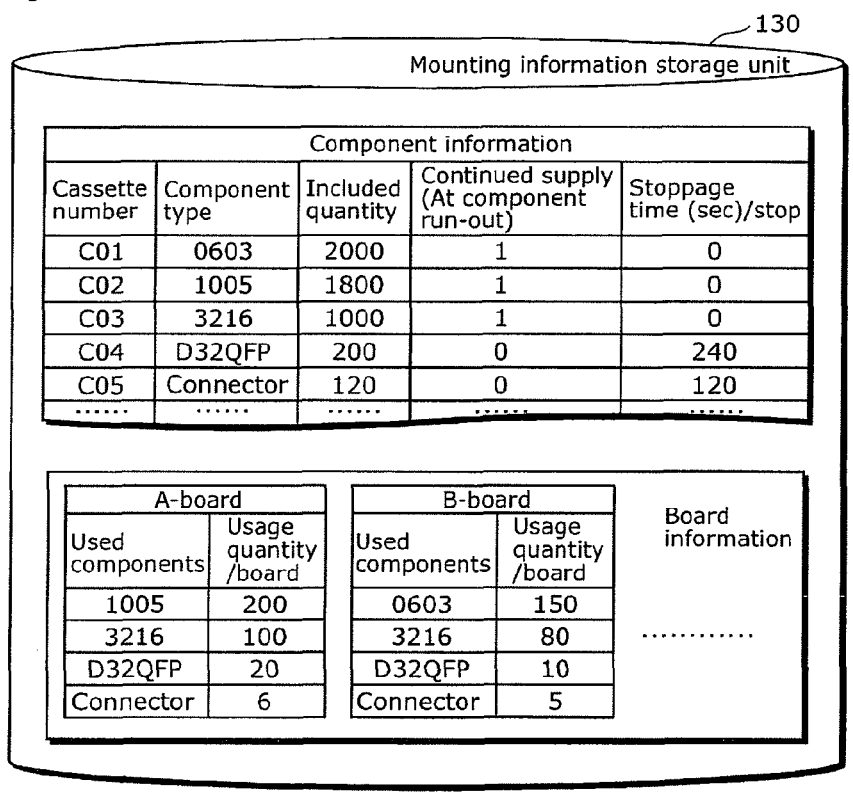
FIG. 5 is a diagram showing a first example of the data structure of the mounting information in the first embodiment.

The mounting information stored in the mounting information storage unit 130 shall be described using FIG. 5.

The calculation unit 123 is a processing unit which calculates, using the mounting information obtained by the obtainment unit 122, information indicating production efficiency for when the mounter 100 operates in each of the synchronous mode and the asynchronous mode.

The selection unit 124 is an example of a processing unit which executes the judging in the mounting condition determining method of the present invention. Specifically, the selection unit 124 selects, using the mounting information, which of the synchronous mode and the asynchronous mode is suitable for the scheduled component mounting operations. Furthermore, the selection unit 124 is a processing unit which selects the production mode that is judged as being suitable, as the production mode to be executed by the mounter 100.

Specifically, the selection unit 124 selects, from the synchronous mode and the asynchronous mode, the one having the higher production efficiency, based on the information indicating production efficiency calculated by the calculation unit 123 using the mounting information.

The mounting condition determining apparatus 120 sends various instructions to the machinery control unit 140 so that the mounter 100 operates in the production mode determined according to such a selection.

Following such instructions, the machinery control unit 140 controls the operations of the first conveyor 101, the second conveyor 102, and so on, included in the machinery unit 150.

Furthermore, the result of the determining by the mounting condition determining apparatus 120 is transmitted, via the communication unit 121, for example, to a stocker (not illustrated) which inserts stored plural boards into the mounter 100.

The stocker inserts each of the plural boards to the respective carrier conveyors of the mounter 100, at a timing that complies with the determined production mode.

It should be noted that the processing by the communication unit 121, the obtainment unit 122, the calculation unit 123, and the selection unit 124 included in the mounting condition determining apparatus 120 in the first embodiment are implemented, for example, by a computer having a Central Processing Unit (CPU), a storage device, an interface which performs the input and output of information, and so on.

For example, the CPU obtains the mounting information via the interface. In addition, the CPU performs the calculation of the production efficiency for each of the production modes, the selection of the production mode based on the calculation result, and so on. Such processing by the computer is implemented, for example, through the computer executing the program of the present invention.

FIG. 5 is a diagram showing an example of the data structure of the mounting information in the first embodiment.

As shown in FIG. 5, the component information and board information are stored in the mounting information storage unit 130, as the mounting information including information related to the continuity of the component mounting operation.

The component information is information related to components mounted onto the various boards by the mounter 100.

The data item "cassette number" is information for identifying the type of the component cassette 110. For example, it is indicated that a component having a component type "0603" is stored in the component cassette 110 of cassette number "C01".

Furthermore, "included quantity" refers to the number of components stored. In other words, it is indicated that "2000" pieces of components of the component type "0603" are stored in the component cassette 110 of the cassette number "C01".

Furthermore, the data item "continued supply" is information indicating whether or not the components can be supplied continuously without the occurrence of a component run-out.

For example, when the component tape of the component reel PT loaded into the component cassette 110 is nearing a component run-out, it is possible to prevent the component run-out by connecting a new component tape to the current component tape.

It should be noted that the connecting of component tapes in such manner or the technique for connecting component tapes is referred to, for example, as tape splicing.

In the first embodiment, the component cassette 110 having the continued supply data item of "1" is, as a general rule, a component cassette 110 for which the occurrence of component run-out can be prevented by tape splicing.

Furthermore, the component cassette 110 having the continued supply data item of "0" is a component cassette 110 for which tape splicing is not possible due to a problem with the tape width, and the like, and for which component run-out will occur when the components of the indicated included quantity are picked up.

The data item "stoppage time" is the stoppage time of the component mounting operation associated with the replacement of the component cassette 110, and is expressed on a seconds/stop basis.

For example, it is indicated that, when the component cassette 110 of the cassette number "C04" has a component run-out, it is necessary to stop the component mounting operation for 240 seconds.

Specifically, this means that roughly 240 seconds is required from when the component cassette 110 of the cassette number "C04" has a component run-out and the component mounting operation in the lane in which such component cassette 110 is placed stops, to when the delivery and replacement with a new "C04" component cassette by an operator is carried out and the component mounting operation resumes.

Furthermore, for a component cassette 110 having a data item continued supply of "1", a stoppage time of "0" is recorded since component run-out does not occur because of the above-described tape splicing.

The board information is information about the boards onto which components are to be mounted by the mounter 100, and information for each type of board is recorded therein.

Specifically, information indicating a "used component" which is the component to be mounted, and the "usage quantity" per board for each component type are recorded for each type of board.

For example, for an A-board, it is indicated that 20 pieces of a component of a component type "D32QFP" need to be mounted. Furthermore, the usage quantity per board of A-board is also indicated for the other component types.

The mounting condition determining apparatus 120 obtains the above-described component information and board information, and calculates the information indicating production efficiency for the cases where the mounter 100 operates in each of the synchronous mode and the asynchronous mode. Furthermore, the mounting condition determining apparatus 120 selects, based on the calculation result, the production mode having the higher production efficiency.

It should be noted that the above-mentioned "board type" is specified by the mounting positions of components or the types of components to be mounted. In other words, even two boards that are physically separated are boards of the same type when the types and positions of components to be mounted are the same.

Furthermore, even when a board is physically a single board, when such board is a double-sided board onto which components are to be mounted on both sides thereof, and the types or mounting positions of the components to be mounted onto each of the surfaces are different, the board is handled as different types of boards depending on the surface onto which components are to be mounted by the mounter 100.

Next, the operation of the mounter 100 and the mounting condition determining apparatus 120 in the first embodiment shall be described using FIG. 6 to FIG. 17.

First, the basic operation when the mounter 100 operates in the synchronous mode and when the mounter 100 operates in the asynchronous mode shall be described using FIG. 6 to FIG. 10.

First, description shall be carried out assuming the case where the mounter 100 mounts components onto an A-board and a B-board indicated in the board information in FIG. 5.

Figure 6:
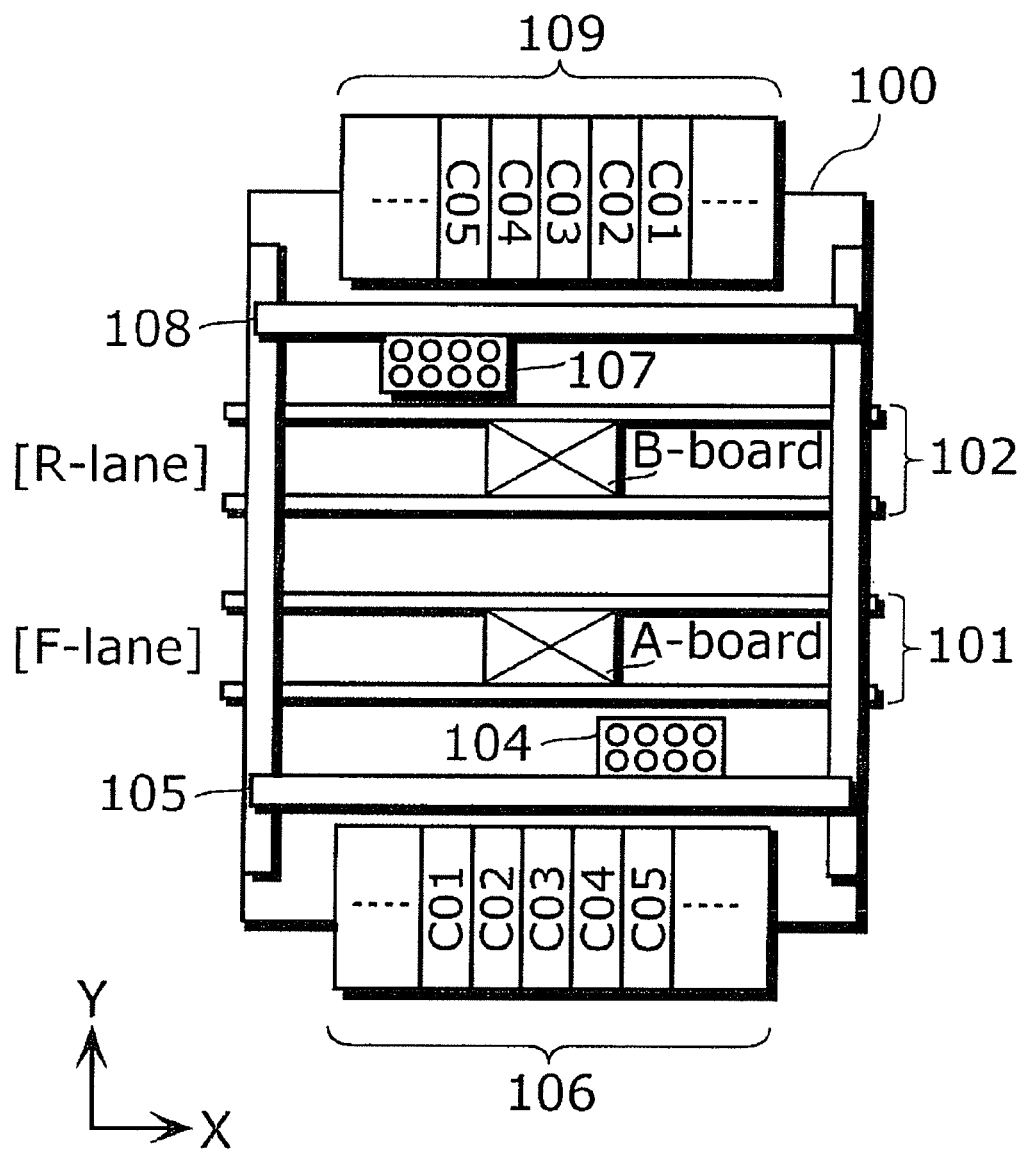
FIG. 6 is a diagram showing an example of the component cassette arrangement and an example of the board allocation in the mounter in the first embodiment.

In this case, since the mounter 100 has two lanes, the F-lane is allocated to the A-board and the R-lane is allocated to the B-board, for example, as shown in FIG. 6.

FIG. 6 is a diagram showing an example of the positioning of the component cassette 110 and the allocation of boards, in the mounter 100 in the first embodiment.

Furthermore, as shown in FIG. 6, the component cassettes 110 of C01 to C05 indicated in the component information in FIG. 5 can be set into each of the component supply unit 106 and the component supply unit 109.

It should be noted that, in the first embodiment, components of the included quantity indicated in the component information in FIG. 5 are stored into each of the component cassettes 110 of the same type that is set into each of the component supply unit 106 and the component supply unit 109, and production of component-mounted boards starts in this state.

Figure 7A:
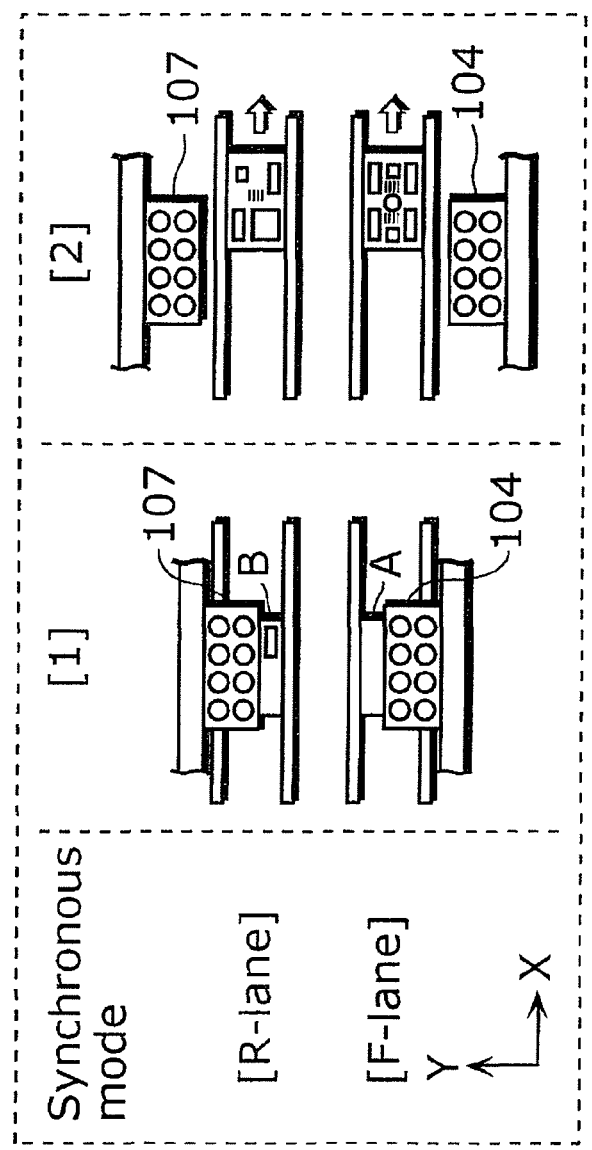
FIG. 7A is a diagram for describing the outline of the synchronous mode in the mounter in the first embodiment.

FIG. 7A is a diagram for describing the outline of the synchronous mode in the mounter 100 in the first embodiment, and FIG. 7B is a diagram for describing the outline of the asynchronous mode in the mounter 100 in the first embodiment.

First, the outline of operations when the mounter 100 operates in the synchronous mode shall be described using FIG. 7A.

[1] When the A-board arrives at the board placement area on the F-lane and the B-board arrives at the board placement area on the R-lane, the mounting of components onto the A-board and the B-board starts.

Specifically, the mounting head 104 mounts components onto the A-board on the F-lane, and the mounting head 107 mounts components onto the B-board on the R-lane.

[2] When the mounting of components onto the A-board is completed and the mounting of components onto the B-board is completed, the A-board and the B-board are simultaneously carried out to the downstream-side.

Subsequently, the above-described operations [1] and [2] are repeated until the pre-determined number of boards for production is reached.

In this manner, in the synchronous mode, the mounting of components starts when two boards are lined up together, and when the mounting of components onto the two boards is completed, the two boards are carried out together.

Therefore, for example, when one board unit is configured of the A-board and the B-board, it is possible to minimize intermediate stock. Furthermore, when the A-board and the B-board make up the front and back of one double-sided board, it is likewise possible to minimize intermediate stock.

Furthermore, each of the mounting head 104 and the mounting head 107 only mounts components onto the nearer one of the two boards. Specifically, the mounting head 104 and the mounting head 107 operate in the independent mode and thus, accordingly, the moving distance in the Y-axis direction becomes comparatively short.

Next, the outline of operations when the mounter 100 operates in the asynchronous mode shall be described using FIG. 7B.

It should be noted that FIG. 7B shows the appearance after a predetermined period has passed from the start of the component mounting operations for the A-board and the B-board.

[1] When the mounting of components onto the A-board on the F-lane is completed, such A-board is carried out to the downstream-side regardless of the progress of the component mounting operation in the R-lane.

[2] The mounting head 104 and the mounting head 107 mount components onto the B-board on the R-lane, in coordination with each other. During this period, an A-board is carried into the board placement area on the F-lane.

[3] When the mounting of components onto the B-board is completed, such B-board is carried out to the downstream-side. Furthermore, the mounting head 104 and the mounting head 107 start the mounting of components onto the A-board that has arrived at the board placement area on the F-lane.

[4] While the mounting of components is performed on the A-board on the F-lane, a B-board is carried up to the board placement position on the R-lane.

Subsequently, the mutually independent component mounting operations in the F-lane and the R-lane are repeated until the predetermined number of boards for production is reached.

In this manner, in the asynchronous mode, the carrying, component mounting, and carrying out of board on each of the lanes advances regardless of the progress of the component mounting operation in the other lane.

Therefore, even if the component mounting operation in one of the lanes were to stop, the component mounting operation in the other lane continues.

However, in the case of the asynchronous mode, since components are mounted onto one board using the alternating mode, the moving distance in the Y-axis direction for the mounting head 104 and the mounting head 107 becomes longer. As a result, as previously described, production tact time becomes longer than when each of the mounting head 104 and the mounting head 107 only mount components onto the board that is nearer to it.

As such, when the throughput of the synchronous mode and the asynchronous mode are compared, it is considered that, as a general rule, the synchronous mode will have a greater throughput.

Figure 8:
FIG. 8 is a diagram showing an example of throughput values for the respective cases of the synchronous mode and the asynchronous mode in the first embodiment.

FIG. 8 is a diagram showing an example of throughput values for the respective cases of the synchronous mode and the asynchronous mode in the first embodiment.

As shown in FIG. 8, for example, assume that the production tact time for the A-board and the B-board in the synchronous mode is 32 seconds. Furthermore, assume that the production tact time for the A-board is 40 seconds and the production tact time for the B-board is 36 seconds in the asynchronous mode.

It should be noted that in the case of the synchronous mode, the A-board and B-board for which component mounting is completed are carried out synchronously. As such, for example, even when the production tact time in the case where only the B-board is considered is 25 seconds, when the production tact time for the A-board is 32 seconds, the production tact time for both of the boards becomes 32 seconds.

Under such assumptions, when the collective number of boards produced for the A-boards and B-boards per hour in each of the modes is calculated, there will be 225 boards for the synchronous mode and 190 boards for the asynchronous mode.

However, this calculation result is attained under the assumption that component mounting operation does not stop in either of the lanes. In actuality, there are instances where the component mounting operation in at least either one of the lanes has to be stopped due to component run-out, and the like.

In this manner, when the component mounting operation in either of the lanes is stopped, the effect of such stoppage time on throughput is greater for the synchronous mode than the asynchronous mode.

Figure 9A:
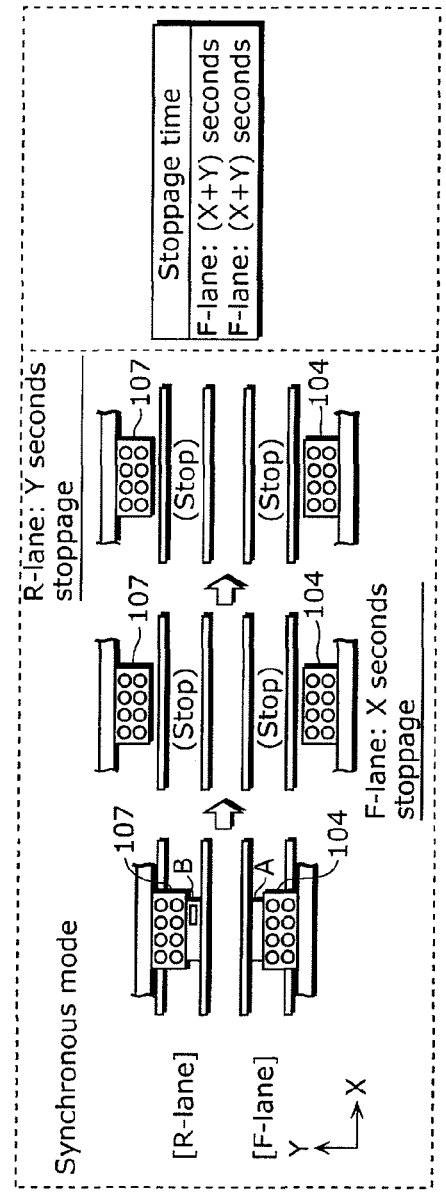
FIG. 9A is a diagram for describing the extent of the effect imparted on throughput by the component mounting operation stoppage time in the case of the synchronous mode in the first embodiment.
Figure 9B:
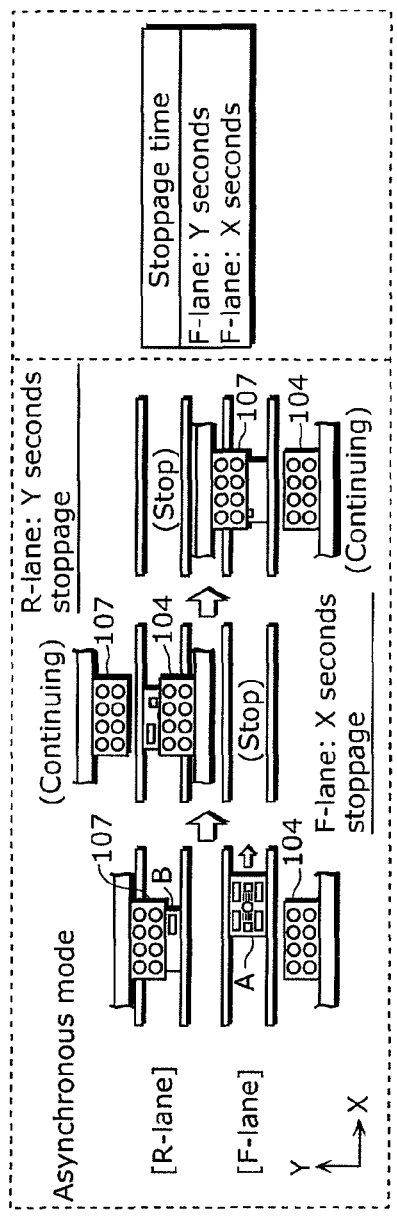
FIG. 9B is a diagram for describing the extent of the effect imparted on throughput by the component mounting operation stoppage time in the case of the asynchronous mode in the first embodiment.

FIG. 9A is a diagram for describing the extent of the effect imparted on throughput by the component mounting operation stoppage time in the case of the synchronous mode, and FIG. 9B is a diagram for describing the extent of the effect imparted on throughput by the component mounting operation stoppage time in the case of the asynchronous mode.

As shown in FIG. 9A, it is assumed that during the operation of the mounter 100 in the synchronous mode, for example, one of the component cassettes 110 of the component supply unit 106 has a component run-out and the component mounting operation in the F-lane stops for X seconds.

In this case, in the R-lane, at least the carrying-out of the B-board cannot be performed. In other words, the component mounting operations in both the F-lane and the R-lane stop for X seconds.

Subsequently, in the same manner, when the component mounting operation in the R-lane stops for Y seconds, the component mounting operations in both the F-lane and the R-lane stop for Y seconds.

As a result, the stoppage times for the component mounting operations in the F-lane and the R-lane both become (X+Y).

In contrast, in the asynchronous mode, the stoppages in each of the lanes do not affect the other lane.

For example, as shown in FIG. 9, when the component mounting operation in the F-lane stops for X seconds during the operation of the mounter 100 in the asynchronous mode, the component mounting operation in the R-lane continues during that stoppage.

Subsequently, when the component mounting operation in the R-lane stops for Y seconds, the component mounting operation in the F-lane continues during that stoppage.

As a result, the stoppage time for the component mounting operation in the F-lane is X seconds, and the stoppage time for the component mounting operation in the R-lane is Y seconds. In other words, each stoppage time is shorter than in the case of the synchronous mode.

From the description above, the actual operating times of each of the F-lane and the R-lane decreases more significantly in the synchronous mode than in the asynchronous mode, as the stoppage times (X+Y) become longer. In other words, throughput decreases even more significantly.

Figure 10:
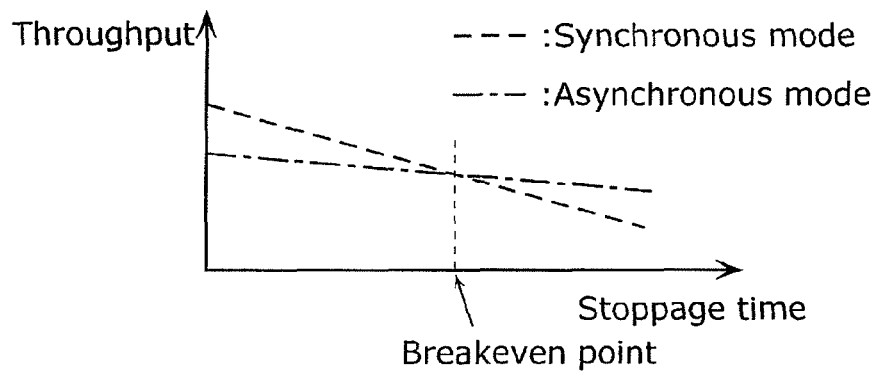
FIG. 10 is a diagram showing the correlation between the throughput and the stoppage time in the respective cases of the synchronous mode and the asynchronous mode in the first embodiment.

FIG. 10 is a diagram showing the correlation between the throughput and the stoppage time in the respective cases of the synchronous mode and the asynchronous mode.

As shown in FIG. 10, when the stoppage time is 0, the synchronous mode has a greater throughput. For example, as shown in FIG. 8, the throughput for the synchronous mode is 225 boards/hour, and the throughput for the asynchronous mode is 190 boards/hour.

However, as the stoppage times of the component mounting operations in the F-lane and the R-lane become longer, the throughputs of the synchronous mode and the asynchronous mode approach each other, and when the break-even point is exceeded, the throughput of the asynchronous mode becomes greater.

Consequently, before the start of the component-mounted board production by the mounter 100, the mounting condition determining apparatus 120 in the first embodiment selects, between the synchronous mode and the asynchronous mode, the production mode having the higher production efficiency, based on the information indicating the continuity of the component mounting operations.

Furthermore, the mounting condition determining apparatus 120 sends various instructions to the machinery control unit 140 so that the mounter 100 operates in the selected production mode.

Such various information processing performed by the mounting condition determining apparatus 120 in the first embodiment shall be described using FIG. 11 to FIG. 17.

Figure 11:
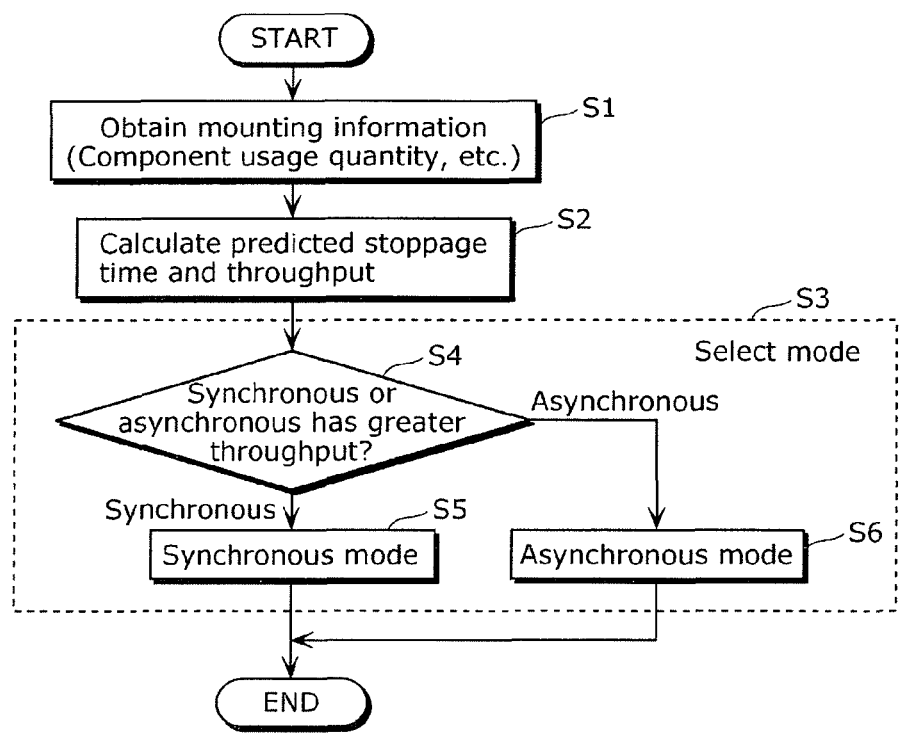
FIG. 11 is a flowchart showing a first example of the processing flow in the production mode selection by the mounting condition determining apparatus in the first embodiment.

FIG. 11 is a flowchart showing a first example of the processing flow in the production mode selection by the mounting condition determining apparatus 120 in the first embodiment.

First, the obtainment unit 122 of the mounting condition determining apparatus 120 obtains, from the mounting information storage unit 130, via the communication unit 121, mounting information including information related to the continuity of each of the component mounting operations that are scheduled to be performed in parallel with each other (S1).

Specifically, the obtainment unit 122 obtains board information regarding the A-board and the B-board which are the targets for component mounting, and component information regarding the components to be mounted onto the boards.

The calculation unit 123 calculates, using such mounting information, information indicating production efficiency for when the mounter 100 operates in each of the synchronous mode and the asynchronous mode (S2).

For example, the calculation unit obtains predicted stoppage times of the component mounting operations in each of the F-lane and the R-lane, and calculates, based on the obtained stoppage times, the throughputs for when the mounter 100 operates in each of the production modes.

Based on the information indicating production efficiency calculated by the calculation unit 123, the selection unit 124 selects, from the synchronous mode and the asynchronous mode, the production mode having the higher production efficiency (S3).

Specifically, when the synchronous mode has a higher production efficiency (synchronous in S4), the selection unit 124 selects the synchronous mode (S5). Furthermore, when the asynchronous mode has a higher production efficiency (asynchronous in S4), the selection unit 124 selects the asynchronous mode (S6).

The mounting condition determining apparatus 120 sends various instructions to the machinery control unit 140 so that the mounter 100 operates in the production mode determined according to such a selection.

It should be noted that the calculation of the information indicating production efficiency (S2) and the judgment based on the calculation result (S4) correspond to the processing in the judging in the mounting condition determining method of the present invention. Furthermore, the selection of the synchronous mode or the asynchronous mode depending on the judgment result (S5, S6) corresponds to the processing in the selecting in the mounting condition determining method of the present invention.

FIG. 12A is a diagram showing a specific example of the information regarding the A-board, used in the processing shown in FIG. 11, and FIG. 12B is a diagram showing a specific example of the information regarding the B-board, used in the processing shown in FIG. 11.

It should be noted that the various values indicated in FIG. 12A and FIG. 12B are values included in the component information and the board information shown in FIG. 5 as well as values calculated from such values.

The calculation unit 123 calculates the predicted stoppage time per board for the respective boards, based on the values indicated in the component information and the board information obtained by the obtainment unit 122.

Specifically, the calculation unit calculates the unit-stoppage time for each type of component based on the stoppage frequencies due to component-run out for the components to be mounted onto the respective boards, and the stoppage time accompanying the replacement of the respective component cassettes 110. In addition, the calculation unit 123 adds up the respective unit-stoppage times for the component cassettes 110, for each of the boards.

For example, for the A-board, component-run out will not occur since the continued supply is "1" for the component cassettes 110 having cassette numbers "C02" and "C03". As such, the unit-stoppage times are both "0".

The component cassette 110 having cassette number "C04" has a continued supply of "0" and an included quantity of 200. Furthermore, the usage quantity for D32QFP of the A-board is 20 pieces per board.

Based on these, it is known that the component mounting operation stops once when 10 A-boards are mounted with 20 pieces of D32QFP each. In other words, the stoppage frequency is 10 boards/stop.

Furthermore, the stoppage time for when the component cassette 110 having the cassette number "C04" has a component run-out is 240 seconds. In other words, the component mounting operation stops for 240 seconds for every 10 boards of the A-board.

When this is calculated on a per A-board basis, the stoppage time is 24 seconds. In other words, the unit-stoppage time for the component cassette 110 having the cassette number "C04" is 24 seconds/board.

Furthermore, using the same calculating method, the unit-stoppage time for the component cassette 110 having the cassette number "C05" is 6 seconds/board. From the above, the predicted stoppage time per A-board is calculated to be 30 seconds/board.

In addition, likewise for the B-board, the unit-stoppage time for the respective component cassettes 110 is obtained, and the predicted stoppage time per B-board is calculated to be 17 seconds/board.

In addition, using the per board predicted stoppage time for each of the A-board and the B-board, the calculation unit 123 calculates the information indicating the production efficiency for each of the synchronous mode and the asynchronous mode.

It should be noted that, in the case of the asynchronous mode, components are mounted onto the A-board and the B-board by both of the mounting head 104 and the mounting head 107, as mentioned in the description for FIG. 7B.

As such, the D32QFP mounted onto the A-board and the B-board can be supplied from the two "C04" component cassettes 110 that are each set into the component supply unit 106 and the component supply unit 109. The same is true for a connector which is a component to be mounted on to the A-board and the B-board.

In this case, the unit-stoppage time for each of the A-board and the B-board is different from the values shown in FIG. 12.

However, in order to clearly describe the features of the present invention, it is assumed that, even in the case of the asynchronous mode, D32QFT that is supplied from the "C04" component cassette 110 that is set into the component supply unit 106, and the connector supplied from the "C05" component cassette 110 that is set into the component supply unit 106 are mounted onto the A-board carried on the F-lane.

Furthermore, the following description is made assuming that D32QFT that is supplied from the "C04" component cassette 110 that is set into the component supply unit 109, and the connector supplied from the "C05" component cassette 110 that is set into the component supply unit 109, are mounted onto the B-board carried on the R-lane.

Figure 13:
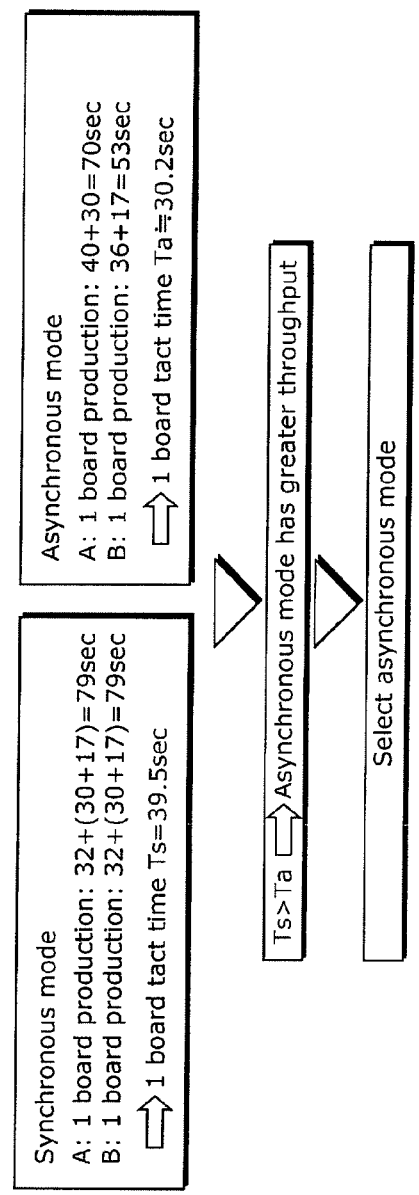
FIG. 13 is a diagram showing a first example of the information indicating the production efficiency for the respective cases of the synchronous mode and the asynchronous mode calculated by the calculation unit in the first embodiment.

FIG. 13 is a diagram showing a first example of the information indicating the production efficiency for the respective cases of the synchronous mode and the asynchronous mode calculated by the calculation unit 123.

In the case of the synchronous mode, when there are no stoppages, the production tact time for each of the A-board and the B-board is 32 seconds/board (see FIG. 8).

However, as shown in FIG. 12, the per board predicted stoppage time due to component run-out is 30 seconds/board for the A-board, and 17 seconds/board for the B-board.

Furthermore, in the case of the synchronous mode, as shown in FIG. 9A, the stoppage time for the component mounting operation in each of the lanes is the value resulting from adding-up the respective stoppage times of each of the lanes.

Therefore, the calculation unit 123 calculates 32+(30+17) =79 seconds as the predicted stoppage time-adjusted, per board production tact time for each of the A-board and the B-board.

In other words, the component mounting operations for one board of the A-board and 1 board of the B-board are completed in 79 seconds. Based on this result, the calculation unit 123 calculates the per board production tact time Ts for the case of the synchronous mode to be 39.5 seconds.

On the other hand, in the case of the asynchronous mode, when there are no stoppages, the production tact time for each of the A-board is 40 seconds/board and the production tact time for the B-board is 36 seconds/board (see FIG. 8).

Furthermore, in the case of the asynchronous mode, as shown in FIG. 9B, the stoppage time for the component mounting operation in each of the lanes does not affect the stoppage time of the component mounting operation of the other lane.

Therefore, the calculation unit 123 calculates the predicted stoppage time-adjusted, per board production tact time for the A-board to be 40+30=70 seconds. Furthermore, the calculation unit 123 calculates the predicted stoppage time-adjusted, per board production tact time for the B-board to be 36+17=53 seconds.

In other words, in 3,710 seconds which is the least common multiple of 70 seconds and 53 seconds, the component mounting operations for 123 boards made up of 53 boards of the A-board and 70 boards of the B-board are completed. Therefore, the calculation unit 123 calculates the per board production tact time Ta in the case of the asynchronous mode to be approximately 30.2 seconds obtained by dividing 3,710 by 123.

The selection unit 124 selects the production unit having the higher production efficiency, based on the information indicating the respective production efficiencies from the calculation unit 123.

Specifically, when the production tact time Ts for the case of the synchronous mode and the production tact time Ta for the case of the asynchronous mode are compared, Ta is shorter. Furthermore, this means that the throughput for the case of the asynchronous mode is greater than the throughput for the case of the synchronous mode. Based on the above-described results, the selection unit 124 selects the asynchronous mode.

Through information processing such as that described above, the mounting condition determining apparatus 120 determines which of the synchronous mode and the asynchronous mode is suitable, before the production of component-mounted boards by the mounter 100 starts. Furthermore, the mounting condition determining apparatus 120 sends various instructions to the machinery control unit 140 so that the mounter 100 operates in the determined production mode.

Furthermore, the result of the production mode determination by the mounting condition determining apparatus 120 is, for example, displayed on a display device included in the mounter 100. In response to the displayed production mode, the operator sets the various component cassettes 110 into each of the component supply unit 106 and the component supply unit 109.

By accepting the various instructions from the mounting condition determining apparatus 120 or accepting an instruction to start production from the operator, for example, the machinery control unit 140 controls the machinery unit 150 so that the machinery unit 150 executes the component mounting operation in the F-lane and the component mounting operation in the R-lane in the asynchronous mode.

In such manner, the mounting condition determining apparatus 120 in the first embodiment can determine which production mode between the synchronous mode and the asynchronous mode is suitable based on a quantitative judgment, before the mounter 100 starts the production of component-mounted boards.

It should be noted that the component information and the board information include the included quantity in the component cassette 110 which is the supply source for a component to be mounted onto the board, the usage quantity per board for such component, the length of time for which the component mounting operation stops due to the replacement of such component cassette 110, and so on. Furthermore, it is possible to calculate predicted values for the component mounting operation stoppage time, using such included quantity, and the like.

As such, the component information and the board information are mounting information including information related to the continuity of the component mounting operations.

Mounting information such as those described above is not limited to the component information and the board information shown in FIG. 5, and is available elsewhere. For example, when a component pickup error and mounting error occur, there are cases where the mounting of components onto a board, which is referred to as an actual component mounting operation, stops due to an operation to handle such error.

Furthermore, there are also cases where actual component mounting operations stop due, not only to defects related to components and boards, but also to trouble in the hardware and software of the mounter 100.

In other words, information indicating various actual performance values such as the pickup rate and the mounting rate for components, as well as the operational rate of the mounter 100, is information related to the continuity of the component mounting operations.

Therefore, the mounting condition determining apparatus 120 can also determine the production mode for the mounter 100 based on such information.

Figure 14:
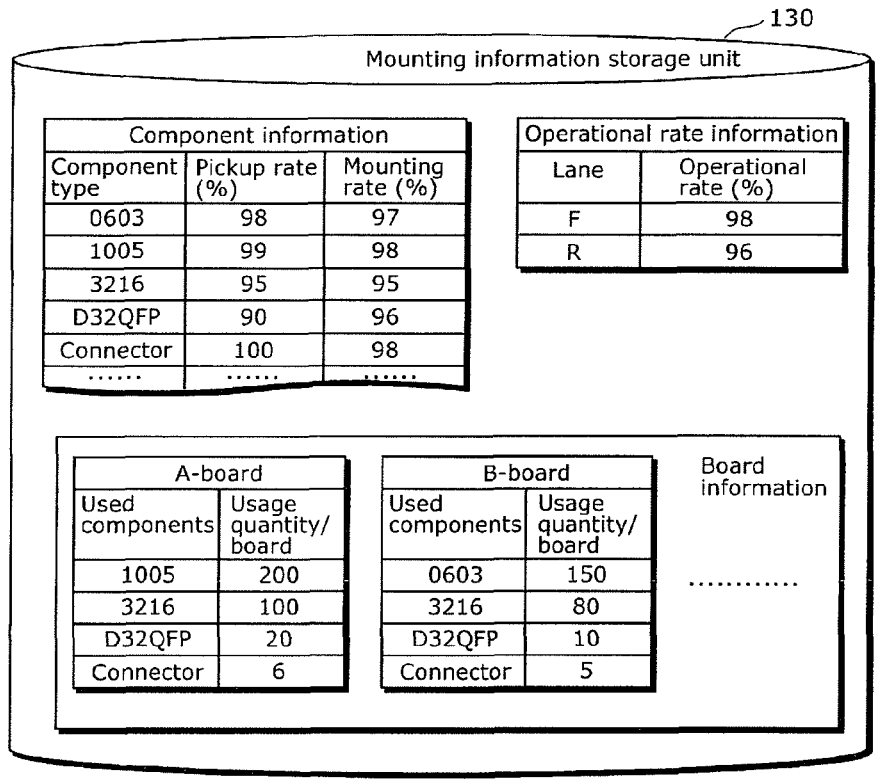
FIG. 14 is a diagram showing a second example of the data structure of the mounting information in the first embodiment.

FIG. 14 is a diagram showing a second example of the data structure of the mounting information in the first embodiment.

In the example shown in FIG. 14, component information including pickup rate and mounting rate, operational rate information, and board information are stored as mounting information including information related to the continuity of the component mounting operations.

Here, the board information shown in FIG. 14 is the same as the board information shown in FIG. 5. However, unlike the component information shown in FIG. 5, the pickup rate and the mounting rate for each component is stored in the component information shown in FIG. 14.

Such pickup rates and mounting rates are values obtained from past actual performance. For example, a component of a component type "0603" has a pickup rate of "98%". This means that, for the component of a component type "0603", some form of error occurred during pickup in 2 out of every 100 times within a predetermined period in the past.

Furthermore, instead of the pickup rate, a pickup error rate may be stored. Furthermore, instead of the mounting rate, a mounting error rate may be stored.

In addition, such pickup rate, and so on, need not be stored with respect to each component. For example, the pickup rate, and so on, may be stored for each type of nozzle. In this case, the occurrence frequency of pickup errors or mounting errors per board is identified by using the board information and information showing the correspondence between the respective nozzles of the mounting head 104 and the mounting head 107 and the components picked up by such respective nozzles.

Furthermore, the operational rate information shown in FIG. 14 includes information indicating the operational rate for each lane. Specifically, these operational rates are the operational rates of the mounter 100 corresponding to the respective component mounting operations performed in parallel, and are values obtained from past actual performance.

For example, the operational rate for the F-lane is "98%". This means that, in actual performance within a predetermined period, the component mounting operation in the F-lane stopped for 2 hours out of every 100 hours due to, for example, trouble in the first conveyor 101.

It should be noted that the respective operational rates shown in FIG. 14 are values that do not take into account stoppage time attributed to pickup errors and mounting errors.

The obtainment unit 122 of the mounting condition determining apparatus 120 obtains such information from the mounting information storage unit 130, via the communication unit 121. The calculation unit 123 calculates the information indicating production efficiency for when the mounter 100 operates in each of the synchronous mode and the asynchronous mode.

Figure 15:
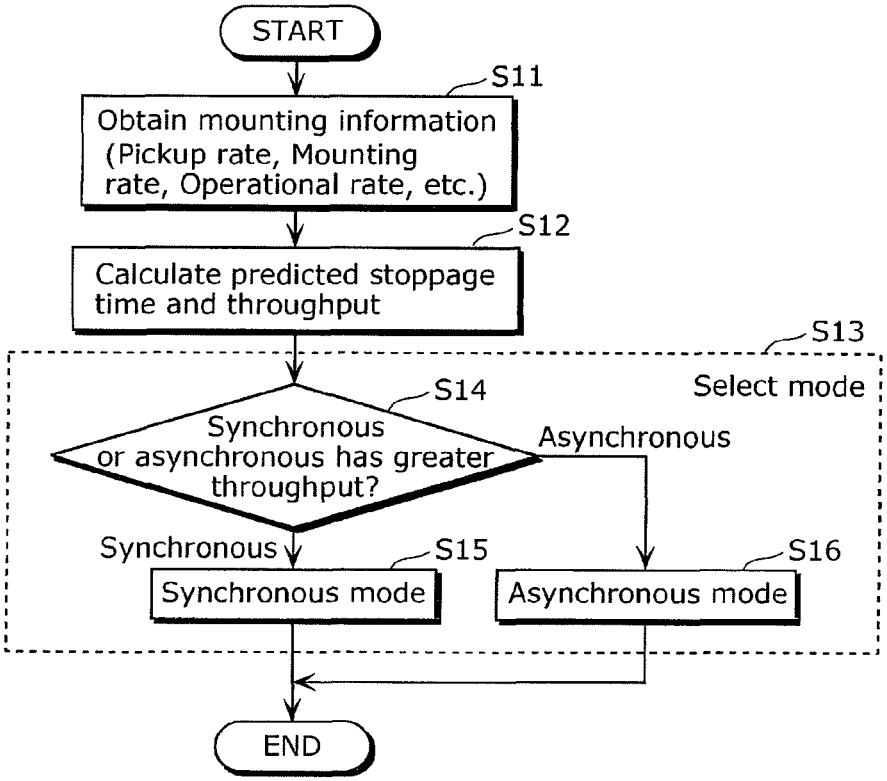
FIG. 15 is a flowchart showing a second example of the processing flow in the production mode selection by the mounting condition determining apparatus in the first embodiment.

FIG. 15 is a flowchart showing a second example of the processing flow in the production mode selection by the mounting condition determining apparatus 120 in the first embodiment.

It should be noted that the following description is made assuming the case where the production mode is selected for when the mounter 100 mounts components onto plural boards each of the A-board and the B-board, in the same manner as in the flowchart shown in FIG. 11.

First, the obtainment unit 122 of the mounting condition determining apparatus 120 obtains mounting information including information indicating the pickup rate and the mounting rate for each type of component to be mounted in the respective component mounting operations that are scheduled to be performed in parallel with each other (S11).

Furthermore, the obtainment unit 122 obtains the mounting information including information indicating the operational rates of the mounter 100 corresponding to the respective component mounting operations performed in parallel (S11).

Specifically, the obtainment unit 122 obtains, from the mounting information storage unit 130, via the communication unit 121, the board information and the component information including the pickup rate, and so on, of the components to be mounted onto the A-board and the B-board. Furthermore, the obtainment unit 122 obtains the operational rate information from the mounting information storage unit 130.

Here, the following description is made assuming the case where the obtainment unit 122 has obtained the component information and the board information.

Using the pickup rate and the mounting rate for each component type included in the component information, the calculation unit 123 obtains the predicted stoppage times for the component mounting operations in each of the lanes, that are attributed to pickup errors or mounting errors. In addition, the calculation unit 123 calculates, based on the obtained predicted stoppage times, the information indicating the production efficiency for when the mounter 100 operates in the each of the production modes (S12).

Based on the information indicating production efficiency calculated by the calculation unit 123, the selection unit 124 selects, from the synchronous mode and the asynchronous mode, the production mode having the higher production efficiency (S13).

Specifically, when the synchronous mode has a higher production efficiency (synchronous in S14), the selection unit 124 selects the synchronous mode (S15). Furthermore, when the asynchronous mode has a higher production efficiency (asynchronous in S14), the selection unit 124 selects the asynchronous mode (S16).

The mounting condition determining apparatus 120 sends various instructions to the machinery control unit 140 so that the mounter 100 operates in the production mode determined according to such a selection.

FIG. 16A is a diagram showing a specific example of the information regarding the A-board, used in the processing shown in FIG. 15, and FIG. 16B is a diagram showing a specific example of the information regarding the B-board, used in the processing shown in FIG. 15.

It should be noted that the various values indicated in FIG. 16A and FIG. 16B are values included in the component information and the board information shown in FIG. 15 as well as values calculated from such values.

The calculation unit 123 calculates the number of pieces involved in a pickup error for each component type per board from, for example, the pickup rate of the components to be mounted on each of the boards. The calculation unit 123 calculates the unit-stoppage time for each component type, based on the calculated number of pieces involved in pickup errors and the stoppage time for the component mounting operation due to the pickup error for one component. In addition, the calculation unit 123 adds up the unit-stoppage times for each component type for the respective boards.

For example, for the A-board, the usage quantity for a component "1005" is 200 and the pickup rate for the component "1005" is 99%. Therefore, the number of pieces involved in a pickup error per A-board for the component "1005" is calculated as 2 pieces/board.

Furthermore, the stoppage time for the component mounting operation caused by the occurrence of a pickup error for one component, for example, the time required to discard 1 piece of component that was not picked up in the correct posture, is 2 seconds.

This means that, in the F-lane for mounting components onto the A-board, the actual component mounting operation stops for about 2 seconds due to the operation by the machinery unit 150 to discard such 1 piece of component.

Based on this, the unit-stoppage time for the component "1005" is calculated as 4 seconds/board.

Furthermore, the unit-stoppage times for the other component types are calculated using the same calculation method, and, by adding these up, the predicted stoppage time per board of the A-board is calculated to be 16 seconds/board.

In addition, the unit-stoppage time for each component type is likewise obtained for the B-board, and the predicted stoppage time per board of the B-board is calculated to be 15 seconds/board.

It should be noted that, in the present embodiment, the stoppage time for the component mounting operation caused by the occurrence of a pickup error for one component is a value that is common for all the component types, and is a value that is obtained by the calculation unit 123 in advance.

However, this stoppage time may be different for each component type. Furthermore, for example, the stoppage times may be stored in the mounting information storage unit 130. In this case, the calculation unit 123 may obtain the relevant stoppage time via the obtainment unit 122.

Using the per board predicted stoppage time for each of the A-board and the B-board calculated in the above-described processing, the calculation unit 123 calculates the information indicating the production efficiency for each of the cases of the synchronous mode and the asynchronous mode.

Figure 17:
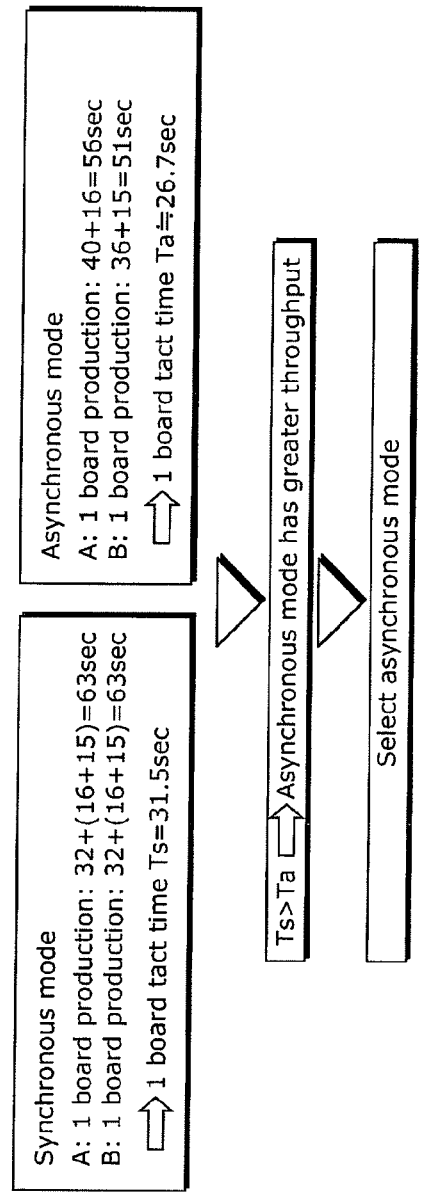
FIG. 17 is a diagram showing a second example of the information indicating the production efficiency for each of the cases of the synchronous mode and the asynchronous mode calculated by the calculation unit in the first embodiment.

FIG. 17 is a diagram showing a second example of the information indicating the production efficiency for each of the cases of the synchronous mode and the asynchronous mode calculated by the calculation unit 123.

In the case of the synchronous mode, when there are no stoppages, the production tact time for each of the A-board and the B-board is 32 seconds/board (see FIG. 8).

However, as shown in FIG. 16, the per board predicted stoppage time due to component run-out is predicted to be 16 seconds/board for the A-board, and 15 seconds/board for the B-board.

Furthermore, in the case of the synchronous mode, as shown in FIG. 9A, the stoppage time for the component mounting operation in each of the lanes is the value resulting from adding-up the respective stoppage times of each of the lanes.

Therefore, the calculation unit 123 calculates 32+(16+15) =63 seconds as the predicted stoppage time-adjusted, per board production tact time for each of the A-board and the B-board.

In other words, the component mounting operations for one board of the A-board and 1 board of the B-board are completed in 63 seconds. Based on this result, the calculation unit 123 calculates the per board production tact time Ts for the case of the synchronous mode to be 31.5 seconds.

On the other hand, in the case of the asynchronous mode, when there are no stoppages, the production tact time for each of the A-board is 40 seconds/board and the production tact time for the B-board is 36 seconds/board (see FIG. 8).

Furthermore, in the case of the asynchronous mode, as shown in FIG. 9B, the stoppage time for the component mounting operation in each of the lanes does not affect the stoppage time of the component mounting operation of the other lane.

Therefore, the calculation unit 123 calculates the predicted stoppage time-adjusted per board production tact time for the A-board to be 40+16=56 seconds. Furthermore, the calculation unit 123 calculates the predicted stoppage time-adjusted per board production tact time for the B-board to be 36+15=51 seconds.

In other words, in 2,856 seconds which is the least common multiple of 56 seconds and 51 seconds, the component mounting operations for 107 boards made up of 51 boards of the A-board and 56 boards of the B-board are completed. Therefore, the calculation unit 123 calculates the per board production tact time Ta in the case of the asynchronous mode to be approximately 26.7 seconds obtained by dividing 2,856 by 107.

The selection unit 124 selects the production unit having the higher production efficiency, based on the calculation result from the calculation unit 123.

Specifically, when the production tact time Ts for the case of the synchronous mode and the production tact time Ta for the case of the asynchronous mode are compared, Ta is shorter. Furthermore, this means that the throughput for the case of the asynchronous mode is greater than the throughput for the case of the synchronous mode. Based on the above-described results, the selection unit 124 selects the asynchronous mode.

Through information processing such as that described above, the mounting condition determining apparatus 120 determines, based on quantitative judgment, which of the synchronous mode and the asynchronous mode is suitable, before the production of component-mounted boards by the mounter 100 starts.

It should be noted that, in the case where the mounting rates of components are used, the production mode is also determined using the same processing as in the above-described case where the pickup rates are used.

For example, the calculation unit 123 obtains the predicted stoppage time per board, based on the mounting rate for each component type, and the stoppage time of the component mounting operation per 1 piece of component when a mounting error occurs.

The stoppage time of the component mounting operation per 1 piece of component when a mounting error occurs is obtained, for example, from the time required for a discarding operation for such component when so-called component take-back in which the component does not separate from the nozzle during mounting occurs.

In addition, the predicted stoppage time-adjusted production tact time is calculated for the respective cases of the synchronous mode and the asynchronous mode, from the production tact time and the predicted stoppage time for each of the boards, when there are no stoppages.

The calculation method thereof is the same as the calculation method shown in FIG. 17. In the case of the synchronous mode, in the production tact time per board of both the A-board and the B-board, the predicted stoppage time per board of both boards are added to the production tact time (32 seconds/board) for when there are no stoppages.

Furthermore, in the case of the asynchronous mode, in the production tact time per board of the A-board, the predicted stoppage time per board of the A-board is added to the production tact time (40 seconds/board) for when there are no stoppages. Furthermore, in the production tact time per board of the B-board, the predicted stoppage time per board of the B-board is added to the production tact time (36 seconds/ board) for when there are no stoppages.

From these results, Ts and Ta which are the production tact time in the cases of the synchronous mode and the asynchronous mode, respectively, are calculated. In addition, the production mode having the higher production efficiency is selected from the calculated Ts and Ta.

Furthermore, when determining the production mode using the operational rate, the following processing is performed.

For example, as shown in FIG. 14, it is assumed that the operational rate of the mounter 100 for the component mounting operation in the F-lane is 98% and the operational rate of the mounter 100 for the component mounting operation in the R-lane is 96%.

In this case, the predicted stoppage time per hour (3600 seconds) is 72 seconds for the F-lane and 144 seconds for the R-lane.

Specifically, in the synchronous mode, the calculation unit 123 calculates the predicted stoppage time for the component mounting operation in the F-lane and the R-lane as 72+144=216 seconds.

Here, assuming that the production tact time for each of the A-board and B-board in the case of the synchronous mode is 32 seconds/board, the throughput Ps in the case of the synchronous mode can be obtained using the following formula (formula 1).

$$Ps=((3600-216)/32)+((3600-216)/32) \quad \text{(Formula 1)}$$

When calculated, this becomes approximately 212 boards/ hour.

Furthermore, assuming that the production tact time for each of the A-board and B-board in the case of the asynchronous mode is 40 seconds/board and 36 seconds/board respectively, the throughput Pa in the case of the asynchronous mode can be obtained using the following formula (formula 2).

$$Pa=((3600-72)/40)+((3600-144)/36) \quad \text{(Formula 2)}$$

When calculated, this becomes approximately 184 boards/ hour.

Since the Ps and Pa are in a Ps>Pa relationship, the selection unit 124 selects, as the production mode for the mounter 100, the synchronous mode for which throughput is greater than the other mode.

It should be noted that the operational rate used in the present calculation does not take into account stoppage times attributed to components or boards, such as stoppage time caused by component run-out, and so on.

Therefore, the above-described method of selecting the production mode using the operational rate is advantageous in the case where stoppage time attributed to problems with the mounter itself dominates the stoppage time of the component mounting operation, such as when, for example, all the used components can be continuously supplied through tape splicing, and component pickup errors and mounting errors are extremely few.

Furthermore, in the same manner, the method of selecting the production mode using the component pickup rate or mounting rate is advantageous in the case where the occurrence of component pickup errors or mounting errors dominates the stoppage time of the component mounting operation, such as when the frequency of component run-out is low and the possibility for the mounter 100 itself to cause some sort of error is extremely low.

Furthermore, it is also possible to determine the production mode for the mounter 100 by combining the various information related to the continuity of the respective component mounting operations.

For example, the information indicating the production efficiency for each of the cases of the synchronous mode and the asynchronous mode may be calculated using a value which combines the stoppage time due to component run-out and the stoppage time due to pickup errors.

Specifically, when any one event (for example, component run-out) is dominant among the various events affecting the continuity of the component mounting operations, the information indicating the production efficiency for each of the cases of the synchronous mode and the asynchronous mode may be calculated using the stoppage time, and so on, attributed to such event.

Furthermore, when all of the plural events affect the continuity of the component mounting operations to a degree that cannot be disregarded, the information indicating the production efficiency for each of the cases of the synchronous mode and the asynchronous mode may be calculated using a value resulting from adding up the respective stoppage times caused by such plural events.

As described thus far, the mounting condition determining apparatus 120 in the first embodiment can determine the production mode based on information that is unique to various elements used in the production of component-mounted boards, such as component information, and so on. As such, the suitable production mode can be determined independently of the operator and through quantitative judgment.

Furthermore, since such determining can be performed before the start of component-mounted board production, there is no need for complicated control such as changing the board insertion timing for each carrier conveyor after the start of production.

It should be noted that in the first embodiment, the mounting condition determining apparatus 120 performs the selection of a production mode suitable for the mounter 100 which includes two carrier conveyors arranged in parallel with each other.

However, the mounting condition determining apparatus 120 may perform the selection of a production mode suitable for a mounter which includes three or more carrier conveyors arranged in parallel with each other.

Assume the case of performing the selection of a production mode for a mounter which includes three carrier conveyors, that is, a mounter which performs, in parallel, the production of component-mounted boards in three lanes.

In this case, before the start of the production of component-mounted boards, the calculation unit 123 calculates the predicted stoppage time for each of the lanes based on mounting information such as the included quantity for each type of component cassette, the usage quantity of each component type for the respective boards, and the correspondence among the respective boards and the lanes on which such boards are to be carried.

In addition, using these stoppage times, the calculation unit 123 calculates the information indicating the production efficiency for each of the synchronous mode and the asynchronous mode. With this, it is possible to judge which of the synchronous mode and the asynchronous mode has a higher production efficiency.

Furthermore, in the first embodiment, the mounting condition determining apparatus 120 performs the selection of the production mode in the case where one mounter 100 produces component-mounted boards.

However, in the case where, for example, one production line having two parallel lanes is configured by connecting plural mounters 100, the mounting condition determining apparatus 120 can also select the production mode which is suitable for such production line.

For example, the case of a production line in which two mounters 100 are connected is assumed. In addition, it is assumed that the stoppage time for the F-lane of the upstream mounter 100 is X and the stoppage time for the R-lane is Y. Furthermore, it is assumed that the stoppage time for the F-lane of the downstream mounter 100 is W and the stoppage time for the R-lane is Z.

In this case, in the synchronous mode, both the predicted stoppage times for the entire F-lane and the entire R-lane are, as a general rule, X+Y+W+Z.

Furthermore, in the asynchronous mode, the predicted stoppage time for the entire F-lane is, as a general rule, X+W, and the predicted stoppage time for the entire R-lane is, as a general rule, Y+Z.

From the above, it is possible to obtain the throughput for each of the entire F-lane and the entire R-lane in the respective cases of the synchronous mode and the asynchronous mode. In addition, it is possible to obtain the throughput for the entire production line in the respective cases of the synchronous mode and the asynchronous mode.

Therefore, by comparing these throughputs, it is possible to judge which of the synchronous mode and the asynchronous mode has higher production efficiency.

(Second Embodiment)

The structure of a mounter 200 in a second embodiment of the present invention shall be described using FIG. 18 to FIG. 22.

It should be noted that the mechanical structure for component mounting included in the mounter 200 is the same as that in the mounter 100 in the first embodiment described using FIG. 1 to FIG. 3, and thus description thereof shall be omitted.

Furthermore, the mounter 200 can also adopt either of the independent mode or the alternating mode, as the production mode in the production of component-mounted boards.

The independent mode is a production mode which causes each of the mounting head 104 and the mounting head 107 to mount components only onto boards carried by the carrier conveyor that is near the component supply unit which is its component supply source, between the first conveyor 101 and the second conveyor 102.

Specifically, in the case of the independent mode, the mounting head 104 only mounts components onto boards carried by the first conveyor 101 that is near the component supply unit 106 which is the supply source of components to the mounting head 104. Furthermore, the mounting head 107 only mounts components onto boards carried by the second conveyor 102 that is near the component supply unit 109 which is the supply source of components to the mounting head 107.

Furthermore, the alternating mode is a production mode which causes the mounting head 104 and the mounting head 107 to alternately mount components onto both of the boards carried by the first conveyor 101 and the second conveyor 102.

For example, assume two boards carried on the F-lane and the R-lane as an F-board and an R-board, respectively, as shown in FIG. 2. In this case, the combinations of the boards and mounting heads for the respective cases of the independent mode and the alternating mode are as follows.

In the case of the independent mode, only the mounting head 104 mounts components onto the F-board, and only the mounting head 107 mounts components onto the R-board.

Furthermore, in the case of the alternating mode, the mounting head 104 and the mounting head 107 alternately mount components onto both the F-board and the R-board.

Figure 18:
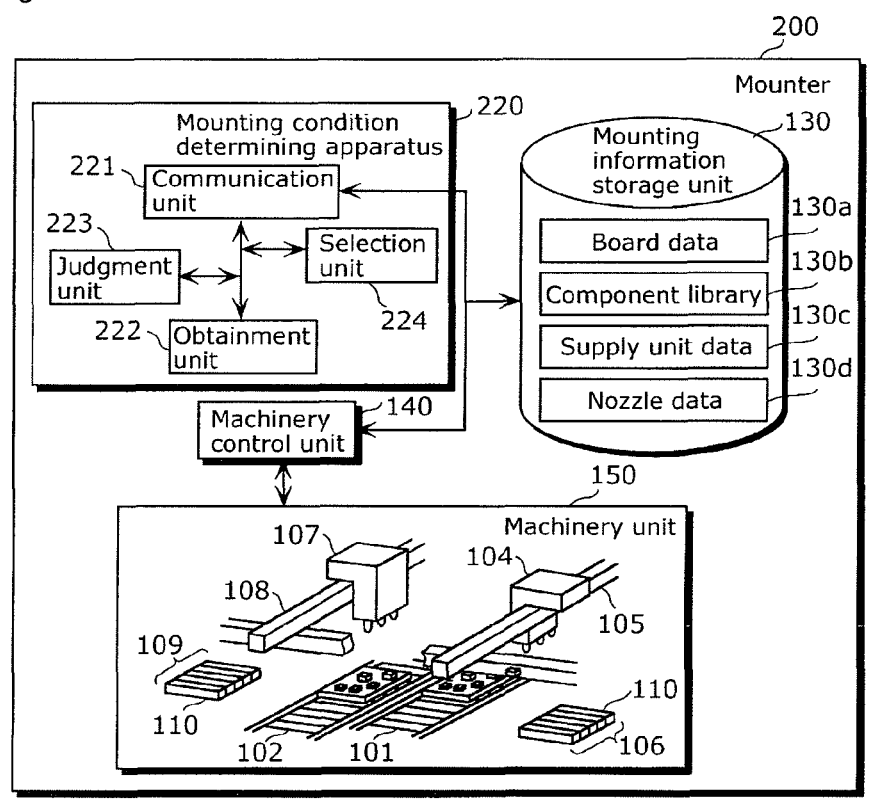
FIG. 18 is function block diagram showing the main functional structure of the mounter in a second embodiment.

FIG. 18 is function block diagram showing the main functional structure of the mounter 200 in the second embodiment.

As shown in FIG. 18, the mounter 200 includes a mounting condition determining apparatus 220, the mounting information storage unit 130, and the machinery control unit 140, in addition to the machinery unit 150 which includes the mounting head 104 and so on.

The mounting condition determining apparatus 220 is an apparatus which determines the mounting condition for the mounter 200. In the second embodiment, the mounting condition determining apparatus 120 determines the production mode which is a type of mounting condition.

Specifically, before the start of a series of component mounting operations, the mounting condition determining apparatus 220 selects the production mode suitable for such component mounting operations, from between the independent mode and the alternating mode.

As shown in FIG. 18, the mounting condition determining apparatus 220 includes a communication unit 221, an obtainment unit 222, a judgment unit 223, and a selection unit 224.

The communication unit 221 is a processing unit for performing the exchange of information between the mounting condition determining apparatus 220 and the other constituent units within the mounter 200 and other external devices.

The obtainment unit 222 is a processing unit which obtains various mounting information including information related to the boards and components to be used in the component mounting operations scheduled to be performed by the mounter 200.

In the second embodiment, the obtainment unit 222 obtains, as the above described various mounting information, board data 130a, and so on, stored in the mounting information storage unit 130.

The mounting information storage unit 130 is a storage device for storing the board data 130a, a component library 130b, supply unit data 130c, and nozzle data 130d.

The various mounting information stored in the mounting information storage unit 130 shall be described using FIG. 19 to FIG. 22.

The judgment unit 223 is another example of a processing unit which executes the judging in the mounting condition determining method of the present invention. Specifically, the judgment unit 223 is a processing unit which judges, using the mounting information obtained by the obtainment unit 222, which of the independent mode and the alternating mode is the suitable production mode for the scheduled component mounting operations.

The selection unit 224 is another example of a processing unit which executes the selecting in the mounting condition determining method of the present invention. Specifically, the selection unit 224 is a processing unit which selects, as the production mode for the mounter 200, the production mode that is judged by the judgment unit 223 as being suitable for the mounter 200.

The mounting condition determining apparatus 220 sends various instructions to the machinery control unit 140 so that the mounter 200 operates in the production mode determined according to such a selection.

Following such instructions, the machinery control unit 140 controls the operations of the mounting head 104, the mounting head 107, and so on, included in the machinery unit 150.

It should be noted that the processing by the communication unit 221, the obtainment unit 222, the judgment unit 223, and the selection unit 224 included in the mounting condition determining apparatus 220 in the second embodiment are implemented, for example, by a computer having a Central Processing Unit (CPU), a storage device, an interface which performs the input and output of information, and so on.

For example, the CPU obtains the mounting information via the interface. In addition, the CPU performs the judging of suitability for the component mounting operations in each of the production modes, the selection of the production mode based on the judgment result, and so on. Such processing by the computer is implemented, for example, through the computer executing the program of the present invention.

FIG. 19 is a diagram showing an example of the data structure of the board data 130a in the second embodiment.

The board data 130a is an example of the board information in the mounting condition determining method of the present invention and, as shown in FIG. 19, is data which includes information related to the various types of boards that are targeted for component mounting in the mounter 200.

Specifically, the board data 130a includes the values (unit: mm) of the length (L) and the width (W) of each of the plural types of boards. In addition, the board data 130a includes the type and the quantity of the components to be mounted per board, for each of the board types.

It should be noted that the length (L) of the board is the length of the board in the carrying direction, that is, the X-axis direction, and the width (W) of the board is the length of the board in the Y-axis direction.

Furthermore, although illustration is omitted in FIG. 19, the board data 130a also includes, for each of the board types, information indicating the types of the components to be mounted and their mounting positions.

Furthermore, the above-mentioned "board types" is specified according to the mounting position of components and the types of the components to be mounted. In other words, even two boards that are physically separated are boards of the same type when the types and positions of components to be mounted are the same.

Furthermore, even when a board is physically a single board, when such board is a double-sided board onto which components are to be mounted on both sides thereof, and the types or mounting positions of the components to be mounted onto each of the surfaces are different, the board is handled as different types of boards depending on the surface onto which components are to be mounted by the mounter 200.

FIG. 20 is a diagram showing an example of the data structure in the component library 130b in the second embodiment.

As shown in FIG. 20, the component library 130b is a library in which information unique to each of the plural types of components that can be handled by the mounter 200 is collected.

For example, the component library 130b includes, for each component type (component name), the component dimensions, the tact time (tact time which is unique for a component type under a constant condition), other constraint information (usable nozzle types, the recognition method used by a component recognition camera, the maximum acceleration ratio of a component head), and external appearance data of each component.

FIG. 21 is a diagram showing an example of the data structure of the supply unit data 130c in the second embodiment.

As shown in FIG. 21, the supply unit data 130c is data which includes various information regarding the component cassettes 110 and the component supply unit 106 and the component supply unit 109, which is information regarding components.

Specifically, the supply unit data 130c includes component cassette data indicating the attributes of the component cassettes 110 in which components to be used in the scheduled component mounting operations are stored, and loading width data indicating a maximum total loading width for the component supply unit 106 and the component supply unit 109.

As shown in FIG. 21, the component cassette data includes the cassette ID, the component name, the loading pitch, and the stock quantity, for each of the component cassettes 110.

The cassette ID is an identifier for identifying the type of the component cassette 110. The component name is information for specifying the type of the component stored in such component cassette 110. The loading pitch is a value indicating the width required to load such component cassette 110 into the component supply unit 106 or the component supply unit 109.

The stock quantity is the stock quantity for such component cassette 110. In other words, it is the number of such component cassette 110 that can be used in the component mounting operations by the mounter 200. Furthermore, this stock quantity can be updated by communicating with an external device, for example.

For example, for the component cassette 110 having the component ID "C16", plural pieces of the component called LLCAP are stored, and a width of "42 mm" is required when loading such component cassette 110 into the component supply unit 106 or the component supply unit 109.

Furthermore, since the stock quantity is "1", such component cassette 110 can be loaded into only one of either the component supply unit 106 or the component supply unit 109.

The loading width data includes a value indicating the maximum total loading width when loading the component cassettes 110, for each of the component supply unit 106 and the component supply unit 109.

It should be noted that the loading width data "F" stands for the component supply unit 106 which is the front-side component supply unit, and "R" stands for the component supply unit 109 which is the rear-side component supply unit.

In the loading width data shown in FIG. 21, the maximum total loading width is "567 mm" for both the component supply unit 106 and the component supply unit 109.

Specifically, in the case of a component cassette 110 having a loading width of 21 mm, 567/21=27 units of such component cassette 110 can be loaded into both the component supply unit 106 and the component supply unit 109.

Furthermore, for example, it is also possible to load, into the component supply unit 106 and the component supply unit 109, 21 units of a component cassette 110 having a loading pitch of 21 mm, and 3 units of a component cassette 110 having a loading pitch of 42 mm.

FIG. 22 is a diagram showing an example of the data structure of the nozzle data 130d in the second embodiment.

As shown in FIG. 22, the nozzle data 130d is information related to components and is data including information regarding the nozzle for picking up a component. Specifically, the nozzle data 130d includes information indicating the type and quantity of nozzles attached to the mounting head 104 and the mounting head 107.

It should be noted that the mounting head [F] stands for the mounting head 104 which is the front-side mounting head, and the mounting head [R] stands for the mounting head 107 which is the rear-side mounting head.

For example, in the nozzle data 130d shown in FIG. 22, it is indicated that two S nozzles and two L nozzles are attached to the mounting head 107.

Furthermore, the contents of the nozzle data 130d is updated, for example, by the machinery control unit 140 when attachment, removal, or replacement of the nozzles of the mounting head 104 and the mounting head 107 is performed.

Using these various mounting information stored in the mounting information storage unit 130, the mounting condition determining apparatus 220 can judge which of the independent mode and the alternating mode is suitable for the component mounting operations scheduled to be performed by the mounter 200.

Next, the operation of or processing by the mounter 200 and the mounting condition determining apparatus 220 in a second embodiment of the present invention shall be described using FIG. 23 to FIG. 30.

Figure 23:
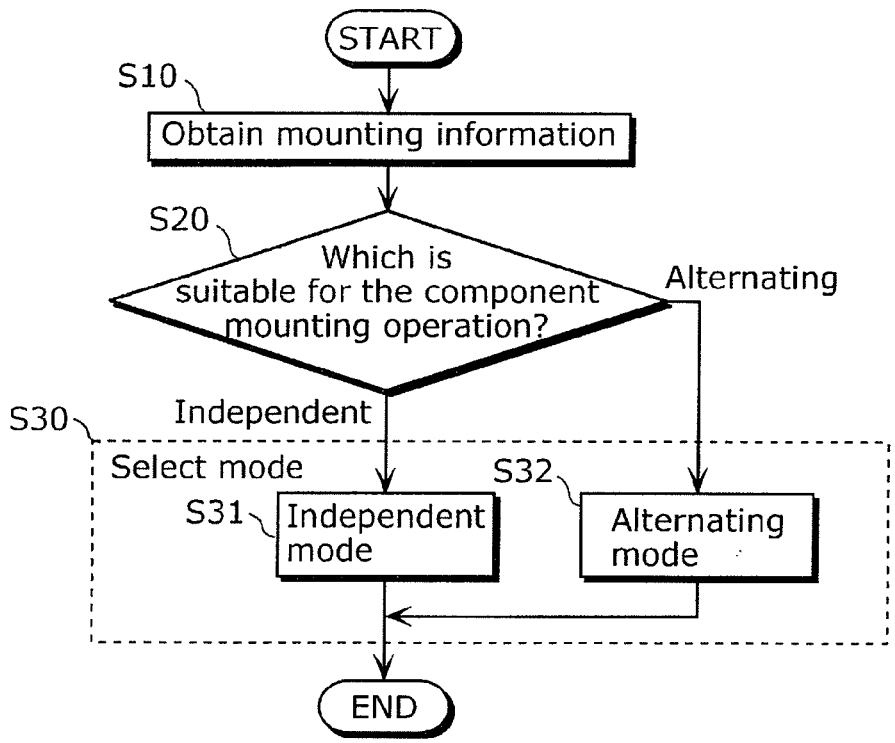
FIG. 23 is a flowchart showing the basic processing flow in the production mode selection by the mounting condition determining apparatus in the second embodiment.

First, the basic processing by the mounting condition determining apparatus 220 shall be described using FIG. 23.

FIG. 23 is a flowchart showing the basic processing flow in the production mode selection by the mounting condition determining apparatus 220 in the second embodiment.

First, the obtainment unit 222 of the mounting condition determining apparatus 220 obtains, from the mounting information storage unit 130, via the communication unit 221, mounting information including data related to the boards or components to be used in the scheduled component mounting operations (S10).

Specifically, the obtainment unit 222 obtains, from the mounting information storage unit 130, the board data 130a, the component library 130b, the supply unit data 130c, and the nozzle data 130d.

It should be noted that, with regard to the board data 130a the component library 130b, the supply unit data 130c, instead of obtaining all information, it is acceptable to obtain only the portion related to the components or the boards to be used in the scheduled component mounting operations.

The judgment unit 223 judges, using such mounting information, which of the independent mode and the alternating mode is suitable for the component mounting operations (S20). The details of the suitability judging shall be described later using FIG. 24 to FIG. 30.

The selection unit 224 selects the production mode for the mounter 200 in accordance with the result of judging by the judgment unit 223 (S30).

Specifically, when it is judged that the independent mode is suitable for the component mounting operations (independent mode in S20), the selection unit 224 selects the independent mode (S31). Furthermore, when it is judged that the alternating mode is suitable for the component mounting operations (alternating mode in S20), the selection unit 224 selects the alternating mode (S32).

It should be noted that the above-mentioned suitability judgment (S20) corresponds to the processing in the judging in the mounting condition determining method of the present invention, and the processing for selecting the production mode (S30) corresponds to the processing in the selecting in the mounting condition determining method of the present invention.

The mounting condition determining apparatus 220 sends various instructions to the machinery control unit 140 so that the mounter 200 operates in the production mode determined according to such a selection.

Following the instructions from the mounting condition determining apparatus 220, the machinery control unit 140 controls the operations of the machinery unit 150.

Figure 24:
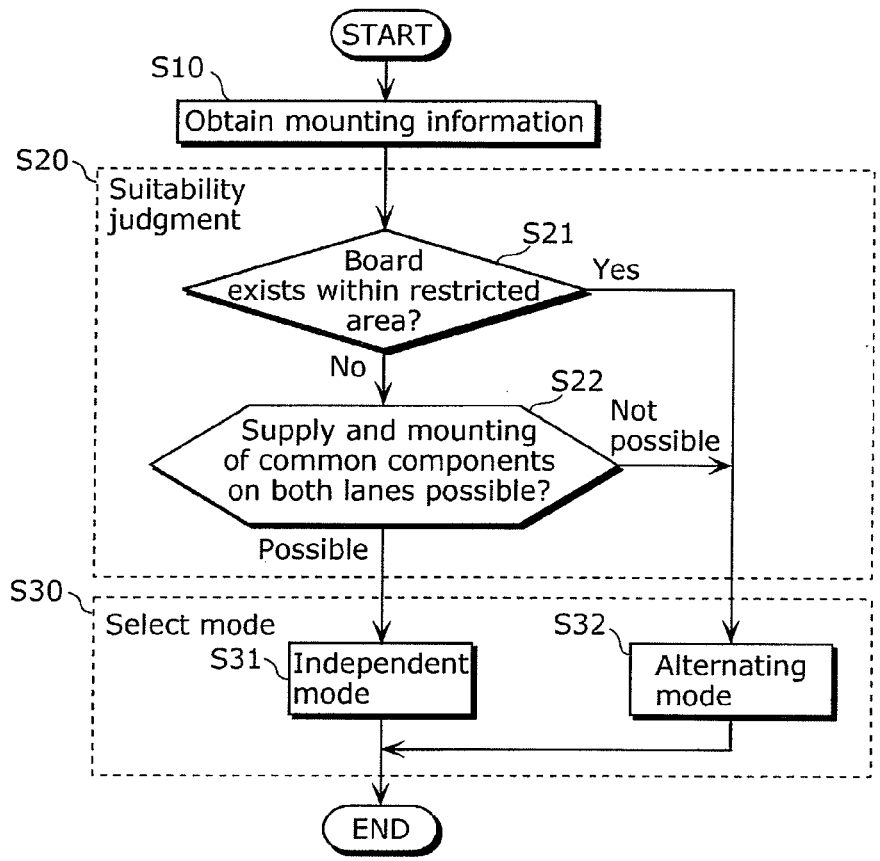
FIG. 24 is a flowchart showing the detailed processing flow in the production mode selection by the mounting condition determining apparatus in the second embodiment.

FIG. 24 is a flowchart showing the detailed processing flow in the production mode selection by the mounting condition determining apparatus 220 in the second embodiment.

The production mode suitability judging by the judgment unit 223 shall be described in detail using FIG. 24.

The judgment unit 223 first judges whether or not the board will be placed within the restricted area of the mounter 200 for component mounting in the independent mode, based on the dimensions of the board targeted for component mounting, included in the obtained board data 130a (S21).

Here, the restricted area refers to an area in which, when one of the mounting head 104 and the mounting head 107 is present, entry of the other is not permitted.

This is an area that is provided in order to prevent the mounting head 104 and the mounting head 107 from interfering with each other, and is also called an interference area.

The judgment unit 223 obtains the position information of the restricted area in the mounter 200, from the machinery control unit 140 for example. Furthermore, the judgment unit 223 can acquire the positional relationship of the board and the restricted area, based on the obtained position information and the dimensions of the width of the board indicated in the board data 130a.

It should be noted that since the movable range of each of the mounting head 104 and the mounting head 107 is different in the case of the independent mode and in the case of the alternating mode, the restricted area is also different for each of the modes.

Figure 25:
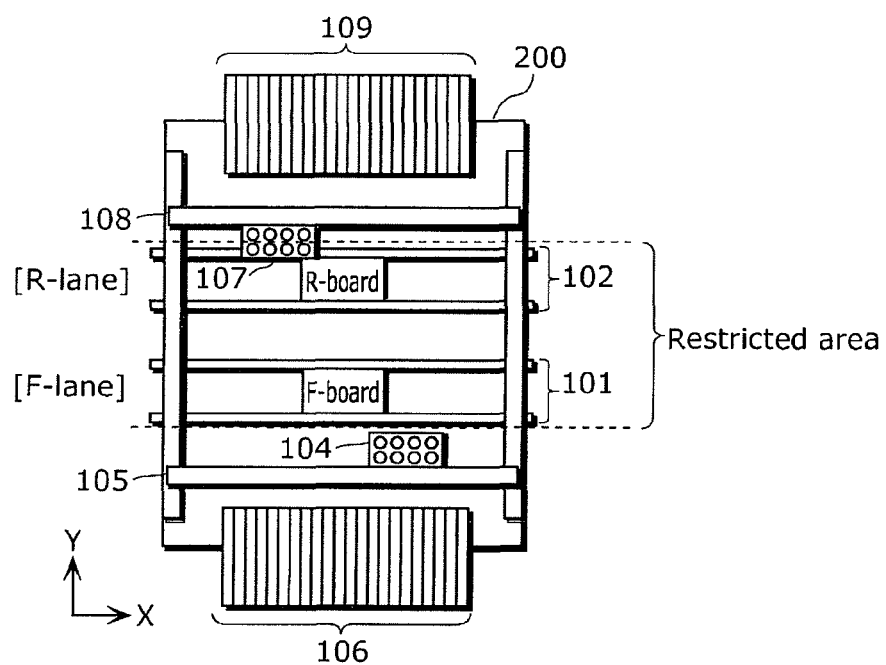
FIG. 25 is a diagram showing an example of the restricted area in the case of the alternating mode in the second embodiment.

FIG. 25 is a diagram showing an example of the restricted area in the case of the alternating mode in the second embodiment.

In the case of the alternating mode, each of the mounting head 104 and the mounting head 107 mounts components onto both the F-board and the R-board, and thus their movable ranges are broad.

As such, as shown in FIG. 25, for example, when the mounting head 107 enters the restricted area between the dotted lines, entry into the restricted area by the mounting head 104 is prohibited until the mounting head 107 moves out of the restricted area.

Furthermore, in the same manner, when the mounting head 104 enters the restricted area, the entry into the restricted area by the mounting head 107 is prohibited.

On the other hand, in the independent mode, it is sufficient for the mounting head 104 to mount components onto the F-board only, and for the mounting head 107 to mount components onto the R-board only. As such, the respective movable ranges of the mounting head 104 and the mounting head 107 become narrower than in the case of the alternating mode.

Therefore, the restricted area in the case of the independent mode is smaller than the restricted area in the case of the alternating mode.

Figure 26A:
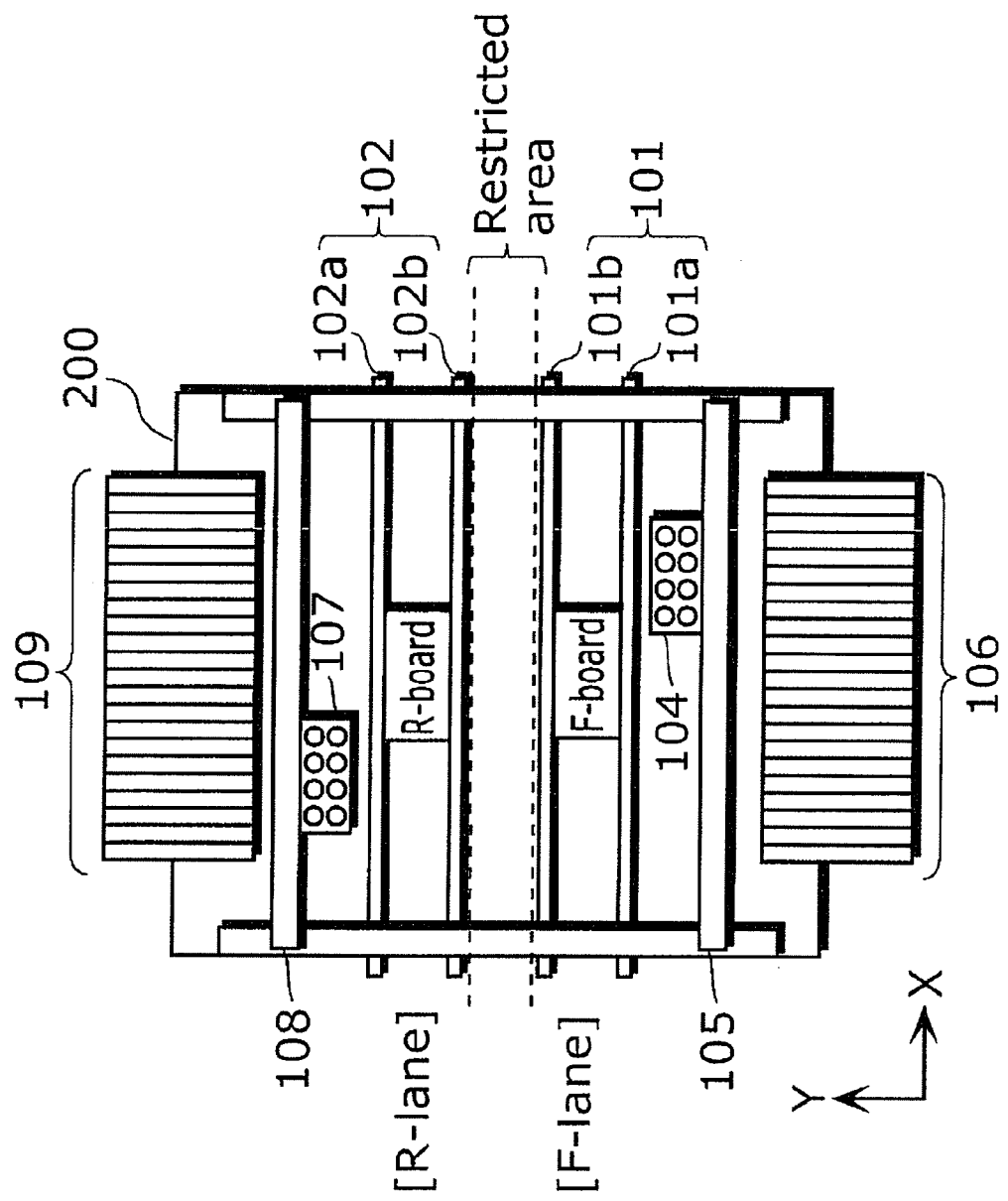
FIG. 26A shows the state in which both the F-board and the R-board are not placed within the restricted area in the case of the independent mode.
Figure 26B:
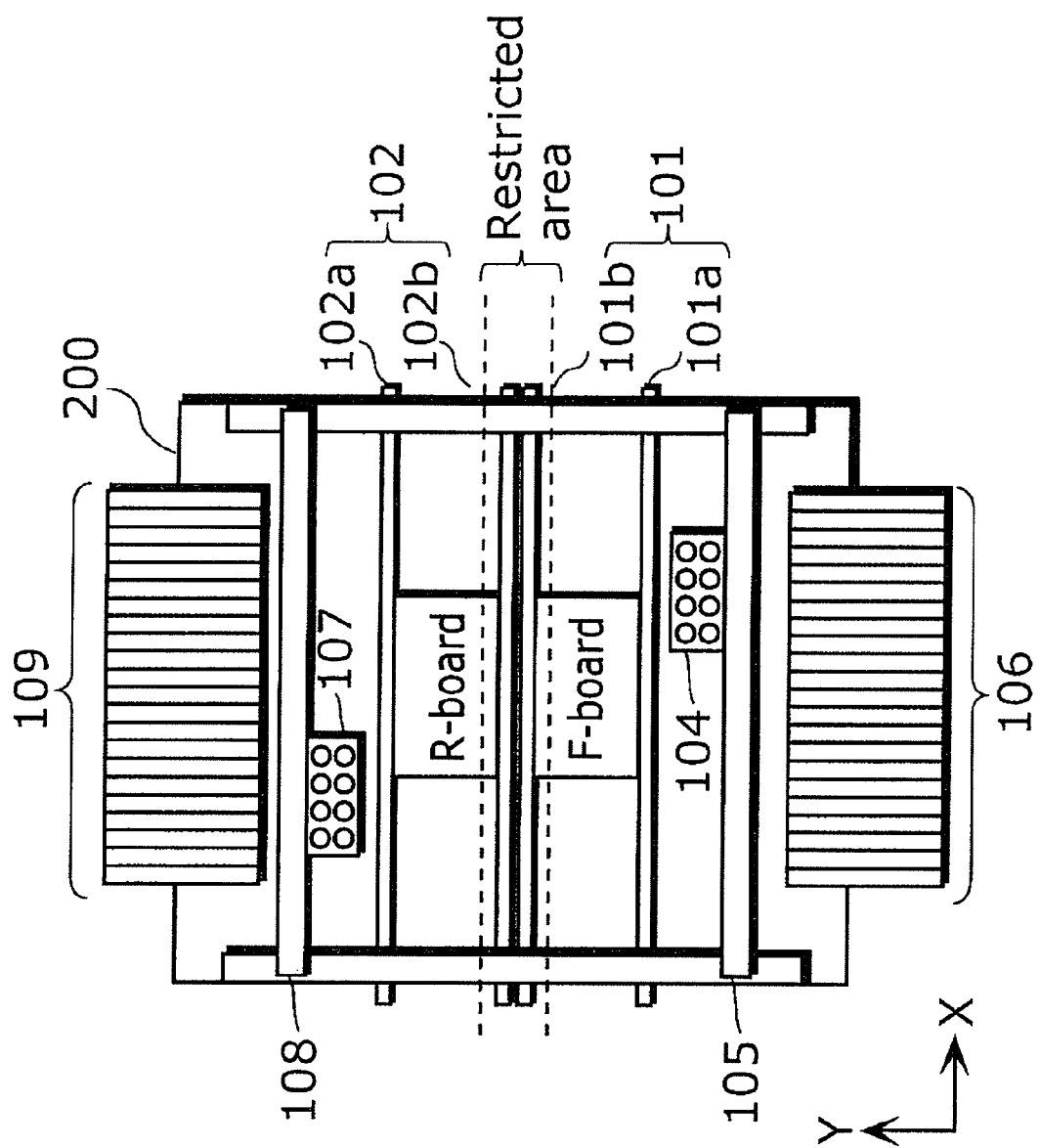
FIG. 26B shows the state in which a portion of each of the F-board and the R-board is placed within the restricted area in the case of the independent mode.

FIG. 26A and FIG. 26B are diagrams showing examples of the restricted area in the case of the independent mode. Furthermore, FIG. 26A shows the state in which both the F-board and the R-board are not placed within the restricted area since the F-board and the R-board are relatively small.

FIG. 26B shows the state in which a portion of each of the F-board and the R-board is placed within the restricted area since the F-board and the R-board are relatively large.

When the widths of the F-board and the R-board are about the width shown in FIG. 26A, the mounting head 104 which moves in order to mount components onto the F-board and the mounting head 107 which moves in order to mount components onto the R-board do not interfere with each other.

Specifically, the machinery control unit 140 needs only to perform control so as to cause each of the mounting head 104 and the mounting head 107 to mount components onto the board in its charge, and does not need to perform control which takes into account the mutual positions of the mounting head 104 and the mounting head 107.

As such, when the F-board and the R-board are not placed within the restricted area, the judgment unit 223 makes a primary judgment that the independent mode is suitable for the component mounting operations (No in S21).

However, assume that the F-board and the R-board are boards with relatively broad widths, and as such, at least a portion of each of the F-board and the R-board is placed within the restricted area, as shown in FIG. 26B. In this case, the possibility of the mounting head 104 and the mounting head 107 interfering with each other arises.

Consequently, when at least a portion of each of the boards is to be placed in the restricted area in the case of the independent mode, as shown in FIG. 26B, the judgment unit 223 judges that the alternating mode is suitable for the component mounting operations (Yes in S21).

The selection unit 224 selects the alternating mode as the production mode for the mounter 200, in accordance with the result of judging by the judgment unit 223 (S32).

Moreover, assume the case where, for example, due to the fact that there is sufficient distance in the Y-axis direction between the first conveyor 101 and the second conveyor 102 or the variable widths for the first conveyor 101 and the second conveyor 102 are small, the F-board and the R-board are not so close as to have the mounting heads interfere with each other. In this case, there is no restricted area for the case of the independent mode. However, it is assumed that, in the second embodiment, there is a restricted area for the case of the independent mode.

Furthermore, even when a portion of each of the F-board and the R-board is located within the restricted area, as long as their mounting positions do not exist within the restricted area, the mounting head 104 and the mounting head 107 do not mount components within the restricted area. Therefore, interference between the mounting head 104 and the mounting head 107 does not occur.

As such, it is acceptable to obtain information indicating the mounting information of each of the F-board and the R-board from the board data 130a, and judge the suitability of a production mode depending on whether or not respective mounting position-inclusive portions of the F-board and the R-board are to be placed within the restricted area.

Specifically, when it is judged that the respective mounting position-inclusive portions of the F-board and the R-board are to be placed within the restricted area, it may be judged that the alternating mode is suitable for the scheduled component mounting operations.

When a primary judgment that the independent mode is suitable for the component mounting operations is made (No in S21), the judgment unit 223 judges, based on the placement state or placement possibilities of the components and nozzles, whether or not the supply and the board-mounting of a type of component (hereafter referred to as a "common component") to be mounted onto both the F-board carried by the first conveyor 101 and the R-board carried by the second conveyor 102, are possible on both lanes (S22).

Specifically, the judgment unit 223 first judges, using the board data 130a and the supply unit data 130c obtained by the obtainment unit 222, whether or not the common components can be supplied to both the component supply unit 106 and the component supply unit 109.

In addition, the judgment unit 223 judges, using the component library 130b and the nozzle data 130d obtained by the obtainment unit 222, whether or not both the mounting head 104 and the mounting head 107 can mount the common components onto each of the boards.

Upon judging that the supply and the board-mounting of the common components is possible for both of the lanes, the judgment unit 223 judges that the independent mode is suitable for the component mounting operations (Possible in S22).

The selection unit 224 selects the independent mode as the production mode for the mounter 200, in accordance with the result of the judging by the judgment unit 223 (S31).

Furthermore, upon judging that at least one of the supply and the board-mounting of the common components is not possible for at least one of the lanes, the judgment unit 223 judges that the alternating mode is suitable for the component mounting operations (Not possible in S22).

The selection unit 224 selects the alternating mode as the production mode for the mounter 200, in accordance with the result of judging by the judgment unit 223 (S32).

Figure 27:
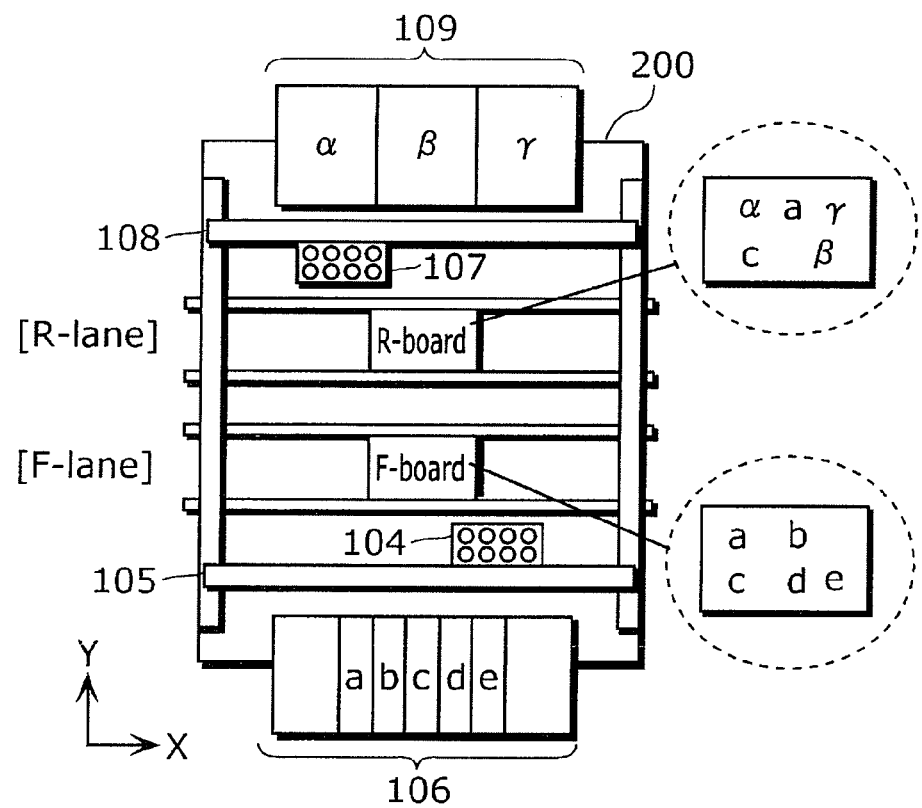
FIG. 27 is a diagram showing an example of the component arrangement in the mounter in the second embodiment.

FIG. 27 is a diagram showing an example of the component arrangement in the mounter 200. Furthermore, FIG. 28 is a diagram showing another example of the component arrangement in the mounter 200.

Figure 28:
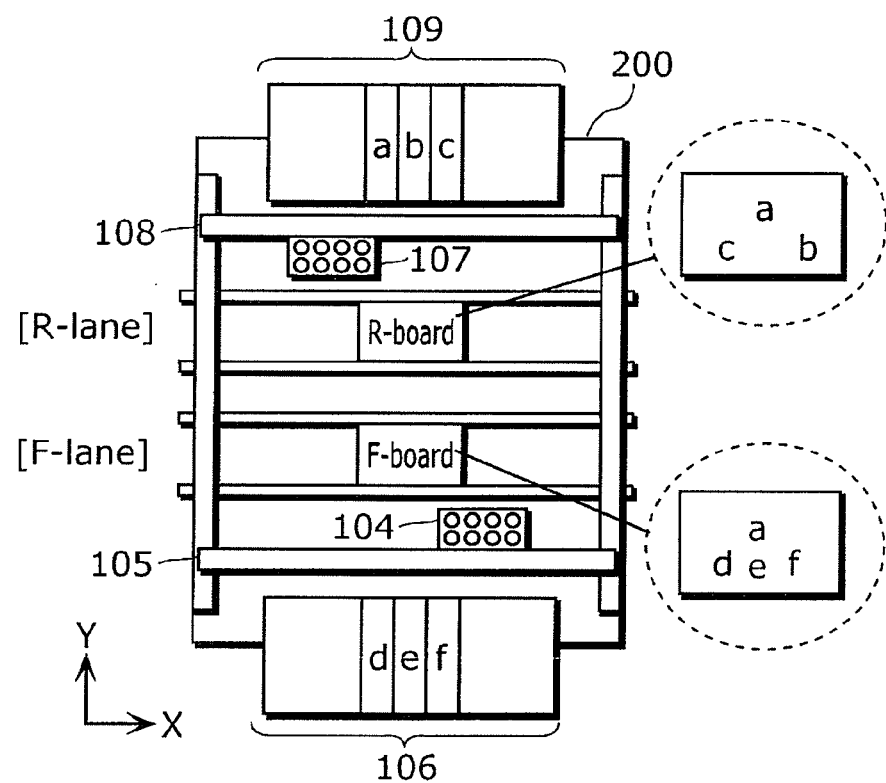
FIG. 28 is a diagram showing another example of the component arrangement in the mounter in the second embodiment.

A specific example of the judging for whether or not both the component supply unit 106 and the component supply unit 109 can supply the common components, performed by the judgment unit 223, shall be described using FIG. 27 and FIG. 28.

It should be noted that each of the symbols a to e and ALPHA, BETA, and GAMMA shown in FIG. 27 and FIG. 28 represents a component type. Furthermore, each of a to e represents a small component, and each of ALPHA, BETA, and GAMMA represents a large component.

(ALPHA: α)
(BETA: β)
(GAMMA: γ)

First, assume the case where the components to be mounted onto the F-board are a, b, c, d, and e, and the components to be mounted onto the R-board are a, c, ALPHA, BETA, and GAMMA, as shown in FIG. 27.

In this case, a and c are the common components that need to be mounted on both the F-board and the R-board.

The judgment unit 223 refers to the board data 130a regarding the F-board and the R-board, obtained by the obtainment unit 222. With this, the used components for each of the boards, such as the common components and components other than the common components, are identified.

When considering the mounting of components onto the F-board and the R-board such as that described above, it is necessary to arrange a, b, c, d, and e in the component supply unit 106, and arrange a, c, ALPHA, BETA, and GAMMA in the component supply unit 109.

Here, each of a, b, c, d, and e is a small component, and the loading pitch for the component cassettes 110 for storing such components is a relatively small value.

For example, assume that the maximum total loading width of the component supply unit 106 is "100", and the loading pitch of the respective component cassettes 110 for a, b, c, d, and e to be "15". In this case, the total of the loading pitches of the five component cassettes 110 is "75". Therefore, the judgment unit 223 judges that all the required component cassettes 110, including the component cassettes 110 in which the common component are stored (hereafter referred to as a "common component cassette 110"), can be loaded into the component supply unit 106.

On the other hand, each of ALPHA, BETA, and GAMMA which are components to be supplied by the component supply unit 109 and required only for the R-board, is a large component, and the loading pitch for the component cassettes 110 for storing such components is a relatively large value.

As such, there are cases where the two component cassettes 110 for storing the respective common components a and c cannot be loaded into the component supply unit 109.

For example, assume that the maximum total loading width of the component supply unit 109 is "100", and the loading pitch of the respective component cassettes 110 for ALPHA, BETA, GAMMA to be "30".

In this case, the judgment unit 223 subtracts, from the maximum total loading width "100", the total "90" of the loading pitches of the component cassettes 110 for ALPHA, BETA, GAMMA, which are the component cassettes 110 for components other than the common components. Accordingly, a remaining loading width of "10" is calculated.

In addition, the judgment unit 223 compares the remaining loading width "10" and the loading width "15" for each of the component cassettes 110 for a and c. Accordingly, the judgment unit 223 judges that the component cassettes 110 for a and c cannot be loaded into the component supply unit 109.

Therefore, the judgment unit 223 judges that only the component supply unit 106 can supply the common components.

In this manner, the judgment unit 223 performs the judging for whether or not the common component cassettes 110 can be loaded into both the component supply unit 106 and the component supply unit 109, by taking into account a dimension of the component cassettes 110 called the loading pitch.

Here, even if it is assumed that, dimensionally, the common component cassettes 110 could be loaded into both the component supply unit 106 and the component supply unit 109, there is the problem of whether or not a usable common component cassette 110 exists.

Consequently, the judgment unit 223 performs judging for whether or not the common component cassettes 110 can be loaded into both the component supply unit 106 and the component supply unit 109, by further taking into account the quantity of the usable common component cassettes 110.

It should be noted that either of the dimension-based judging for common component cassette 110 loadability or the usable quantity-based judging for common component cassette 110 loadability may be performed first.

For example, assume the case where the components to be mounted onto the F-board are a, d, e, and f, and the components to be mounted onto the R-board are a, b, and c, as shown in FIG. 28.

In this case, a is the common component that needs to be mounted on both the F-board and the R-board.

Under such an assumption, when considering the mounting of components onto the F-board and the R-board in the independent mode, it is necessary to arrange a, d, e, and f in the component supply unit 106, and arrange a, b, and c in the component supply unit 109.

However, when only one unit of the component cassette 110 for a can be provided, or specifically, when the stock quantity for the component cassette 110 for a indicated in the supply unit data 130c is 1, the component cassette 110 for a cannot be loaded into both the component supply unit 106 and the component supply unit 109.

Specifically, the judgment unit identifies the stock quantity of the common component cassette 110 from the supply unit data 130c obtained by the obtainment unit 222. In addition, when the stock quantity is "1", the judgment unit 223 judges that the component cassette 110 for a can be loaded into only one of the component supply unit 106 and the component supply unit 109.

Therefore, the judgment unit 223 judges that only one of the component supply unit 106 and the component supply unit 109 can supply the common component.

Here, in the hypothetical case of causing the mounter 200 to operate in the independent mode with the component arrangements shown in each of FIG. 27 and FIG. 28, all the required components can be mounted onto the board on the side where the component arrangement is complete, just by passing through the mounter 200 once.

Specifically, just by passing through the mounter 200 once, all the required components are mounted onto the F-board in the case of FIG. 27, and the R-board in the case of FIG. 28.

However, in either of the cases, not all the required components can be mounted onto the other board just by passing through the mounter 200 once. As such, it is necessary to re-insert such boards into the mounter 200 and cause the mounter 200 to mount the components that were not mounted.

Alternatively, it is necessary to connect another mounter downstream of the mounter 200, and cause such mounter to mount the components that were not mounted.

In other words, causing the mounter 200 to operate in the independent mode when the combination of the component arrangement and the boards is the combination shown in FIG. 27 or FIG. 28, is meaningless from a temporal or economic perspective.

As such, when only one of the component supply unit 106 and the component supply unit 109 can supply common components, the judgment unit 223 judges that the alternating mode is suitable for the component mounting operations for the F-board and the R-board (Not possible in S22 in FIG. 24).

Specifically, when loading into one of the component supply unit 106 and the component supply unit 109 is dimensionally not possible even in the case where two units of the common component cassette 110 can be provided, the judgment unit 223 judges that the alternating mode is suitable for the component mounting operations for the F-board and the R-board.

Furthermore, when only one common component cassette 110 can be provided even in the case where it is dimensionally possible to load a common component cassette 110 into both the component supply unit 106 and the component supply unit 109, the judgment unit 223 judges that the alternating mode is suitable for the component mounting operations for the F-board and the R-board.

It should be noted that when the judgment unit 223 judges, based on the board data 130a and the supply unit data 130c, that two common component cassettes 110 can be provided, and that these can be loaded into both the component supply unit 106 and the component supply unit 109, the judgment unit 223 subsequently performs judging with regard to the nozzles.

Specifically, the judgment unit 223 judges, based on the type of nozzle attached to the mounting head 104 and the mounting head 107, whether or not the mounting head 104 can pick up and mount the common component onto the F-board, and the mounting head 107 can pick up and mount the common component onto the R-board.

Figure 29:
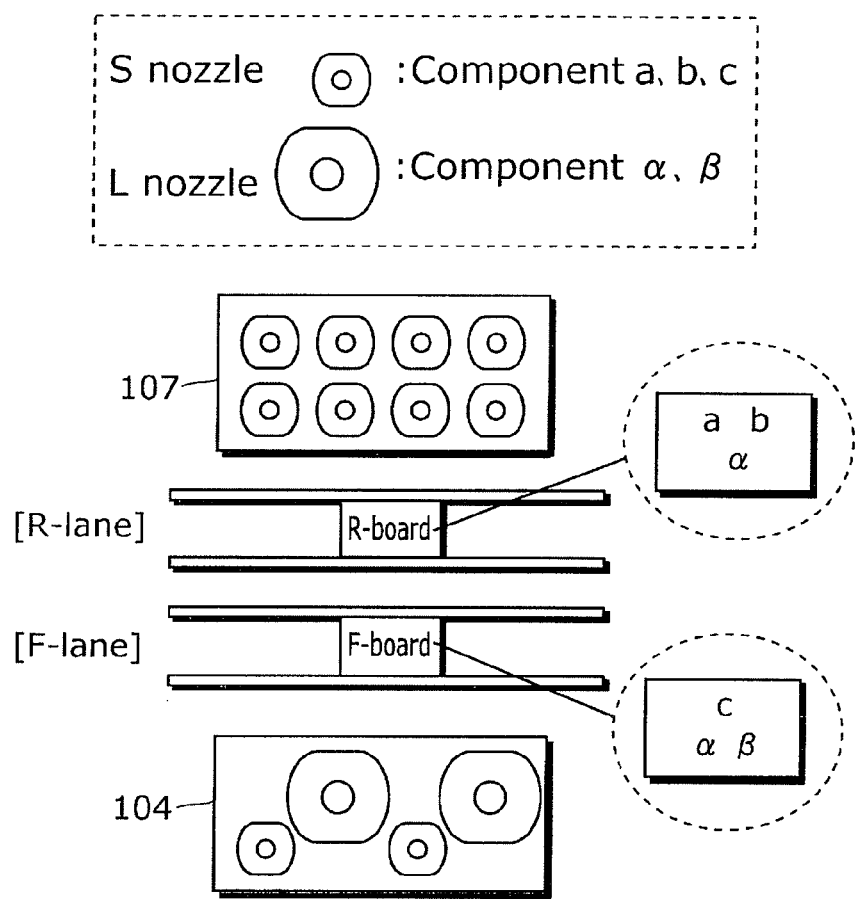
FIG. 29 is a diagram showing an example of the arrangement of the nozzles in each of the mounting heads in the second embodiment.

FIG. 29 is a diagram showing an example of the arrangement of the nozzles of the mounting head 104 and the mounting head 107.

Assume the case where the components to be mounted onto the F-board are c, ALPHA, and BETA, and the components to be mounted onto the R-board are a, b, and ALPHA, as shown in FIG. 29. In this case, ALPHA is the common component that needs to be mounted on both the F-board and the R-board.

Furthermore, assume the case where two L nozzles and two S nozzles are attached to the mounting head 104, and eight S nozzles are attached to the mounting head 107, as shown in FIG. 29.

Furthermore, an L nozzle is a nozzle for large components, and an S nozzle is a nozzle for small components.

By referring to the nozzle data 130d obtained by the obtainment unit 222, the judgment unit 223 identifies the type and quantity of the nozzles attached to each of the mounting head 104 and the mounting head 107.

Under the above-described assumption, the mounting head 104 is able to pick up and mount large components and small components onto the F-board. However, only S nozzles for small components are attached to the mounting head 107.

Therefore, although the mounting head 104 can mount a, which is the common component, onto the F-board, the mounting head 107 cannot mount the common component a onto the R-board.

In other words, when the mounter 200 operates in the independent mode in the case of such a combination of nozzle arrangements and boards, all the required components are mounted onto the F-board just by passing through the mounter 200 once. However, not all the required components are mounted onto the R-board just by passing through the mounter 200 once.

As such, the component mounting operation for the R-board needs to be performed again by the mounter 200 or another mounter. In other words, selecting the independent mode in such a case is meaningless from the temporal or economic perspective.

Therefore, when only one of the mounting head 104 and the mounting head 107 can mount the common components onto the board, the judgment unit 223 judges that the alternative mode is suitable for the component mounting operations (Not possible in S22 in FIG. 24).

Furthermore, when both the mounting head 104 and the mounting head 107 can mount the common components onto the boards, the judgment unit 223 judges that the independent mode is suitable for the component mounting operations (Possible in S22 in FIG. 24).

The selection mode selects one of the alternating mode and the independent mode as the production mode for the mounter 200, in accordance with the judgment result from the judgment unit 223.

The mounting condition determining apparatus 220 sends various instructions to the machinery control unit 140 so that the mounter 200 operates in the production mode determined according to such a selection.

The mounter 200 starts operating in the production mode determined by the mounting condition determining apparatus 220, by accepting an instruction to start production from the operator or an external device, or with the acceptance of the production mode instruction from the mounting condition determining apparatus 220 by the machinery control unit 140 as a trigger.

It should be noted that the judging for whether or not both the mounting head 104 and the mounting head 107 can mount the common component, described using FIG. 29, may be performed ahead of the judging for whether or not both the component supply unit 106 and the component supply unit 109 can supply the common components, described using FIG. 27 and FIG. 28.

Furthermore, the processing shown in FIG. 24 presupposes that the mounter 200 can adopt both the synchronous mode and the asynchronous mode.

However, when it is known in advance that the mounter 200 cannot operate in the synchronous mode, that is, when the adoption of the asynchronous mode is a premise, causing the mounter 200 to operate in the alternating mode is more advantageous from a production efficiency perspective, as described in the first embodiment.

As such, when the asynchronous mode is a premise, the judgment regarding the restricted area (S21) may be omitted. Furthermore, in this case, in place of judging for the suitability of the independent mode (S22), it is sufficient to judge the suitability of the alternating mode, such as whether the components to be mounted onto the R-board are arranged in the component supply unit 106 in the F-lane-side.

Furthermore, in the case where the adoption of the synchronized mode by the mounter 200 is a premise, when at least a portion of each of the F-board and the R-board is to be placed within the restricted area (Yes in S21) in the processing shown in FIG. 24, the alternating mode is selected (S32).

However, even when at least a portion of each of the F-board and the R-board is to be placed within the restricted area, it is possible to cause the mounting head 104 and the mounting head 107 to operate in a modified alternating mode (described later) which is one embodiment of the alternating mode in which the operation in the basic alternating mode is partially modified, through control which avoids interference between the mounting head 104 and the mounting head 107.

For example, when one of the mounting head 104 and the mounting head 107 enters the restricted mode, it is possible to perform control so that the other stops the mounting of components onto the board and waits at a predetermined position outside the restricted area, and so on.

Figure 30:
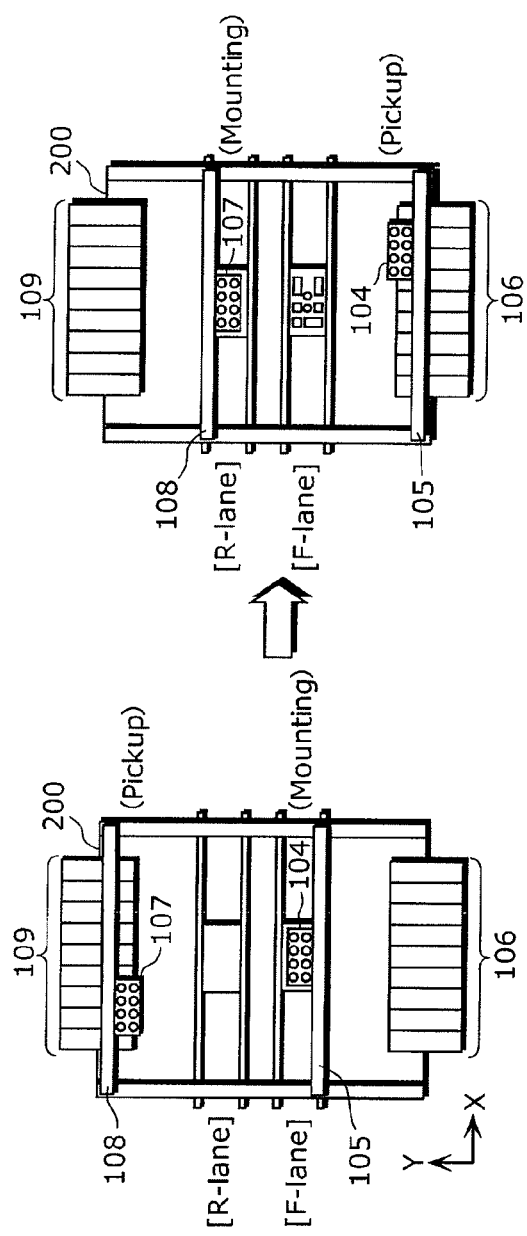
FIG. 30 is a diagram showing an example of the exclusive operational control for the two mounting heads in the second embodiment.

FIG. 30 is a diagram showing an example of the exclusive operational control for the mounting head 104 and the mounting head 107.

For example, as shown in FIG. 30, while the mounting head 104 is mounting components onto the F-board, the mounting head 107 performs a component pickup operation. Subsequently, while the mounting head 107 is mounting components onto the R-board, the mounting head 104 performs a component pickup operation.

Specifically, while maintaining the feature in the alternating mode of the mounting head 104 and the mounting head 107 performing the component mounting operation alternately, the mounting head 104 and the mounting head 107 operate in a mode (hereafter referred to as "modified alternating mode") which introduces the feature in the independent mode of the mounting head 104 mounting components onto the F-board only and the mounting head 107 mounting components onto the R-board only. This prevents interference between the mounting head 104 and the mounting head 107 at all times.

Therefore, when the synchronized mode is a premise, such as when the matching of the number of boards for production in the F-lane and the number of boards for production in the R-lane is a priority item in production planning, it is sufficient to judge that the modified alternating mode is suitable for the component mounting operations, regardless of the relationship between the restricted area and the respective boards.

It should be noted that the alternative mode which is not the modified alternative mode is the mode in which the two mounting heads alternately mount components onto the F-board and the two mounting heads also alternately mount components onto the R-board. Such operation by the two mounting heads is the basic operation of the alternating mode.

Furthermore, when at least a portion of each of the F-board and the R-board is to be placed within the restricted area (Yes in S21), it is also possible to optimize the mounting sequence while taking into account the mounting position of the components, so that the mounting head 104 and the mounting head 107 do not enter the restricted area at the same time.

Measures such as the mounting sequence optimization above enable the mounting of components onto both boards in the independent mode in the state shown in FIG. 26B.

However, when the adoption of either of the synchronous mode or the asynchronous mode is a premise, it is possible to have another problem which is the occurrence of delays or complication in processing due, for example, to the adoption of a modified independent mode. As such, in the second embodiment, judging for the production mode is performed by taking into account the possibility of both the mounting head 104 and the mounting head 107 entering the restricted area at the same time.

As described above, before the mounter 200 starts the component mounting operations, the mounting condition determining apparatus 220 can judge, using information such as the board data 130a and the component library 130b, which of the independent mode and the alternating mode is suitable for the scheduled component mounting operations.

Specifically, the mounting condition determining apparatus 220 obtains information such as the types and dimensions of the elements, such as the components and boards, to be used in the scheduled component mounting operations, and selects one of the independent mode and the alternating mode by processing such information.

Therefore, the mounting condition determining apparatus 220 can determine the production mode that is suitable for the scheduled component mounting operation, independently of the operator and by way of a quantitative judgment.

It should be noted that, in the second embodiment, the judgment unit 223 judges whether or not both the component supply unit 106 and the component supply unit 109 can supply common components, depending on whether or not common component cassettes 110 can be loaded into the component supply unit 106 and the component supply unit 109.

However, the judgment unit 223 may judge whether or not both the component supply unit 106 and the component supply unit 109 can supply common components, depending on whether or not common component cassettes 110 are loaded into the component supply unit 106 and the component supply unit 109.

In other words, at the point in time of such judgment, the judgment unit 223 may check the arrangement of the components and determine the production mode depending on such arrangement.

For example, when the judgment unit 223 judges which of the independent mode and the alternating mode is suitable for the component mounting operations to be started subsequently, the obtainment unit 222 obtains, for example from the mounter 200, information indicating the types and the quantity of the component cassettes 110 that are loaded in the component supply unit 106 and the component supply unit 109 at that point in time.

The judgment unit 223 judges, based on this information and the board data 130a, whether or not common component cassettes 110 are loaded in the component supply unit 106 and the component supply unit 109.

When, based on such information, the judgment unit 223 judges that the common component cassette 110 is loaded in only one of the component supply unit 106 and the component supply unit 109, the judgment unit 223 judges that the alternating mode is suitable for the component mounting operations.

Furthermore, when the judgment unit 223 judges that common component cassettes 110 are loaded in both the component supply unit 106 and the component supply unit 109, the judgment unit 223 subsequently performs the previously described judging with regard to the nozzles.

The mounting condition determining apparatus 220 can determine the suitable production mode even through such information processing.

Furthermore, when the judgment unit 223 judges that the common component cassette 110 is loaded in only one of the component supply unit 106 and the component supply unit 109, the judgment unit 223 may further judge whether or not common component cassettes 110 can be loaded into both the component supply unit 106 and the component supply unit 109, instead of judging that the alternating mode is suitable for the component mounting operations.

For example, assume that the judgment unit 223 judges that the common component cassette 110 is loaded only in the component supply unit 106.

In this case, this means that, at the point in time of such judgment, a common component cassette 110 is not loaded in the component supply unit 109. However, when there is an allowance in the component supply unit 109, dimensionally, to permit the loading of the common component cassette 110, and there is a stock quantity of more than 1 for the common component cassette 110, the common component cassette 110 can also be loaded into the component supply unit 109.

In this case, the judgment unit 223 refers to the supply unit data 130c and judges whether or not it is possible, in terms of dimensions and quantity, to load the common component cassette 110 into the component supply unit 109.

When the judgment unit 223 judges that common component cassettes 110 can be loaded into the component supply unit 109, the judgment unit 223 further performs the judging with regard to the nozzles.

When the judgment unit 223 judges that both the mounting head 104 and the mounting head 107 can mount the common components onto the boards, the selection unit 224 selects the independent mode as the production mode for the mounter 200.

In this case, the mounting condition determining apparatus 220 displays, on a display device included in the mounter 200 for example, that the independent mode is possible through the loading of the common component cassette 110 into the component supply unit 109.

Accordingly, by loading the common component cassette 110 into the component supply unit 109, the operator of the mounter 200 can operate the mounter 200 in the independent mode and carry out the production of component-mounted boards.

Furthermore, for example, when the judgment unit 223 judges that there is no allowance in the component supply unit 109, dimensionally, to load the common component cassette 110, the judgment unit 223 may check whether or not a component cassette 110 that is not necessary for the component mounting operations to be started at that point in time is loaded in the component supply unit 109.

In this case, when an unnecessary component cassette 110 is removed from the component supply unit 109, the judgment unit 223 judges whether or not the common component cassette 110 can be loaded, by comparing the loading pitch of the unnecessary component cassette 110 and the loading pitch of the common component cassette 110.

In addition, when the judgment unit 223 judges that the common component cassette 110 can be loaded by removing the unnecessary component cassette 110 from the component supply unit 109, the mounting condition determining apparatus 220 displays such fact, for example, on the display device included in the mounter 200.

Accordingly, by removing the unnecessary component cassette 110 from the component supply unit 109 and loading the common component cassette 110 into the component supply unit 109, the operator of the mounter 200 can operate the mounter 200 in the independent mode and carry out the production of component-mounted boards.

Furthermore, in the second embodiment, the judgment unit 223 judges whether both the mounting head 104 and the mounting head 107 can mount the common components onto the boards, depending on whether or not the type of nozzle which can pick up and mount the common components (hereafter referred to as "common nozzle") is attached to the mounting head 104 and the mounting head 107.

However, the judgment unit 223 may judge whether both the mounting head 104 and the mounting head 107 can mount the common components onto the boards, depending on whether or not the common nozzle can be attached to the mounting head 104 and the mounting head 107.

For example, when an L nozzle is not attached to the mounting head 107 as shown in FIG. 29, the judgment unit 223 checks, by communicating with the mounter 200, whether or not an L nozzle is held, for example, in a nozzle station included in the mounter 200, instead of judging that the alternative mode is suitable for the component mounting operations.

In addition, even when nozzle replacement is performed, the judgment unit 223 judges whether or not the mounting head 107 can mount the required components onto the R-board.

For example, assume that in order to attach one L nozzle in the mounting head 107, it is necessary to remove three S nozzles.

In the case of this example, since eight S nozzles are attached to the mounting head 107, the mounting head 107 can mount all of a, b, and ALPHA onto the R-board even when three S nozzles are replaced with one L nozzle.

Consequently, when an L nozzle is held in the nozzle station, the mounting condition determining apparatus 220 instructs the machinery control unit 140, and causes three S nozzles attached to predetermined positions in the mounting head 107 to be replaced with the L nozzle.

Alternatively, in the same manner as the component cassette data (see FIG. 21), the types of nozzles that can be attached to the mounting head 104 and the mounting head 107, and the stock quantity (useable quantity) of each type are included in the nozzle data 130d in advance.

In addition, when an L nozzle is not attached to the mounting head 107, the judgment unit 223 judges whether or not an L nozzle can be attached to the mounting head 107, by checking such nozzle data 130d.

For example, when the stock quantity of the L nozzle is 1, the mounting condition determining apparatus 220 displays, on a display device included in the mounter 200, that the independent mode is possible through the attachment of an L nozzle in the mounting head 107.

Accordingly, by attaching an L nozzle in the mounting head 107, the operator of the mounter 200 can operate the mounter 200 in the independent mode and carry out the production of component-mounted boards.

The mounting condition determining apparatus 220 can determine the suitable production mode even through such information processing.

Furthermore, in the second embodiment, the mounting condition determining apparatus 220 is included in the mounter 200 and performs production mode determination only for the mounter 200.

However, the mounting condition determining apparatus 220 may be implemented as an apparatus which is independent of the mounter 200. Furthermore, the mounting condition determining apparatus 220 may obtain various data regarding components, boards, and so on, to be used in the component mounting operations performed by each of plural mounters, and determine the production mode for the plural mounters.

In this case, since the various data used in common among the plural mounters can be used in common, the overall amount of data required in determining the production mode for the plural mounters is reduced.

Furthermore, as described above, there are cases where, depending on the structure of the mounter, there is no restricted area in the case of the independent mode. Therefore, in this case, the mounting condition determining apparatus 220 need not perform the judging for the relationship between the restricted area and the boards (S21 in FIG. 24).

Furthermore, when it is clear that all the required components are arranged in both the component supply unit 106 and the component supply unit 109 and it is clear that the required nozzles are attached to both the mounting head 104 and the mounting head 107, the mounting condition determining apparatus 220 need not perform the judging for whether or not the supply and the mounting of common components are possible.

(Third Embodiment)

In a third embodiment, a mounting condition determining apparatus 320 which includes the functions of both the mounting condition determining apparatus 120 in the first embodiment and the mounting condition determining apparatus 220 in the second embodiment shall be described.

Figure 31:
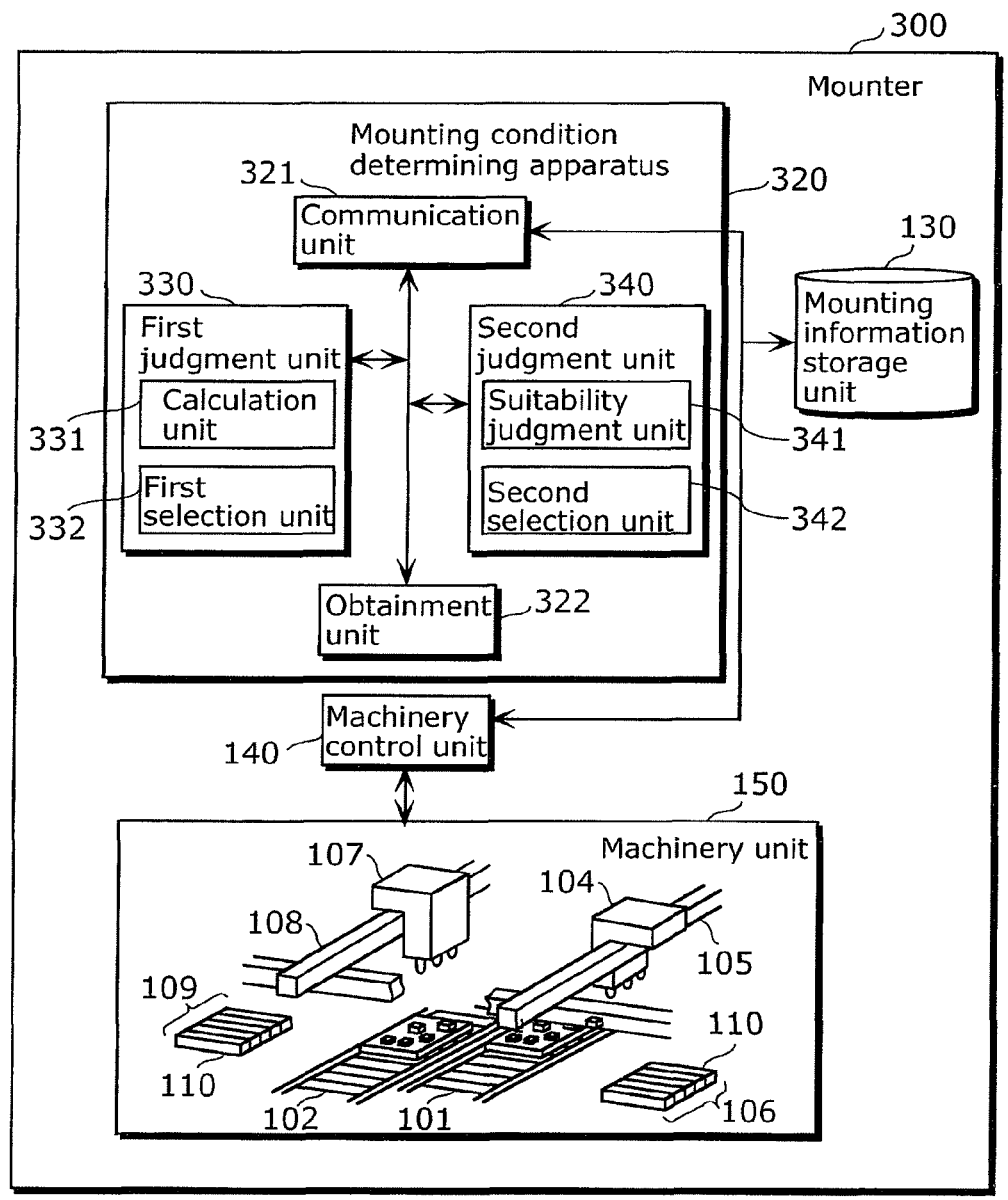
FIG. 31 is function block diagram showing the main functional structure of the mounter in a third embodiment.

First, the main functional structure of the mounter 300 in the third embodiment shall be described using FIG. 31.

It should be noted that the mechanical structure for component mounting included in the mounter 300 is the same as that in the mounter 100 in the first embodiment described using FIG. 1 to FIG. 3, and thus description thereof shall be omitted.

FIG. 31 is function block diagram showing the main functional structure of the mounter 300 in the third embodiment.

As shown in FIG. 31, the mounter 300 includes a mounting condition determining apparatus 320, the mounting information storage unit 130, and the machinery control unit 140, in addition to the machinery unit 150 which includes the mounting head 104 and so on.

The mounting condition determining apparatus 320 is an apparatus which determines the mounting condition for the mounter 300. Specifically, before the start of a series of component mounting operations, the mounting condition determining apparatus 320 judges (first judgment) which of the synchronous mode and the asynchronous mode is the production mode that is suitable for the component mounting operations, using the same processing as the mounting condition determining apparatus 120 in the first embodiment.

When selecting the synchronous mode, the mounting condition determining apparatus 320 further judges (second judgment) which of the independent mode and the alternating mode is the production mode that is suitable for the component mounting operations, using the same processing as the mounting condition determining apparatus 220 in the second embodiment.

It should be noted that, when the independent mode is selected as a result of the second judgment, the mounting condition determining apparatus 320 eventually selects the synchronous mode, in accordance with the result of the first judgment. As a result, the mounter 300 operates in the synchronous mode and the independent mode.

However, when the alternating mode is selected as a result of the second judgment, the mounting condition determining apparatus 320 overrides the result of the first judgment and eventually selects the asynchronous mode. As a result, the mounter 300 operates in the asynchronous mode and the alternating mode.

This is because, as a result of the second judgment, it is judged that operation in the independent mode is not possible. In this case, the alternating mode, for which operation is actually possible, is selected.

As shown in FIG. 31, the mounting condition determining apparatus 320 includes a communication unit 321, an obtainment unit 322, a first judgment unit 330, and a second judgment unit 340.

The communication unit 321 is a processing unit for performing the exchange of information between the mounting condition determining apparatus 320 and the other constituent units within the mounter 300 and other external devices.

The obtainment unit 322 is a processing unit which obtains various mounting information related to the component mounting operations scheduled to be performed by the mounter 300.

The first judgment unit 330 includes a calculation unit 331 and a first selection unit 332. The calculation unit 331 is a processing unit having the production efficiency calculating function provided in the calculation unit 123 in the first embodiment. The first selection unit 332 is a processing unit having the production efficiency comparing and production mode selecting functions provided in the selection unit 124 in the first embodiment.

The second judgment unit 340 includes a suitability judgment unit 341 and a second selection unit 342. The suitability judgment unit 341 is a processing unit having the production mode suitability judging function provided in the judgment unit 223 in the second embodiment. The second selection unit 342 is a processing unit having the production mode selecting function provided in the selection unit 224 in the second embodiment.

The mounting information storage unit 130 is a storage device for storing various mounting information. Specifically, the mounting information storage unit 130 stores the component information and the board information shown in FIG. 5, the board data 130a to the nozzle data 130d shown in FIG. 19 through FIG. 22, and so on.

The obtainment unit 322 reads the mounting information required by the first judgment unit 330 and the second judgment unit 340 from the mounting information storage unit 130, and outputs the read mounting information to the first judgment unit 330 and the second judgment unit 340.

Next, the processing flow in the production mode selection by the mounting condition determining apparatus 320 in the third embodiment shall be described.

Figure 32:
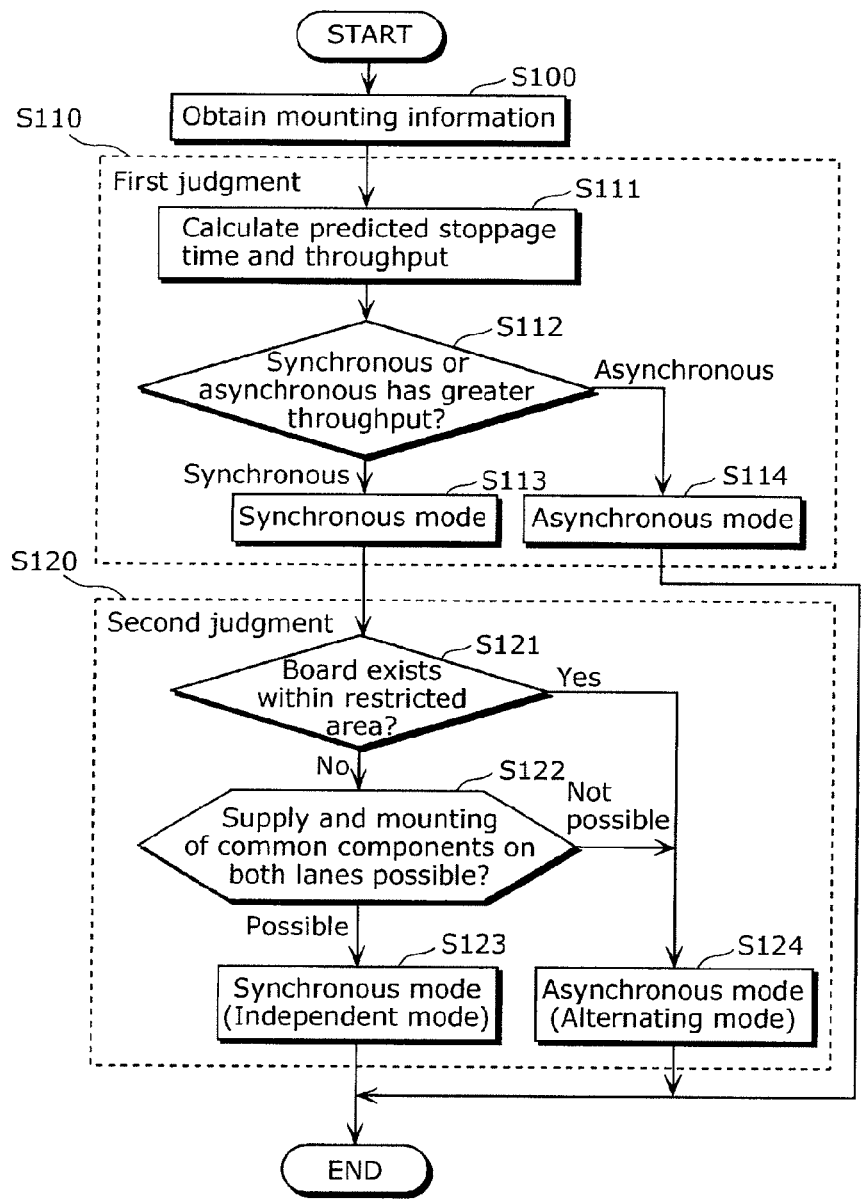
FIG. 32 is a flowchart showing the processing flow of the production mode selection by the mounting condition determining apparatus in the third embodiment.
Figure 33A:
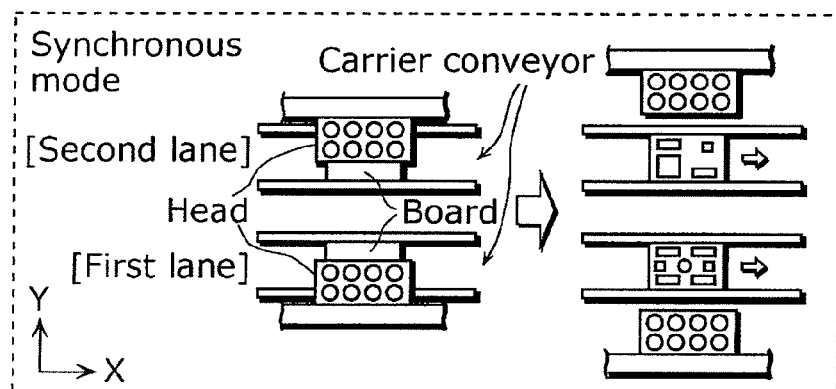
FIG. 33A is a diagram for describing the synchronous mode in a conventional mounter having two lanes.
Figure 33B:
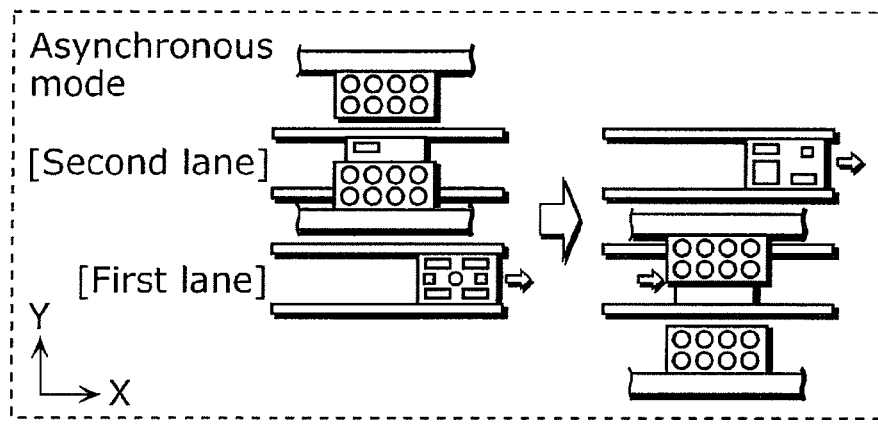
FIG. 33B is a diagram for describing the asynchronous mode in a conventional mounter having two lanes.
Figure 34:
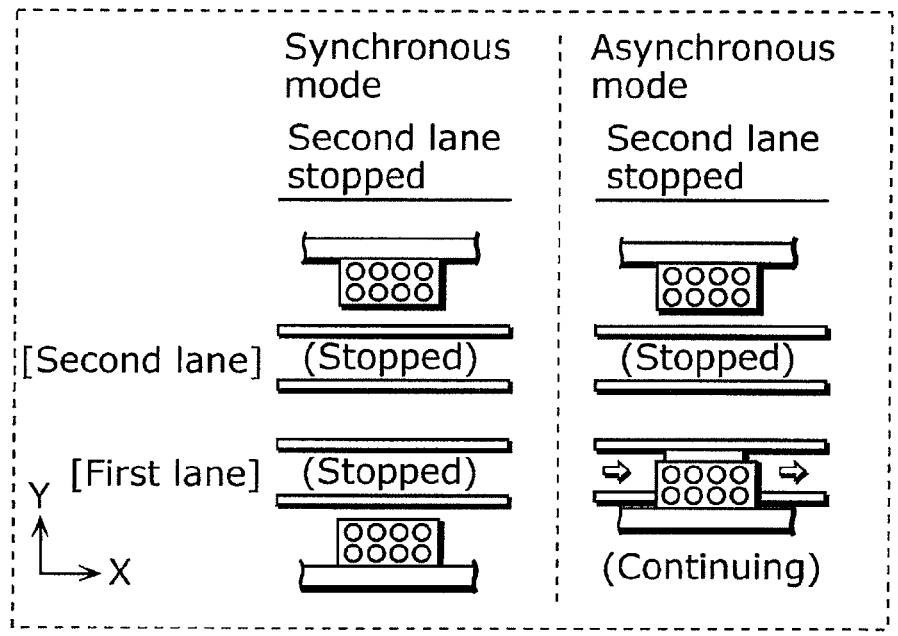
FIG. 34 is a diagram for describing the difference in the effect on production efficiency brought about by the stopping of the mounting operation in the synchronous mode and in the asynchronous mode.
Figure 35A:
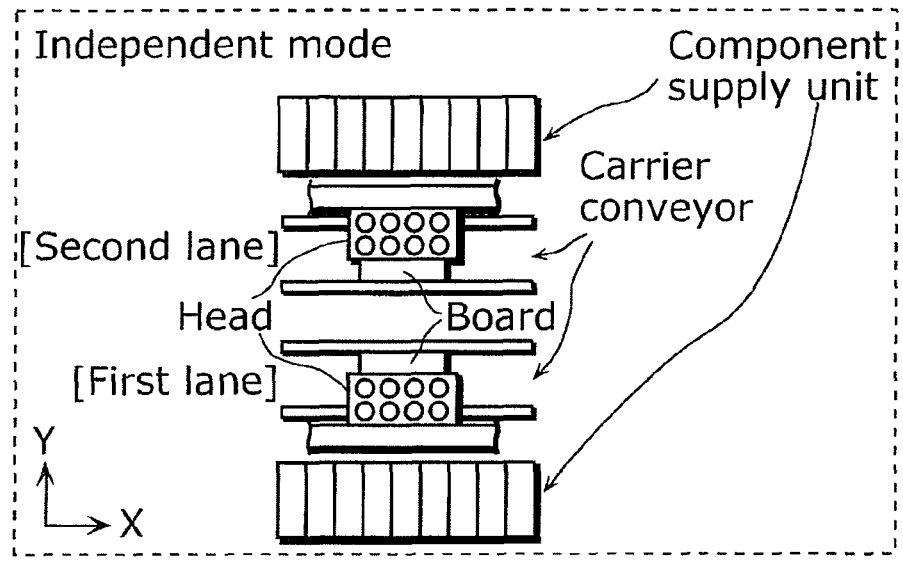
FIG. 35A is a diagram for describing the independent mode in a conventional mounter having two lanes.
Figure 35B:
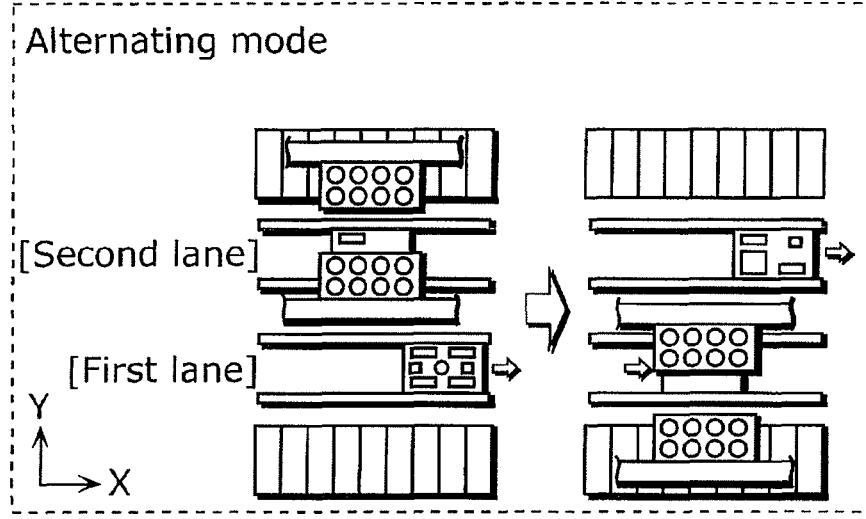
FIG. 35B is a diagram for describing the alternating mode in a conventional mounter having two lanes.

FIG. 32 is a flowchart showing the processing flow of the production mode selection by the mounting condition determining apparatus 320 in the third embodiment.

As shown in FIG. 32, after obtaining the mounting information (S100), the mounting condition determining apparatus 320 executes the first judgment (S110) and the second judgment (S120).

In the first judgment (S110), the first judgment unit 330 performs the same information processing as the mounting condition determining apparatus 120 in the first embodiment.

Specifically, the calculation unit 331 calculates information indicating production efficiency for when operating in each of the synchronous mode and the asynchronous mode (S111).

Based on the information indicating the production efficiency calculated by the calculation unit 331, the first selection unit 332 selects, from the synchronous mode and the asynchronous mode, the one having the higher production efficiency (S112).

Specifically, when the synchronous mode has a higher production efficiency (synchronous, in S112), the first selection unit 332 selects the synchronous mode (S113). Furthermore, when the asynchronous mode has a higher production efficiency (asynchronous, in S112), the first selection unit 332 selects the asynchronous mode (S114).

It should be noted that, when selecting the asynchronous mode, the first selection unit 332 selects the alternating mode in which the mounting head 104 and the mounting head 107 mount components onto each of the F-board and the R-board, in coordination with each other. In other words, the first selection unit 332 selects the asynchronous mode and the alternating mode as the production modes for the mounter 300.

When the synchronous mode is selected by the first selection unit 332, subsequently, the second judgment unit 340 performs the same suitability judgment for the independent mode and the alternating mode as with the mounting condition determining apparatus 220 in the second embodiment.

Specifically, even when the synchronous mode is selected for increasing production efficiency, it is not known whether or not it is possible to execute the independent mode which realizes the board carrying format for sufficiently achieving the high production efficiency of the synchronous mode.

As such, when the synchronous mode is selected, the mounting condition determining apparatus 320 further judges whether or not the independent mode can be executed.

Specifically, when the synchronous mode is selected by the first judgment unit 330, the suitability judgment unit 341 judges, based on the dimensions of the board targeted for component mounting included in the board data 130a, whether or not the board will be placed, for component mounting, within the restricted area of the mounter 300 in the case of the independent mode (S121).

It should be noted that the suitability judgment unit 341 may judge the suitability of a production mode by whether or not the mounting-position-inclusive portion of each of the F-board and the R-board is to be placed within the restricted area, as in the second embodiment.

Upon judging that the board is not to be placed for component mounting, within the restricted area of the mounter 300 in the case of the independent mode (No in S121), the suitability judgment unit 341 further judges whether or not the supply and the board-mounting of common components are possible for both of the lanes (S122).

In such possibility judging (S122), the supply unit data 130c, the component library 130b, and the nozzle data 130d are used, in the same manner as in the possibility judging (S22 in FIG. 24) in the second embodiment.

Upon judging that the supply and the board-mounting of the common components are possible for both of the lanes (Possible in S122), the suitability judgment unit 341 judges that the independent mode is suitable for the component mounting operations.

As such, the second selection unit 342 selects the synchronous mode and the independent mode as the production modes for the mounter 300 (S123).

Furthermore, upon judging that the supply and the board-mounting of the common components are not possible for both of the lanes (Not possible in S122), the suitability judgment unit 341 judges that the alternating mode is suitable for the component mounting operations.

Furthermore, upon judging that the board is to be placed for component mounting, within the restricted area of the mounter 300 in the case of the independent mode (Yes in S121), the suitability judgment unit 341 judges that the alternating mode is suitable for the component mounting operations.

When the alternating mode is selected based on these judgment results, this means that, as previously described, operating in the independent mode is not possible. As such, the second selection unit 342 selects the asynchronous mode and the alternating mode as the production modes for the mounter 300 (S124).

It should be noted that when it is judged that the board is to be placed within the restricted area (Yes in S121), it is acceptable to judge whether or not the supply and the board-mounting of the common components are not possible for both of the lanes (S122), without selecting the asynchronous mode.

Specifically, as described using FIG. 29, by causing the mounting head 104 and the mounting head 107 to operate in the modified alternating mode, it is possible to prevent interference between the mounting head 104 and the mounting head 107 regardless of the relationship between the restricted area and the respective boards.

As such, even when it is judged that the board is to be placed within the restricted area (Yes in S121), the second judgment unit 340 may, instead of immediately selecting the asynchronous mode, select the synchronous mode and the modified alternating mode when the supply and the board-mounting of the common components are possible for both of the lanes (Possible in S122).

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

Industrial Applicability

The present invention can be used as determining method for the optimum mounting condition for a mounter including plural carrier conveyors that are arranged in parallel, and for a production line in which such mounters are connected. Specifically, the present invention can determine, from between a synchronous mode and an asynchronous mode, the production mode suitable for scheduled component mounting operations, based on quantitative judging.

Furthermore, the present invention can also determine, from between an independent mode and an alternating mode, the production mode suitable for scheduled component mounting operations, based on quantitative judging.

As such, the present invention is particularly useful as a mounting condition determining method for improving production efficiency when the production of component-mounted boards is performed in parallel. Furthermore, the present invention is also useful as a mounting condition determining apparatus, and so on, which determines mounting condition such as those described above.

The invention claimed is:

1. A mounting condition determining method for determining a mounting condition for a mounter which includes two mounting heads, two component supply units, and plural carrier conveyors, and which performs, in parallel, component mounting operations on boards to be carried by each of the plural carrier conveyors, each of the two component supply units supplying components to a corresponding one of the two mounting heads, and the plural carrier conveyors being arranged in parallel between the two component supply units, said mounting condition determining method comprising:
    obtaining mounting information including information related to the component mounting operations scheduled to be performed by the mounter;
    judging, using the mounting information obtained in said obtaining:
    (a) which production mode between a synchronous mode and an asynchronous mode is suitable for the scheduled component mounting operations, the synchronous mode causing the plural carrier conveyors to carry out component-mounted boards synchronously with each other, the asynchronous mode causing the plural carrier conveyors to carry in boards and carry out component-mounted boards independently of each other; or
    (b) which production mode between an alternating mode and an independent mode is suitable for the scheduled component mounting operations, the alternating mode causing the two component heads to alternately mount components onto each of the boards to be carried by the plural carrier conveyors, the independent mode causing each of the two mounting heads to mount components only onto a board to be carried by a carrier conveyor closest to the component supply unit which is a component supply source of the mounting head, among the plural carrier conveyors; and
    selecting the production mode indicated by a result of the judgment in said judging, as the production mode to be executed by the mounter.

2. The mounting condition determining method according to claim 1,
    wherein the mounting information obtained in said obtaining includes information related to continuity of each of the component mounting operations that are scheduled to be performed in parallel, and
    said judging includes calculating, using the mounting information obtained in said obtaining, information indicating production efficiency when the mounter operates in each of the synchronous mode and the asynchronous mode, and
    in said judging, it is judged, based on the information indicating the production efficiency calculated in said calculating, that the production mode having higher production efficiency between the synchronous mode and the asynchronous mode is suitable for the scheduled component mounting operations.

3. The mounting condition determining method according to claim 2, wherein in said calculating:
    predicted stoppage times are calculated using the information related to continuity included in the mounting information, each of the predicted stoppage times being a predicted value of stoppage time for a corresponding one of the component mounting operations that are scheduled to be performed in parallel in each of the synchronous mode and the asynchronous mode; and
    the information indicating the production efficiency of each of the synchronous mode and the asynchronous mode is calculated using the calculated predicted stoppage times.

4. The mounting condition determining method according to claim 3,
    wherein one or more component storage units can be loaded into each of the two component supply units, each of the component storage units storing plural components of one type,
    the mounting information obtained in said obtaining includes usage quantities and stored-component quantities as the information related to continuity, each of the usage quantities being the number of components to be mounted on a board in each of the component mounting operations that are scheduled to be performed in parallel, for each type of component, and each of the stored-component quantities being the number of components stored in each of the plural component storage units, and
    in said calculating, the predicted stoppage times attributed to component run-outs are calculated using the usage quantities and the stored-component quantities.

5. The mounting condition determining method according to claim 3,
    wherein the mounting information obtained in said obtaining includes pickup rates or mounting rates of the respective components as the information related to continuity, the respective components being mounted onto the boards in each of the component mounting operations that are scheduled to be performed in parallel, and
    in said calculating, the predicted stoppage times attributed to pickup errors or mounting errors are calculated using the pickup rates and the mounting rates.

6. The mounting condition determining method according to claim 2,
    wherein the mounting information obtained in said obtaining further includes data related to the boards or the components to be used in the scheduled component mounting operations, and
    in said judging:
    when it is judged, from the information indicating production efficiency calculated in said calculating, that the synchronous mode is suitable for the scheduled component mounting operations, it is further judged, using the mounting information including data related to the boards or the components, whether or not the mounter can operate in the independent mode; and (c) it is judged that the synchronous mode is suitable for the scheduled component mounting operations, when it is judged that the mounter can operate in the independent mode; and (d) it is judged that the asynchronous mode is suitable for the scheduled component mounting operations, when it is judged that the mounter cannot operate in the independent mode.

7. The mounting condition determining method according to claim 1,
wherein in said selecting:
in the case where the synchronous mode is selected, the independent mode is selected as the production mode to be executed by the mounter together with the synchronous mode; and
in the case where the asynchronous mode is selected, the alternating mode is selected as the production mode to be executed by the mounter together with the asynchronous mode.

8. The mounting condition determining method according to claim 1,
wherein the mounting information obtained in said obtaining includes data related to the boards or the components to be used in the scheduled component mounting operations, and
in said judging, it is judged, using the mounting information obtained in said obtaining, which production mode between the alternating mode and the independent mode is suitable for the scheduled component mounting operations.

9. The mounting condition determining method according to claim 8,
wherein the plural carrier conveyors are made up of two carrier conveyors,
the mounting information obtained in said obtaining includes board information which is information related to the boards to be carried by each of the two carrier conveyors, and
in said judging:
it is judged, using the board information, whether or not at least a portion of each of the boards to be carried by the two carrier conveyors or a mounting position-inclusive portion of each of the boards is to be placed, for component mounting, within a restricted area in the case of the independent mode, the restricted area prohibiting entry of one of the two mounting heads when the other is inside; and
it is judged that the alternating mode is suitable for the scheduled component mounting operations, when at least a portion or the mounting position-inclusive portion of each of the boards is to be placed within the restricted area.

10. The mounting condition determining method according to claim 8,
wherein the plural carrier conveyors are made up of two carrier conveyors,
one or more component storage units can be loaded into each of the two component supply units, each of the component storage units storing plural components of one type,
the mounting information obtained in said obtaining includes board information indicating a type of a component to be mounted onto the board carried by each of the two carrier conveyors, and supply unit information indicating an attribute of the one or more component storage units corresponding to each of the two component supply units, and
in said judging:
it is judged, using the board information and the supply unit information, whether or not both of the two component supply units can supply common components which are components of a same type to be mounted onto both the board carried by one of the carrying conveyors and the board carried by the other of the carrying conveyors; and
it is judged that the alternating mode is suitable for the scheduled component mounting operations, when only one of the two component supply units can supply the common components.

11. The mounting condition determining method according to claim 8,
wherein the plural carrier conveyors are made up of two carrier conveyors, one or more nozzles can be attached to each of the two mounting heads, each of the one or more nozzles picking up and mounting a component onto a board, the mounting information obtained in said obtaining includes component information and nozzle information, the component information indicating a type of a component to be mounted onto the board carried by each of the two carrier conveyors and a type of nozzle capable of mounting the component onto the board, the nozzle information indicating a type of the one or more nozzles corresponding to each of the two mounting heads,
in said judging:
it is judged, using the component information and the nozzle information, whether or not both of the two component supply units can supply common components which are components of a same type to be mounted onto both the board carried by one of the carrying conveyors and the board carried by the other of the carrying conveyors; and
it is judged that the alternating mode is suitable for the scheduled component mounting operations, when only one of the two component supply units can supply the common components.

12. A component mounting method for performing, in parallel, component mounting on plural boards, said component mounting method comprising:
causing each of plural carrier conveyors to carry boards according to a production mode selected between a synchronous mode and an asynchronous mode, through the mounting condition determining method according to claim 2; and
mounting components onto the boards carried by each of the plural carrier conveyors, according to the selected production mode.

13. A mounting condition determining apparatus for determining a mounting condition for a mounter which includes plural carrier conveyors, and which performs, in parallel, component mounting operations on boards carried by each of the plural carrier conveyors, said mounting condition determining apparatus comprising:
an obtainment unit configured to obtain mounting information including information related to continuity of each of the component mounting operations that are scheduled to be performed in parallel;
a calculation unit configured to calculate, using the mounting information obtained by said obtainment unit, information indicating production efficiency when the mounter operates in each of a synchronous mode and the asynchronous mode, the synchronous mode causing the plural carrier conveyors to carry out component-mounted boards synchronously with each other, the asynchronous mode causing the plural carrier conveyors to carry in boards and carry out component-mounted boards independently of each other; and a selection unit configured to select a production mode having higher production efficiency between the synchronous mode and the asynchronous mode, based on the information indicating the production efficiency calculated by said calculation unit.

14. A mounter including plural carrier conveyors, and which performs, in parallel, component mounting operations on boards carried by each of the plural carrier conveyors, said mounter comprising:

the mounting condition determining apparatus according to claim 13;

a mounting head configured to pick up a component and to mount the picked up component onto each of the boards carried by said plural carrier conveyors; and a control unit configured to control said plural carrier conveyors and said mounting head so as to cause said mounter to operate in the production mode selected by said mounting condition determining apparatus between the synchronous mode and the asynchronous mode.

15. A computer program recorded on a non-transitory computer-readable recording medium, for determining a mounting condition for a mounter which includes plural carrier conveyors, and which performs, in parallel, component mounting operations on boards to be carried by each of the plural carrier conveyors, said program causing a computer to execute:

obtaining mounting information including information related to continuity of each of the component mounting operations that are scheduled to be performed in parallel;

calculating, using the mounting information obtained in said obtaining, information indicating production efficiency when the mounter operates in each of a synchronous mode and an asynchronous mode, the synchronous mode causing the plural carrier conveyors to carry out component-mounted boards synchronously with each other, the asynchronous mode causing the plural carrier conveyors to carry in boards and carry out component-mounted boards independently of each other; and selecting a production mode having higher production efficiency between the synchronous mode and the asynchronous mode, based on the information indicating the production efficiency calculated in said calculating.

* * * * *